United States Patent
Togo

(10) Patent No.: US 11,978,774 B2
(45) Date of Patent: *May 7, 2024

(54) HIGH VOLTAGE FIELD EFFECT TRANSISTOR WITH VERTICAL CURRENT PATHS AND METHOD OF MAKING THE SAME

(71) Applicant: SANDISK TECHNOLOGIES LLC, Addison, TX (US)

(72) Inventor: Mitsuhiro Togo, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 429 days.

This patent is subject to a terminal disclaimer.

(21) Appl. No.: 17/063,084

(22) Filed: Oct. 5, 2020

(65) Prior Publication Data

US 2022/0109054 A1    Apr. 7, 2022

(51) Int. Cl.
*H01L 29/66* (2006.01)
*H01L 29/06* (2006.01)
(Continued)

(52) U.S. Cl.
CPC .... *H01L 29/41775* (2013.01); *H01L 29/0653* (2013.01); *H01L 29/0847* (2013.01);
(Continued)

(58) Field of Classification Search
CPC ......... H01L 29/7834; H01L 21/823412; H01L 21/823418; H01L 27/088; H01L 29/6659; H01L 29/66636; H01L 29/7835; H01L 29/7836; H01L 29/04; H01L 29/7843; H01L 29/41766; H01L 29/66628;
(Continued)

(56) References Cited

U.S. PATENT DOCUMENTS 6,177,299 B1   1/2001   Hsu et al.
6,887,762 B1   5/2005   Murthy et al.
(Continued)

OTHER PUBLICATIONS

USPTO Office Communication, Non-Final Office Action for U.S. Appl. No. 17/063,182, dated Nov. 21, 2022, 31 pages.
(Continued)

*Primary Examiner* — Maliheh Malek
(74) *Attorney, Agent, or Firm* — THE MARBURY LAW GROUP PLLC

(57) ABSTRACT

A field effect transistor for a high voltage operation can include vertical current paths, which may include vertical surface regions of a pedestal semiconductor portion that protrudes above a base semiconductor portion. The pedestal semiconductor portion can be formed by etching a semiconductor material layer employing a gate structure as an etch mask. A dielectric gate spacer can be formed on sidewalls of the pedestal semiconductor portion. A source region and a drain region may be formed underneath top surfaces of the base semiconductor portion. Alternatively, epitaxial semiconductor material portions can be grown on the top surfaces of the base semiconductor portions, and a source region and a drain region can be formed therein. Alternatively, a source region and a drain region can be formed within via cavities in a planarization dielectric layer.

20 Claims, 70 Drawing Sheets

(51) Int. Cl.
*H01L 29/08* (2006.01)
*H01L 29/40* (2006.01)
*H01L 29/417* (2006.01)
*H01L 29/78* (2006.01)
*H01L 27/24* (2006.01)

(52) U.S. Cl.
CPC ........ *H01L 29/401* (2013.01); *H01L 29/6659* (2013.01); *H01L 29/7833* (2013.01); *H01L 29/7848* (2013.01); *H01L 29/0891* (2013.01); *H01L 29/66598* (2013.01)

(58) Field of Classification Search
CPC ........... H01L 29/66659; H01L 29/7833; H01L 29/1037; H01L 27/2454; H01L 29/7827; H01L 21/823487; H01L 21/823885; H10B 63/34
See application file for complete search history.

(56) References Cited

U.S. PATENT DOCUMENTS

| | | |
|---|---|---|
| 6,924,529 B2 | 8/2005 | Kim et al. |
| 7,135,372 B2 | 11/2006 | Huang et al. |
| 7,189,617 B2 | 3/2007 | Sleszaceck et al. |
| 7,190,036 B2 | 3/2007 | Ko et al. |
| 7,300,845 B2 | 11/2007 | Seo et al. |
| 7,338,873 B2 | 3/2008 | Murthy et al. |
| 7,361,537 B2 | 4/2008 | Park |
| 7,436,035 B2 | 10/2008 | Murthy et al. |
| 7,465,620 B2 | 12/2008 | Ko et al. |
| 7,494,895 B2 | 2/2009 | Yang et al. |
| 7,550,352 B2 | 6/2009 | Kim et al. |
| 7,550,785 B1 | 6/2009 | Mason et al. |
| 7,553,719 B2 | 6/2009 | Lee et al. |
| 7,586,150 B2 | 9/2009 | Jang et al. |
| 7,592,229 B2 | 9/2009 | Lin |
| 7,678,629 B1 | 3/2010 | Mason et al. |
| 7,682,916 B2 | 3/2010 | Murthy et al. |
| 7,781,830 B2 | 8/2010 | Wu et al. |
| 7,842,572 B2 | 11/2010 | Jang et al. |
| 7,867,860 B2 | 1/2011 | Huang et al. |
| 7,923,331 B2 | 4/2011 | Han et al. |
| 7,943,998 B2* | 5/2011 | Yun ........................ H01L 29/792 257/314 |
| 8,058,133 B2 | 11/2011 | Tsai et al. |
| 8,067,285 B2 | 11/2011 | Park et al. |
| 8,174,073 B2* | 5/2012 | Lee ................. H01L 21/823431 257/288 |
| 8,207,523 B2 | 6/2012 | Tsai et al. |
| 8,338,881 B2 | 12/2012 | Lee |
| 8,431,995 B2 | 4/2013 | Fuller et al. |
| 8,501,566 B1 | 8/2013 | Chou et al. |
| 8,569,845 B2 | 10/2013 | Huang et al. |
| 8,614,481 B2 | 12/2013 | Lee |
| 8,716,798 B2 | 5/2014 | Fuller et al. |
| 8,841,717 B2* | 9/2014 | Mikasa ................ H10B 12/485 257/E29.345 |
| 9,006,108 B2 | 4/2015 | Fuller et al. |
| 9,202,695 B2* | 12/2015 | Togo ................... H01L 29/4975 |
| 9,202,920 B1* | 12/2015 | Liu ................... H01L 29/66553 |
| 9,337,316 B2* | 5/2016 | Tsai .................... H01L 29/7851 |
| 9,419,103 B2* | 8/2016 | Togo .................... H01L 29/7847 |
| 9,508,602 B2* | 11/2016 | Togo .................... H01L 27/0924 |
| 9,530,700 B1 | 12/2016 | Mallela et al. |
| 9,601,491 B1 | 3/2017 | Mallela et al. |
| 9,640,634 B2 | 5/2017 | Murthy et al. |
| 9,679,990 B2* | 6/2017 | Banghart ............ H01L 29/1033 |
| 9,780,100 B1* | 10/2017 | Balakrishnan ......... H10B 43/27 |
| 9,780,197 B1 | 10/2017 | Xie et al. |
| 9,793,373 B2 | 10/2017 | Murthy et al. |
| 9,859,422 B2* | 1/2018 | Nishikawa .......... H01L 29/7834 |
| 9,865,731 B2* | 1/2018 | Chen .................. H01L 27/0928 |
| 10,014,390 B1 | 7/2018 | Bouche et al. |
| 10,109,535 B2 | 10/2018 | Mallela et al. |
| 10,115,735 B2 | 10/2018 | Amano et al. |
| 10,164,119 B2 | 12/2018 | Mallela et al. |
| 10,224,407 B2* | 3/2019 | Chowdhury ........ H01L 29/7834 |
| 10,256,099 B1 | 4/2019 | Akaiwa et al. |
| 10,355,017 B1 | 7/2019 | Nakatsuji et al. |
| 10,355,100 B1 | 7/2019 | Ueda et al. |
| 10,461,174 B1 | 10/2019 | Chi et al. |
| 10,461,184 B1* | 10/2019 | Cheng .................... H01L 21/324 |
| 10,522,658 B1* | 12/2019 | Cheng ............. H01L 21/823842 |
| 10,529,841 B2 | 1/2020 | Kajitani et al. |
| 10,553,786 B2 | 2/2020 | Zang et al. |
| 10,644,157 B2 | 5/2020 | Frougier et al. |
| 10,651,291 B2 | 5/2020 | Frougier et al. |
| 10,665,608 B2* | 5/2020 | Shioda ................ H01L 29/0847 |
| 10,707,346 B2 | 7/2020 | Hafez et al. |
| 10,840,148 B1* | 11/2020 | Cheng .............. H01L 29/66553 |
| 11,450,768 B2* | 9/2022 | Togo ................. H01L 21/823412 |
| 11,575,015 B2* | 2/2023 | Togo .................... H01L 27/088 |
| 11,626,496 B2* | 4/2023 | Akaiwa ............... H01L 27/0629 257/369 |
| 11,837,640 B2* | 12/2023 | Togo ................... H01L 29/7833 |
| 2005/0040490 A1* | 2/2005 | Park .................... H01L 29/1083 257/E29.267 |
| 2007/0148939 A1* | 6/2007 | Chu ...................... H01L 29/165 257/E29.085 |
| 2008/0116583 A1* | 5/2008 | Yuki ................ H01L 21/28525 438/300 |
| 2009/0029513 A1* | 1/2009 | Blanchard ........... H01L 29/4238 438/269 |
| 2011/0012208 A1* | 1/2011 | Holz ................... H01L 29/0653 257/E21.409 |
| 2011/0298008 A1* | 12/2011 | Greene ............... H01L 29/6653 257/190 |
| 2012/0049249 A1* | 3/2012 | Zhu ..................... H01L 29/7848 438/290 |
| 2014/0021538 A1* | 1/2014 | Bangsaruntip ........ H01L 29/785 438/156 |
| 2014/0264444 A1* | 9/2014 | Guo ........................ H01L 29/78 438/296 |
| 2014/0273380 A1 | 9/2014 | Liu et al. |
| 2015/0076609 A1* | 3/2015 | Xie ....................... H01L 23/528 257/365 |
| 2015/0200252 A1* | 7/2015 | Ching .................. H01L 29/0649 438/435 |
| 2015/0214364 A1* | 7/2015 | Chan .................... H01L 29/7849 257/190 |
| 2015/0318354 A1* | 11/2015 | Yin ..................... H01L 29/1054 257/288 |
| 2016/0079395 A1* | 3/2016 | Sim .................... H01L 29/7848 438/283 |
| 2016/0260712 A1 | 9/2016 | Yagishita |
| 2016/0351709 A1 | 12/2016 | Nishikawa et al. |
| 2017/0077096 A1* | 3/2017 | Wu ...................... H01L 27/0922 |
| 2017/0250521 A1* | 8/2017 | Nakamura ............ H01S 5/1064 |
| 2017/0301773 A1* | 10/2017 | Park ................... H01L 29/0847 |
| 2018/0012967 A1* | 1/2018 | Kang .................. H01L 29/7835 |
| 2018/0122704 A1* | 5/2018 | Zhou .................. H01L 27/0886 |
| 2018/0130786 A1* | 5/2018 | Deepak ............... H01L 29/42372 |
| 2018/0182861 A1 | 6/2018 | Ahn et al. |
| 2018/0240873 A1* | 8/2018 | Cheng ................. H01L 29/6656 |
| 2018/0247954 A1 | 8/2018 | Amano et al. |
| 2018/0248013 A1* | 8/2018 | Chowdhury ...... H01L 21/28158 |
| 2018/0331118 A1 | 11/2018 | Amano |
| 2019/0139830 A1* | 5/2019 | Xie ................. H01L 21/823431 |
| 2019/0245083 A1* | 8/2019 | Reznicek .......... H01L 21/30604 |
| 2019/0296012 A1* | 9/2019 | Iwata ................ H01L 21/76834 |
| 2019/0304972 A1* | 10/2019 | Kim .................... H01L 29/4966 |
| 2019/0348434 A1 | 11/2019 | Shioda et al. |
| 2020/0006553 A1* | 1/2020 | Li ...................... H01L 29/1033 |
| 2020/0043742 A1* | 2/2020 | Chang ............ H01L 21/823878 |
| 2020/0052094 A1* | 2/2020 | Mochizuki ............ H01L 27/088 |
| 2020/0058766 A1* | 2/2020 | Lee .................... H01L 29/66666 |
| 2020/0083246 A1* | 3/2020 | Inatsuka .......... H01L 29/66568 |
| 2020/0116932 A1* | 4/2020 | Hjartarson ............ G02F 1/0121 |
| 2020/0161451 A1* | 5/2020 | Lee .................... H01L 29/0653 |
| 2020/0203532 A1* | 6/2020 | Yamazaki ........... H01L 29/7869 |
| 2020/0211425 A1* | 7/2020 | Yamazaki ................. G09F 9/30 |
| 2020/0243685 A1* | 7/2020 | Yamazaki ......... H01L 21/02274 |

(56) References Cited

U.S. PATENT DOCUMENTS

| | | | |
|---|---|---|---|
| 2020/0328120 A1* | 10/2020 | Wu | H01L 29/1037 |
| 2020/0411096 A1 | 12/2020 | Liu | |
| 2021/0257456 A1* | 8/2021 | Asenov | H01L 29/41775 |
| 2021/0257462 A1* | 8/2021 | Lu | H01L 29/785 |
| 2021/0407900 A1* | 12/2021 | Yu | H01L 29/4175 |
| 2022/0029024 A1* | 1/2022 | More | H01L 29/78618 |
| 2022/0069134 A1* | 3/2022 | Kim | H01L 29/775 |
| 2022/0093794 A1* | 3/2022 | Reznicek | H01L 29/7841 |
| 2022/0109070 A1* | 4/2022 | Ono | H01L 29/6659 |
| 2022/0109071 A1* | 4/2022 | Togo | H01L 29/66659 |
| 2022/0190134 A1* | 6/2022 | Jeong | H01L 29/41775 |
| 2022/0238519 A1* | 7/2022 | Lin | H01L 21/823462 |
| 2022/0278209 A1* | 9/2022 | Mine | H01L 21/823418 |
| 2022/0310826 A1* | 9/2022 | Chiang | H01L 29/7851 |
| 2022/0359501 A1* | 11/2022 | Akaiwa | H01L 27/092 |
| 2022/0359690 A1* | 11/2022 | Iwata | H01L 27/0922 |
| 2022/0367449 A1* | 11/2022 | Yuu | H01L 27/0629 |
| 2022/0399448 A1* | 12/2022 | Togo | H01L 29/0649 |
| 2022/0416037 A1* | 12/2022 | Togo | H01L 23/5283 |
| 2023/0005910 A1* | 1/2023 | Park | H01L 21/823814 |
| 2023/0079098 A1* | 3/2023 | Togo | H01L 21/823431 |
| | | | 257/345 |
| 2023/0112262 A1* | 4/2023 | Fujita | H01L 29/6656 |
| | | | 257/369 |
| 2023/0209821 A1* | 6/2023 | Ishida | H10B 41/35 |
| | | | 257/314 |

OTHER PUBLICATIONS

U.S. Appl. No. 16/579,974, filed Sep. 24, 2019, SanDisk Technologies LLC.
U.S. Appl. No. 16/791,049, filed Feb. 14, 2020, SanDisk Technologies LLC.
U.S. Appl. No. 16/809,798, filed Mar. 5, 2020, SanDisk Technologies LLC.
U.S. Appl. No. 16/901,091, filed Jun. 15, 2020, SanDisk Technologies LLC.
U.S. Appl. No. 17/007,761, filed Aug. 31, 2020, SanDisk Technologies LLC.
U.S. Appl. No. 17/007,823, filed Aug. 31, 2020, SanDisk Technologies LLC.
USPTO Office Communication, Non-Final Office Action for U.S. Appl. No. 17/063,145, dated Feb. 17, 2022, 17 pages.
Togo, M., "High Voltage Field Effect Transistor with Vertical Current Paths and Method of Making the Same," U.S. Appl. No. 17/063,145, filed Oct. 5, 2020.
Ono, J. et al., "High Voltage Field Effect Transistor with Vertical Current Paths and Method of Making the Same," U.S. Appl. No. 17/063,182, filed Oct. 5, 2020.
Notification of Transmittal of the International Search Report and the Written Opinion of the International Searching Authority for International Patent Application No. PCT/US2021/037267, dated Oct. 20, 2021, 14 pages.
USPTO Office Communication, Final Office Action for U.S. Appl. No. 17/063,182, dated May 2, 2023, 13 pages.
USPTO Office Communication, Non-Final Office Action for U.S. Appl. No. 17/063,182, mailed Aug. 10, 2023, 19 pages.

* cited by examiner

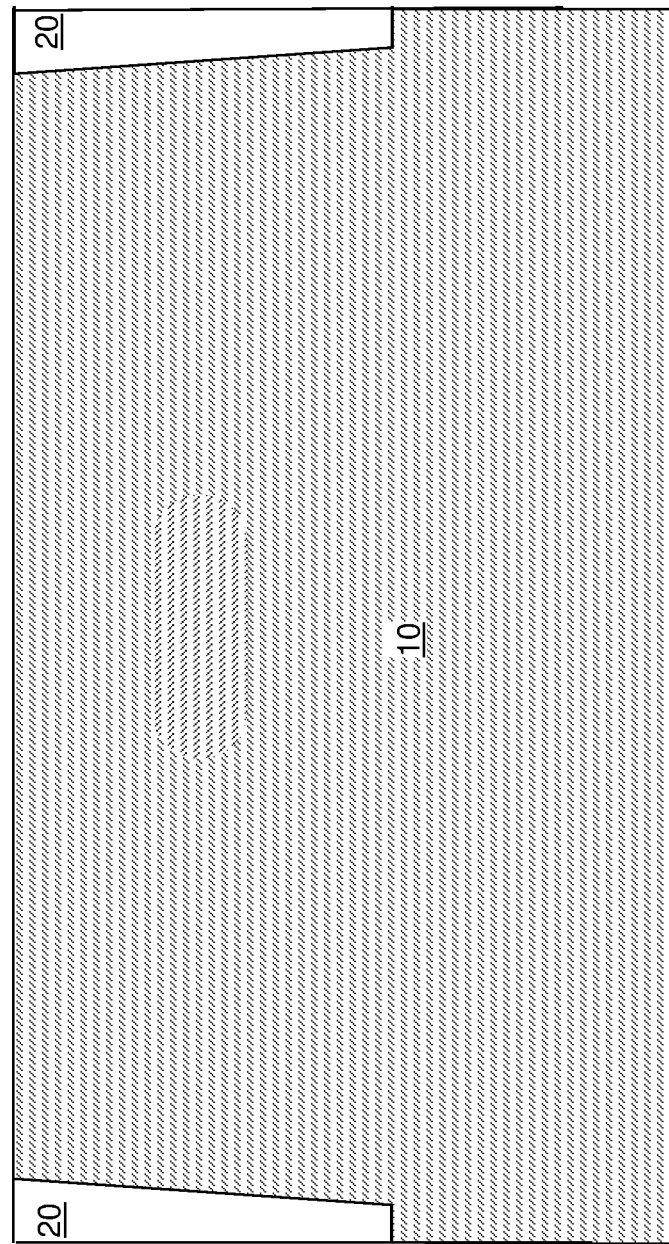

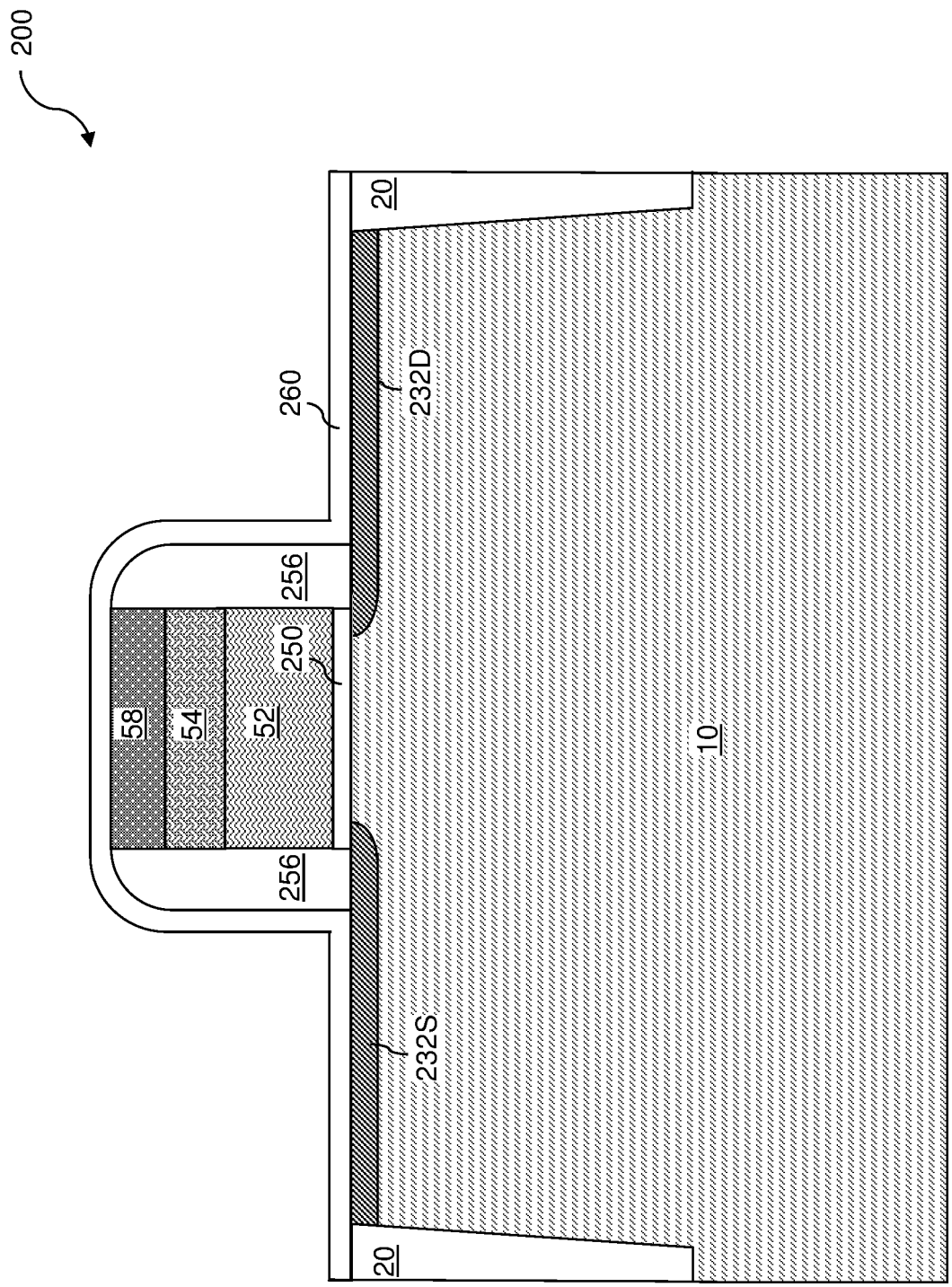

HIGH VOLTAGE FIELD EFFECT TRANSISTOR WITH VERTICAL CURRENT PATHS AND METHOD OF MAKING THE SAME

FIELD

The present disclosure relates generally to the field of semiconductor devices and specifically to a high voltage field effect transistor including vertical current paths and methods of making the same.

BACKGROUND

Prior art high voltage field effect transistors often suffer from surface breakdown voltage. Such transistors often have a complex extended low doped drain (LDD) to improve surface breakdown characteristics at the expense of process complexity and increased cost.

SUMMARY

According to an aspect of the present disclosure, a semiconductor structure is provided, which comprises: a shallow trench isolation structure comprising a dielectric material and embedded within a semiconductor material layer and laterally surrounding an upper portion of the semiconductor material layer, wherein the upper portion of the semiconductor material layer comprises a base semiconductor portion comprising a pair of top horizontal surfaces and a pedestal semiconductor portion located between the pair of top horizontal surfaces and vertically protruding above a horizontal plane including the pair of top horizontal surfaces; a gate stack structure comprising a gate dielectric and a gate electrode and including a pair of sidewalls that are vertically coincident with a pair of sidewalls of the pedestal semiconductor portion; a dielectric gate spacer contacting the pair of sidewalls of the gate stack structure and the pair of sidewalls of the pedestal semiconductor portion; and a source region and a drain region located within the base semiconductor portion and having a respective top surface located within the horizontal plane including the pair of top horizontal surfaces of the base semiconductor portion.

According to another aspect of the present disclosure, a method of forming a semiconductor structure is provided, which comprises: forming a shallow trench isolation structure comprising a dielectric material in an upper region of a semiconductor material layer having a doping of a first conductivity type, wherein the shallow trench isolation structure laterally surrounds a device region of the semiconductor material layer; forming a gate stack structure comprising a gate dielectric and a gate electrode over a center portion of the device region of the semiconductor material layer; vertically recessing areas of the device region of the semiconductor material layer that are not covered by the gate stack structure, wherein the device region of the semiconductor material layer includes a base semiconductor portion comprising a pair of top horizontal surfaces that are recessed below a bottom surface of the gate dielectric and a pedestal semiconductor portion located between the pair of top horizontal surfaces and the bottom surface of the gate dielectric; forming a dielectric gate spacer on the pair of sidewalls of the gate stack structure and on a pair of sidewalls of the pedestal semiconductor portion; and forming a source region and a drain region within upper portions of the base semiconductor portion by doping regions of the base semiconductor portion that underlies the pair of top horizontal surfaces with dopants of a second conductivity type that is an opposite of the first conductivity type.

According to yet another aspect of the present disclosure, a semiconductor structure is provided, which comprises: a shallow trench isolation structure comprising a dielectric material embedded within a semiconductor material layer and laterally surrounding an upper portion of the semiconductor material layer, wherein the upper portion of the semiconductor material layer comprises a base semiconductor portion comprising a pair of top horizontal surfaces and a pedestal semiconductor portion located between the pair of top horizontal surfaces and vertically protruding above a horizontal plane including the pair of top horizontal surfaces; a gate stack structure comprising a gate dielectric and a gate electrode and including a pair of sidewalls that are vertically coincident with a pair of sidewalls of the pedestal semiconductor portion; a dielectric gate spacer contacting the pair of sidewalls of the gate stack structure and the pair of sidewalls of the pedestal semiconductor portion; and a pair of epitaxial semiconductor material portions located on, and above, the pair of top horizontal surfaces of the base semiconductor portion and epitaxially aligned to the base semiconductor portion, wherein the pair of epitaxial semiconductor material portions comprises a source region and a drain region.

According to still another aspect of the present disclosure, a method of forming a semiconductor structure is provided, which comprises: forming a shallow trench isolation structure comprising a dielectric material in an upper region of a semiconductor material layer having a doping of a first conductivity type, wherein the shallow trench isolation structure laterally surrounds a device region of the semiconductor material layer; forming a gate stack structure comprising a gate dielectric and a gate electrode over a center portion of the device region of the semiconductor material layer; vertically recessing areas of the device region of the semiconductor material layer that are not covered by the gate stack structure, wherein the device region of the semiconductor material layer includes a base semiconductor portion comprising a pair of top horizontal surfaces that are recessed below a bottom surface of the gate dielectric and a pedestal semiconductor portion located between the pair of top horizontal surfaces and the bottom surface of the gate dielectric; forming a dielectric gate spacer on the pair of sidewalls of the gate stack structure and on a pair of sidewalls of the pedestal semiconductor portion; and forming a pair of epitaxial semiconductor material portions by growing a single crystalline semiconductor material from the pair of top horizontal surfaces of the base semiconductor portion, wherein a source region and a drain region having a doping of a second conductivity type that is an opposite of the first conductivity type are formed within upper regions of the pair of epitaxial semiconductor material portions.

According to even another aspect of the present disclosure, a semiconductor structure is provided, which comprises: a gate stack structure overlying a semiconductor material layer having a doping of a first conductivity type and comprising a gate dielectric and a gate electrode; a source extension region and a drain extension region embedded in an upper portion of the semiconductor material layer and located on opposite sides of the gate stack structure; a planarization dielectric layer overlying the gate stack structure, the source extension region, and the drain extension region; a first conductive pillar structure vertically extending through the planarization dielectric layer in contact with the source extension region, having a narrower width than the source extension region, and comprising a source extension pillar structure and a source region; and a second conductive pillar structure vertically extending through the planarization dielectric layer in contact with the drain extension region, having a narrower width than the drain extension region, and comprising a drain extension pillar structure and a drain region, wherein: the source extension region, the drain extension region, the source extension pillar structure, the drain extension pillar structure, the source region, and the drain region have a doping of a second conductivity type that is opposite of the first conductivity type; and the source region and the drain region include dopants of the second conductivity type at a higher atomic concentration than the source extension pillar structure and the drain extension pillar structure.

According to further another aspect of the present disclosure, a method of forming a semiconductor structure is provided, which comprises: forming a gate stack structure comprising a gate dielectric and a gate electrode over a semiconductor material layer having a doping of a first conductivity type; forming a source extension region and a drain extension region in the semiconductor material layer on opposite sides of the gate stack structure; forming a planarization dielectric layer overlying the gate stack structure, the source extension region, and the drain extension region; forming a pair of via cavities through the planarization dielectric layer, wherein a top surface of the source extension region and the drain extension region are physically exposed; and forming a first conductive pillar structure and a second conductive pillar structure within the pair of via cavities, wherein: the first conductive pillar structure comprises a source extension pillar structure and a source region; the second conductive pillar structure comprises a drain extension pillar structure and a drain region; the source extension region, the drain extension region, the source extension pillar structure, the drain extension pillar structure, the source region, and the drain region have a doping of a second conductivity type that is opposite of the first conductivity type; and the source region and the drain region include dopants of the second conductivity type at a higher atomic concentration than the source extension pillar structure and the drain extension pillar structure.

BRIEF DESCRIPTION OF THE DRAWINGS

FIG. 1A is a vertical cross-sectional view of a first device region of a first exemplary structure after formation of shallow trench isolation structures according to an embodiment of the present disclosure.

FIG. 18B is a vertical cross-sectional view of the second device region of the third exemplary structure after covering the second device region with a dielectric cover layer and formation of epitaxial semiconductor material portions according to an embodiment of the present disclosure.

DETAILED DESCRIPTION

Figure 1B:
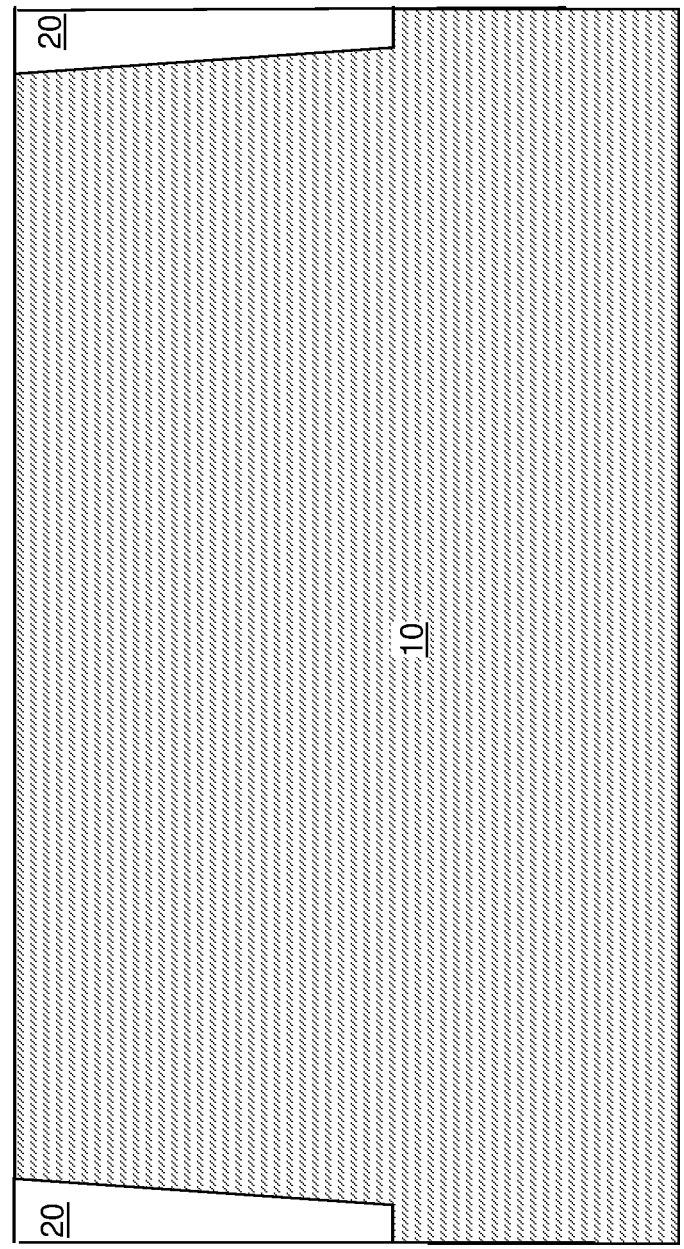
FIG. 1B is a vertical cross-sectional view of a second device region of the first exemplary structure after formation of the shallow trench isolation structures according to an embodiment of the present disclosure.
Figure 1C:
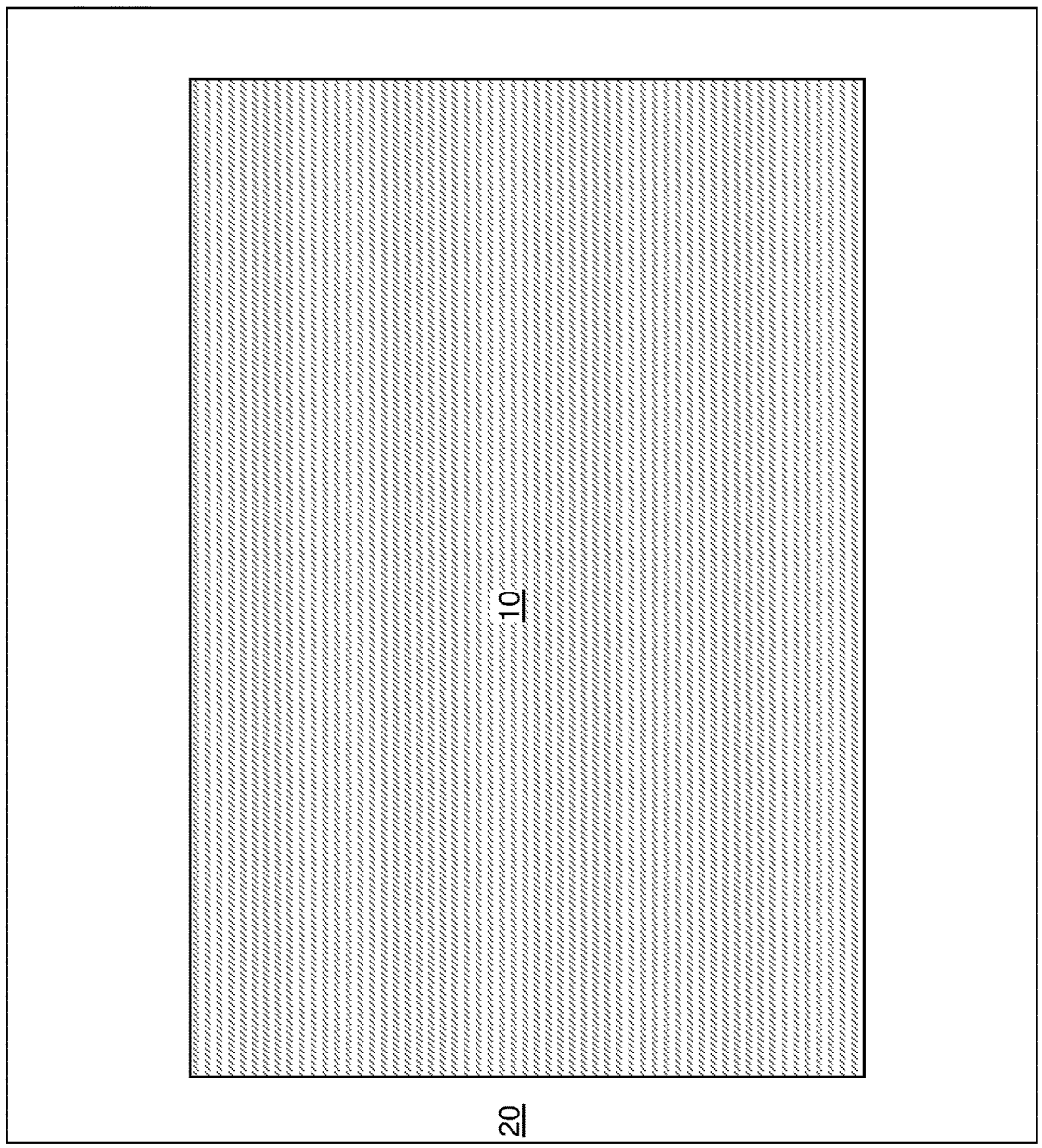
FIG. 1C is a top-down view of the first device region of the first exemplary structure of FIG. 1A.
Figure 1D:
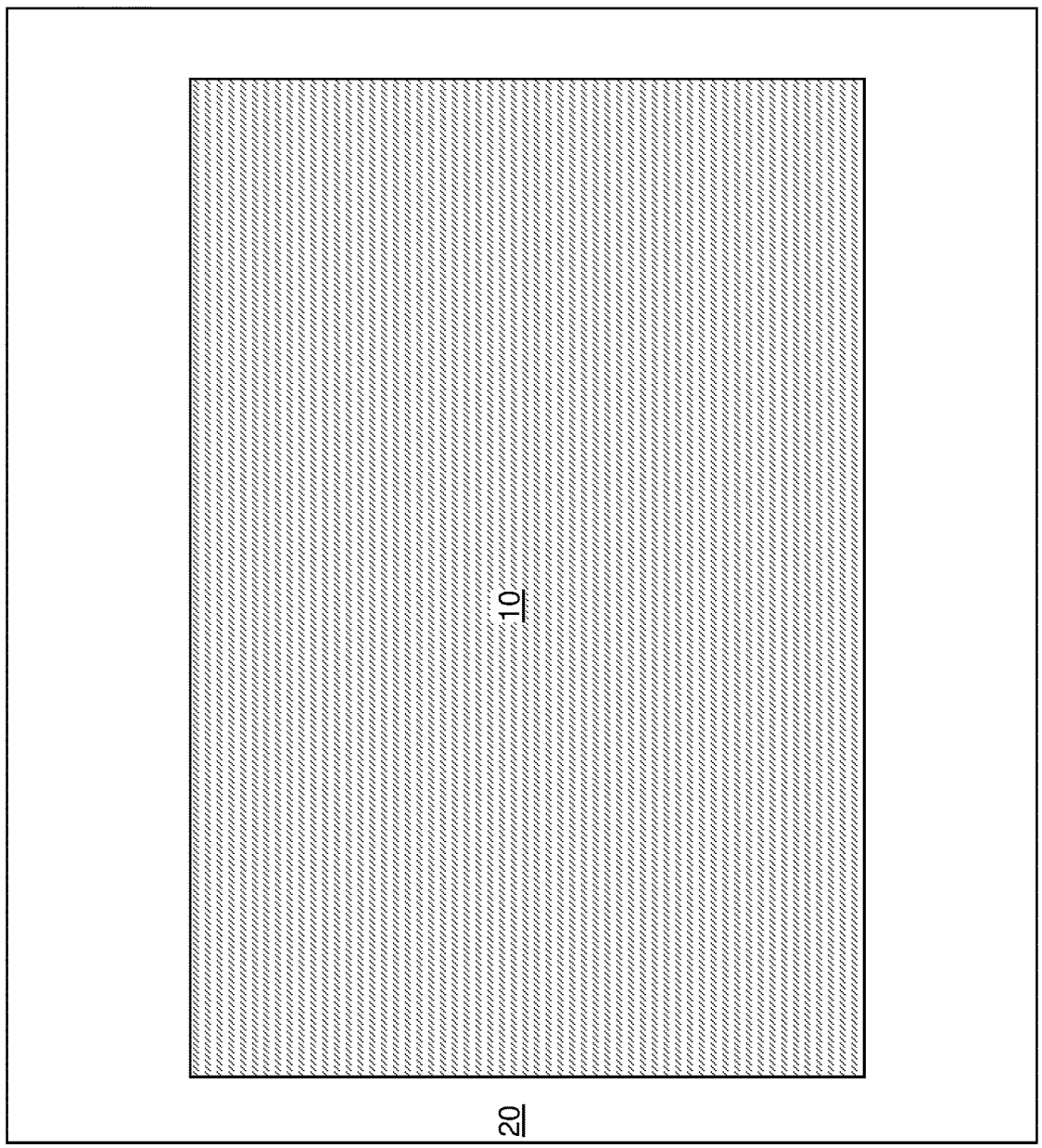
FIG. 1D is a top-down view of the second device region of the first exemplary structure of FIG. 1B.

Dielectric breakdown can occur at bottom corners of the gate dielectric during high voltage operation of the field effect transistor. Embodiments of the present disclosure provide high voltage field effect transistors including vertical current paths and methods of making the same, the various aspects of which are described below. Increase in the total length of the current path in the high voltage field effect transistors can be advantageously utilized to reduce high voltage breakdown and allows manufacture of high voltage field effect transistors within smaller device areas.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material", "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

Referring to FIGS. 1A-1D, a first exemplary structure according to an embodiment of the present disclosure is illustrated. The first exemplary structure may include many device regions, which can include a first device region 100 illustrated in FIGS. 1A and 1C and a second device region 200 illustrated in FIGS. 1B and 1D. As used herein, a "semiconductor substrate" refers to a substrate that includes at least one semiconductor material portion, i.e., at least one portion of a semiconductor material. The semiconductor substrate 10 includes a semiconductor material at least at a top portion thereof. The semiconductor substrate 10 may optionally include at least one additional material layer at a bottom portion thereof. In one embodiment, the semiconductor substrate 10 can be a bulk semiconductor substrate consisting of a semiconductor material (e.g., single crystal silicon wafer), or can be a semiconductor-on-insulator (SOI) substrate including a buried insulator layer (such as a silicon oxide layer) underlying the semiconductor (e.g., silicon) material portion, and a handle substrate underlying the buried insulator layer.

The semiconductor substrate 10 can include a lightly doped semiconductor material portion on which at least one field effect transistor can be formed. In one embodiment, the entirety of the semiconductor material on the semiconductor substrate 10 may include the lightly doped semiconductor material. In another embodiment, the lightly doped semiconductor material can be a semiconductor well embedded within another semiconductor material having a different dopant concentration and optionally, a doping of the opposite conductivity type. The dopant concentration of the lightly doped semiconductor material portion may be optimized for a body region of the at least one field effect transistor to be subsequently formed. For example, the lightly doped semiconductor material portion may include electrical dopants at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed. The conductivity type of the portion of the semiconductor substrate 10 to be subsequently employed as a body region of a field effect transistor is herein referred to as a first conductivity type, which may be p-type for an n-type field effect transistor or n-type for a p-type field effect transistor.

The semiconductor material of the semiconductor substrate 10 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor substrate 10 can be in a range from 0.5 mm to 2 mm in case the semiconductor substrate 10 is a bulk semiconductor substrate. In case the semiconductor substrate 10 is a semiconductor-on-insulator substrate, the thickness of the top semiconductor material layer within the semiconductor substrate 10 may be in a range from 100 nm to 1,000 nm, although lesser and greater thicknesses can also be employed.

Pad layers (not shown) such as a stack of a silicon oxide layer and a silicon nitride layer can be deposited over the top surface of the semiconductor substrate 10, and can be lithographically patterned to cover each device region, i.e., each region in which semiconductor devices are to be subsequently formed. An anisotropic etch process can be performed to etch shallow trenches that vertically extend through the pad layers and into an upper portion of the semiconductor substrate 10. The photoresist layer can be employed as an etch mask layer during the anisotropic etch process. The depth of the shallow trenches, as measured from the horizontal plane including the top surface of the semiconductor substrate 10, can be in a range from 300 nm to 3 microns, although lesser and greater depths may also be employed. The shallow trenches can be interconnected among one another to provide multiple device regions that correspond to a respective unetched portion of the semiconductor substrate 10. The multiple device regions include the first device region 100 in which a high voltage filed effect transistor is subsequently formed, and the second device region 200 in which a low voltage field effect transistor is subsequently formed. It is understood that multiple semiconductor devices including filed effect transistors can be formed on a same semiconductor substrate 10, and the high voltage field effect transistor formed in the first device region 100 and the low voltage field effect transistor formed in the second device region 200 are only exemplary devices among the entire set of semiconductor devices that can be formed on the semiconductor substrate 10. The photoresist layer can be subsequently removed, for example, by ashing.

At least one dielectric material such as undoped silicate glass can be deposited in the shallow trenches by a conformal deposition process such as a chemical vapor deposition process. A chemical mechanical planarization process can be performed to remove portions of the at least one dielectric material from above the pad layers. The remaining portions of the at least one dielectric material constitute shallow trench isolation structures 20. The pad layers can be subsequently removed, for example, by wet etch processes. For example, a wet etch employing hot phosphoric acid can be performed to remove the silicon nitride layer, and a wet etch process employing dilute hydrofluoric acid can be performed to remove the silicon oxide layer. Physically exposed surfaces of the shallow trench isolation structures 20 may be collaterally recessed during removal of the silicon oxide layer.

In one embodiment, the first device region 100 can have a rectangular top surface, which is a surface of the semiconductor substrate 10. The lengthwise sides of the rectangular top surface that is parallel to the direction of horizontal current flow within the first device region 100 can be in a range from 600 nm to 10 microns, such as from 1.2 microns to 5 microns, although lesser and greater dimensions may also be employed. The widthwise sides of the rectangular top surface that is perpendicular to the direction of horizontal current flow within the first device region 100 can be in a range from 300 nm to 20 microns, such as from 600 nm to 10 microns, although lesser and greater dimensions may also be employed. The second device region 200 can have a rectangular top surface, and the dimensions for the rectangular top surface may be suitably selected.

Generally, a shallow trench isolation structure 20 comprising a dielectric material can be formed in an upper region of the semiconductor material layer (e.g., a doped well or an epitaxial semiconductor layer) of the semiconductor substrate 10. The semiconductor material layer can have a doping of the first conductivity type, and the shallow trench isolation structure 20 can laterally surround each device region of the semiconductor material layer such as the first device region 100 and the second device region 200.

Figure 2A:
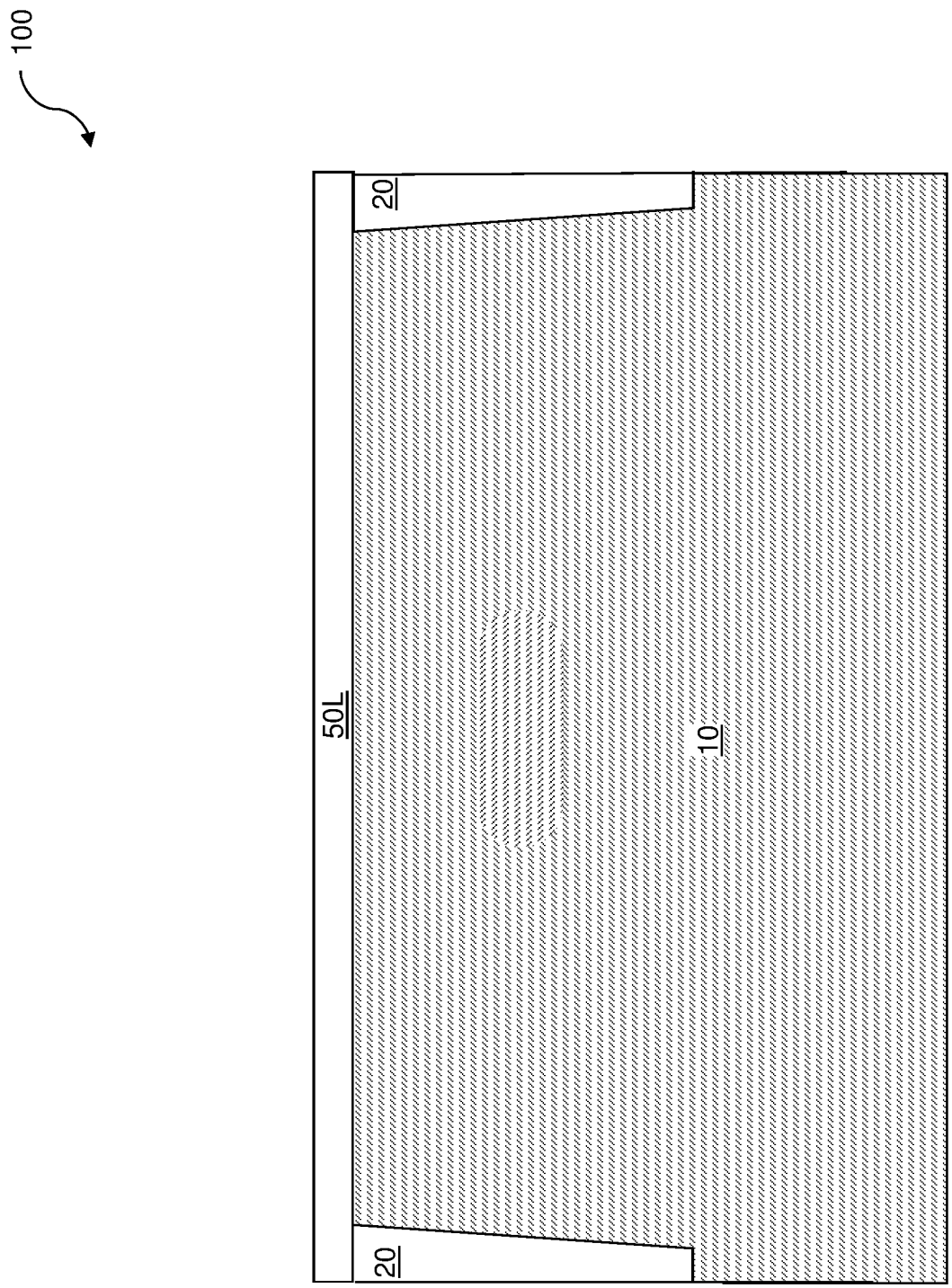
FIG. 2A is a vertical cross-sectional view of the first device region of the first exemplary structure after formation of a first gate dielectric layer according to an embodiment of the present disclosure.
Figure 2B:
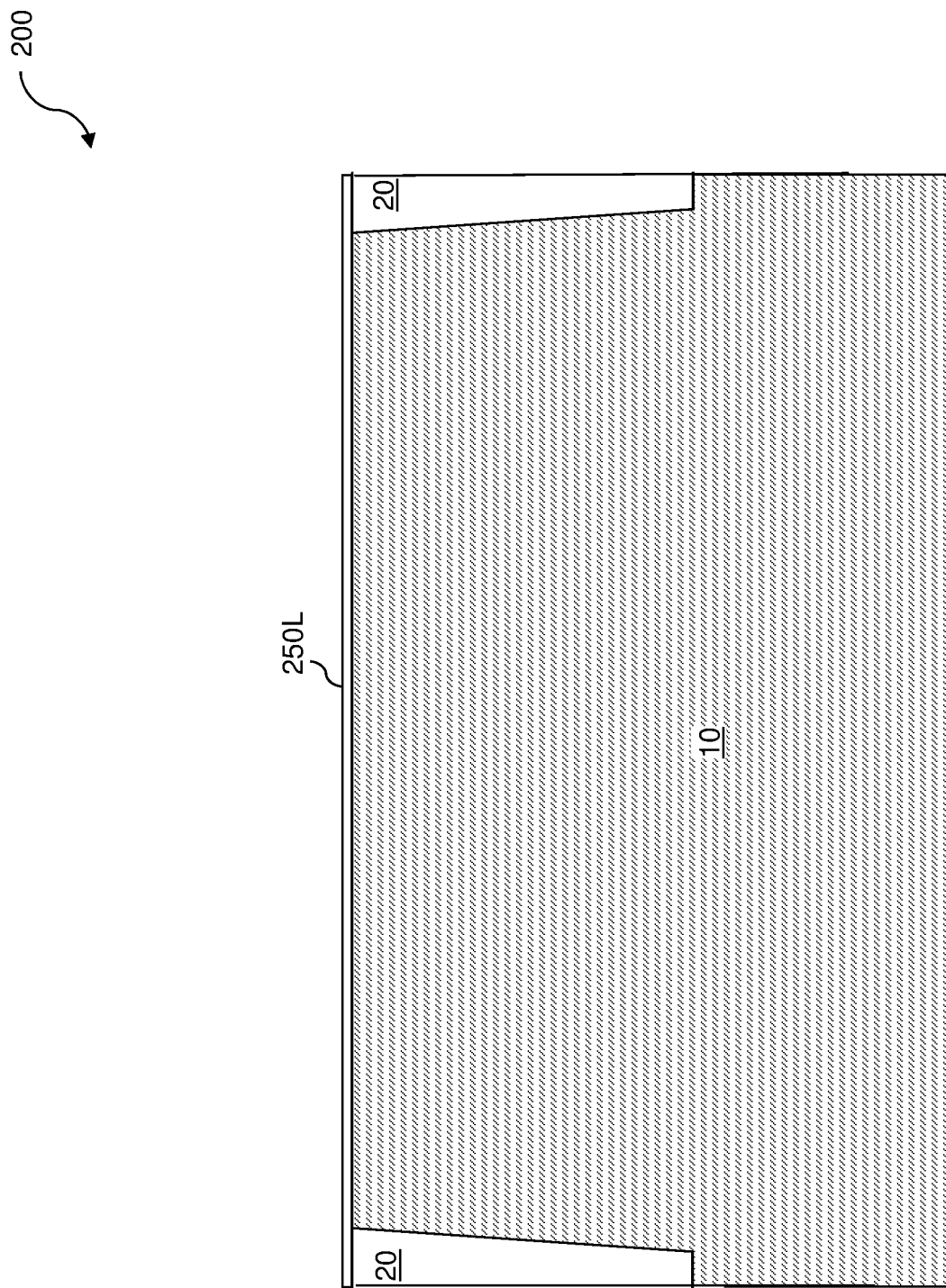
FIG. 2B is a vertical cross-sectional view of the second device region of the first exemplary structure after formation of a second gate dielectric layer according to an embodiment of the present disclosure.

Referring to FIGS. 2A and 2B, gate dielectric layers (50L, 250L) can be formed over the top surface of the semiconductor substrate 10. For example, a first gate dielectric layer 50L having a thickness suitable for operation of a high voltage field effect transistor can be formed on all physically exposed surfaces of the semiconductor substrate 10, for example, by thermal oxidation of the physically exposed surface portions of the semiconductor substrate 10. If the semiconductor substrate 10 includes single crystalline silicon, the first gate dielectric layer can consist essentially of thermal silicon oxide. The thickness of the first gate dielectric layer 50L can be in a range from 6 nm to 30 nm, although lesser and greater thicknesses can also be employed.

A photoresist layer (not shown) can be applied over the first exemplary structure, and can be lithographically patterned to cover the first device region 100 without covering the second device region 200. An isotropic etch process such as a wet etch process employing dilute hydrofluoric acid can be performed to remove the portion of the first gate dielectric layer 50L located in the second device region 200. The photoresist layer can be subsequently removed, for example, by ashing.

A second gate dielectric layer 250L can be formed in the second device region 200. For example, a thermal oxidation process may be performed to convert a surface portion of the semiconductor substrate 10 in the second device region 200 into the second gate dielectric layer 250L. Optionally, a dielectric metal oxide layer may be deposited and may be incorporated into the second gate dielectric layer 250L. Any portion of the gate dielectric material that is formed on the first gate dielectric layer 50L during formation of the second gate dielectric layer 250L is incorporated into the second gate dielectric layer 250L. Generally, the first gate dielectric layer 50L has a thickness (such as a thickness in a range from 6 nm to 30 nm) that is suitable for operation of a high voltage field effect transistor, and the second gate dielectric layer 250L has a thickness that is suitable for operation of a low voltage field effect transistor. The second gate dielectric layer 250L is thinner than the first gate dielectric layer 50L. In an illustrative example, the second gate dielectric layer 250L can have a thickness in a range from 1 nm to 4 nm, although lesser and greater thicknesses may also be employed. In an alternative embodiment, the second gate dielectric layer 250L is formed first in both first and second device regions (100, 200), followed by forming a mask over the second gate dielectric layer 250L in the second device region 200 and further oxidizing the exposed semiconductor substrate 10 in the first device region 100 to increase the thickness of the second gate dielectric layer 250L exposed in the first device region 100 to form the first gate dielectric layer 50L.

Figure 3A:
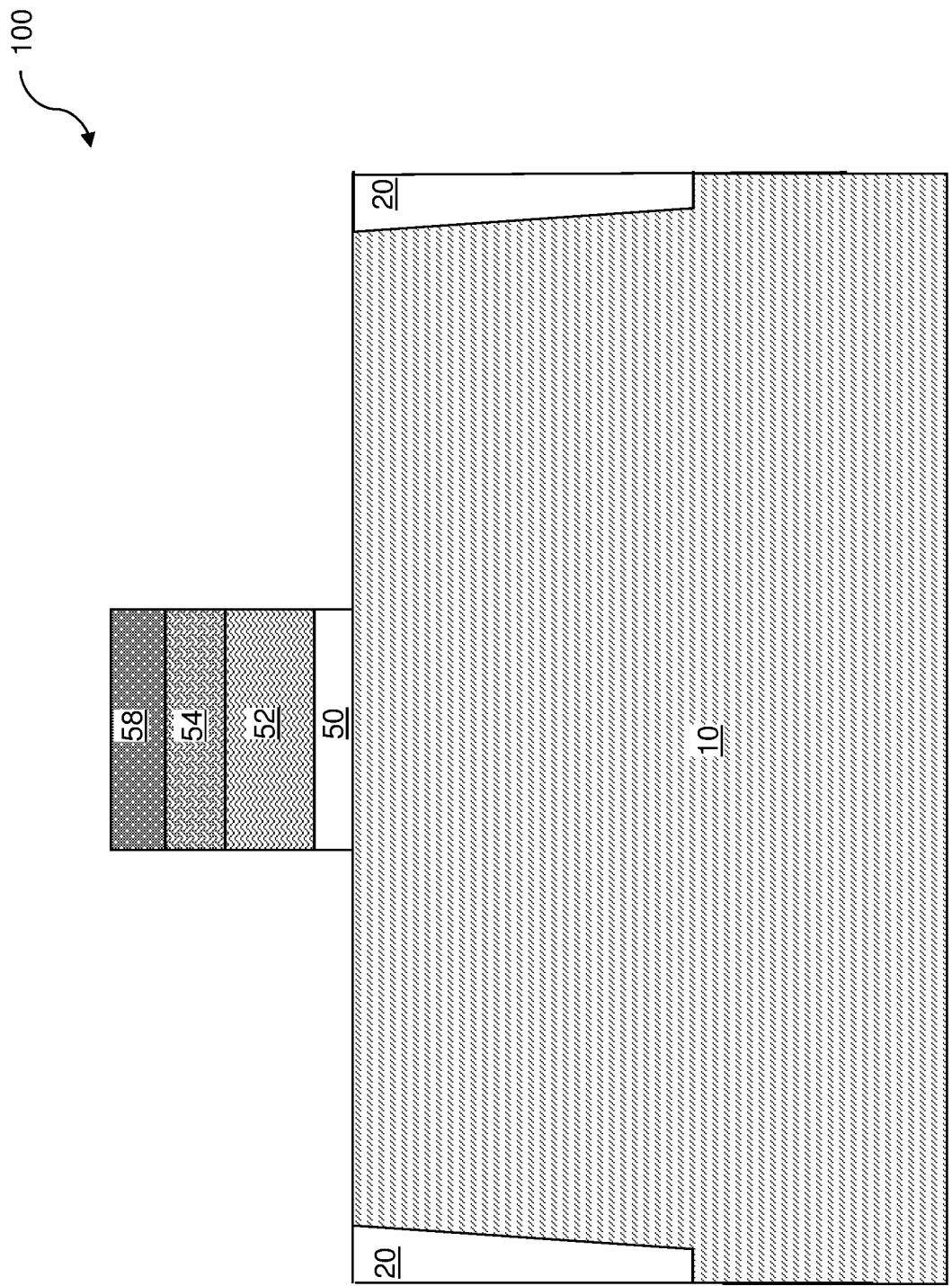
FIG. 3A is a vertical cross-sectional view of the first device region of a first exemplary structure after formation of a first gate stack structure according to an embodiment of the present disclosure.
Figure 3B:
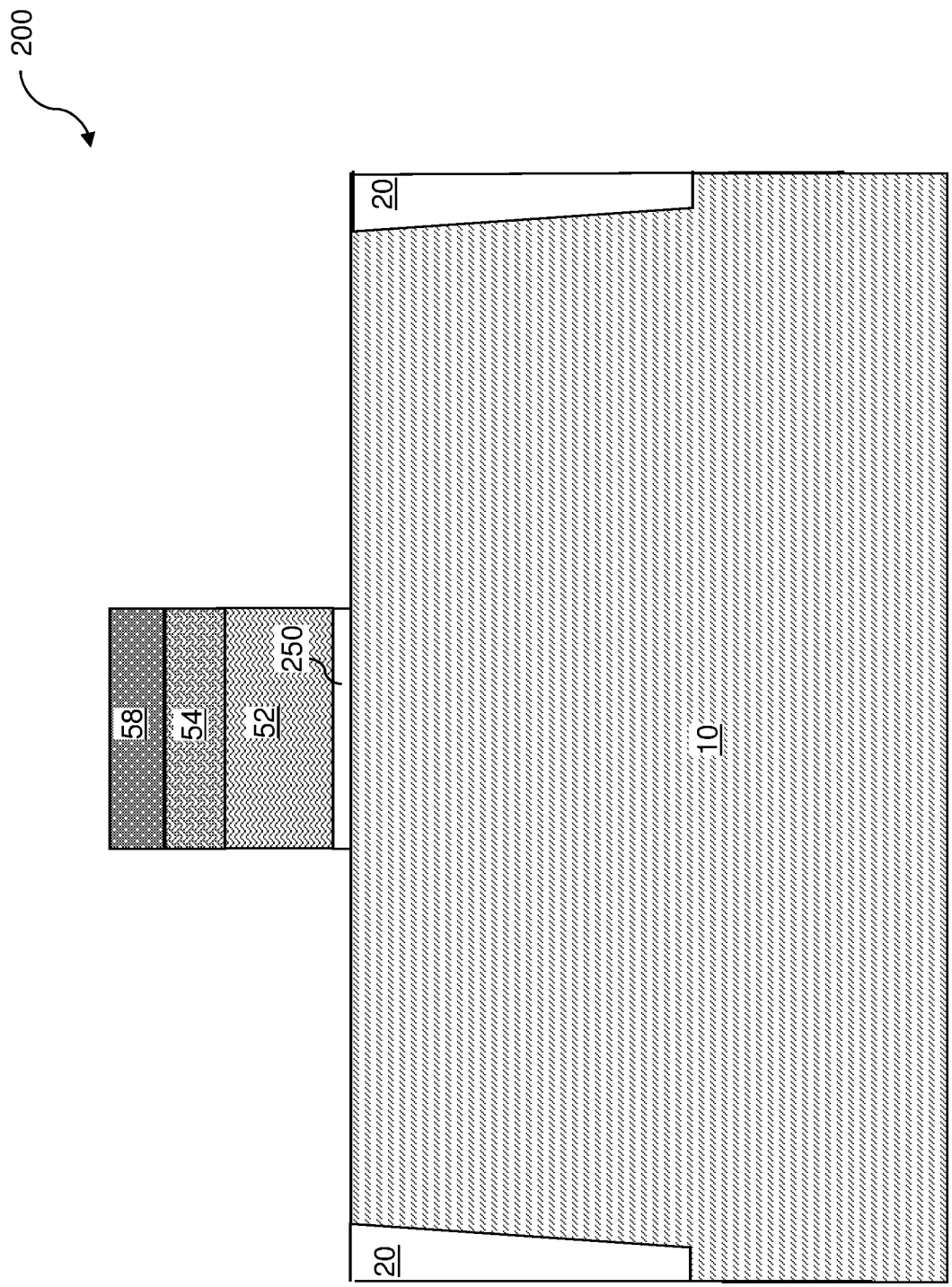
FIG. 3B is a vertical cross-sectional view of the second device region of the first exemplary structure after formation of a second gate stack structure according to an embodiment of the present disclosure.
Figure 3C:
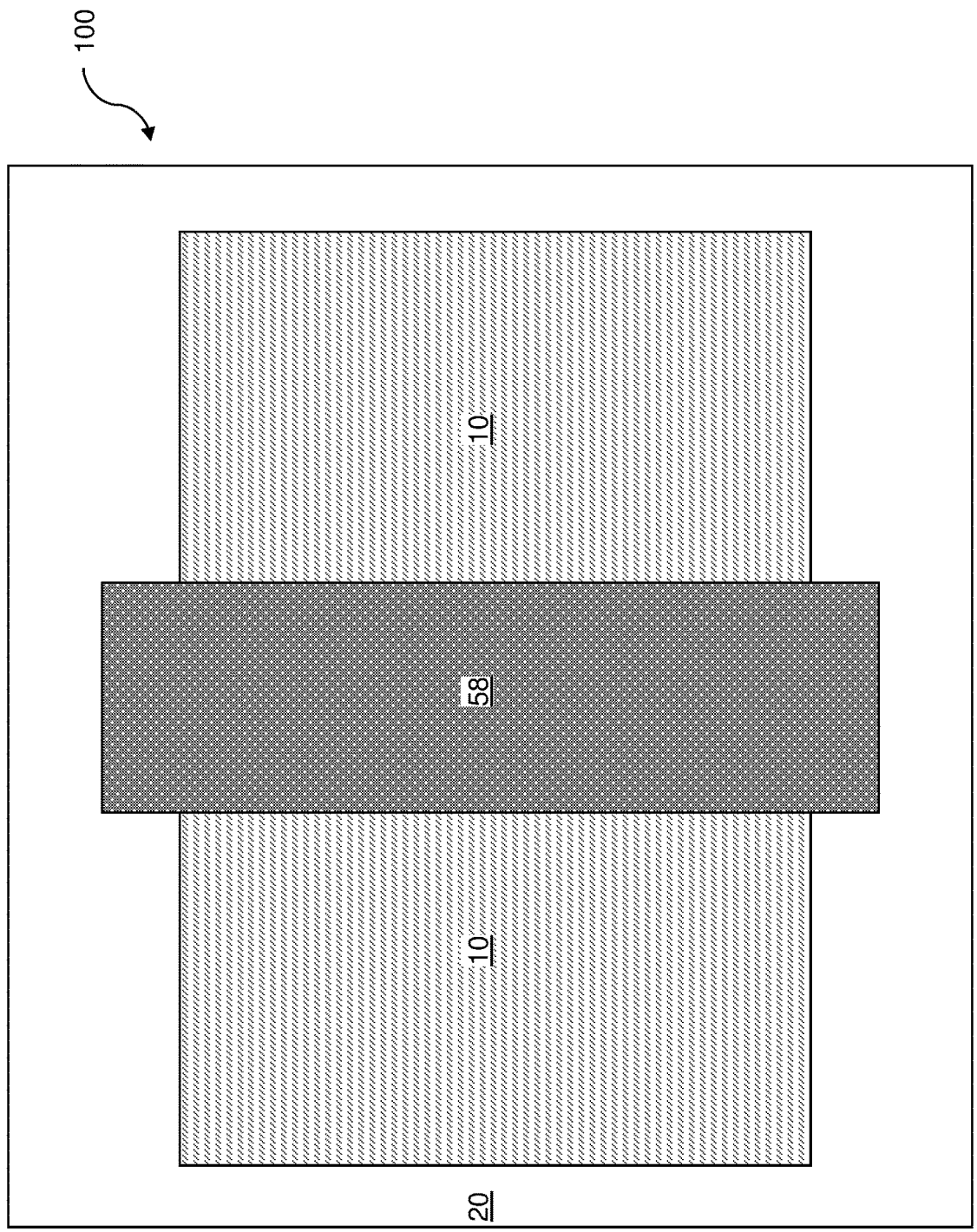
FIG. 3C is a top-down view of the first device region of the first exemplary structure of FIG. 3A.
Figure 3D:
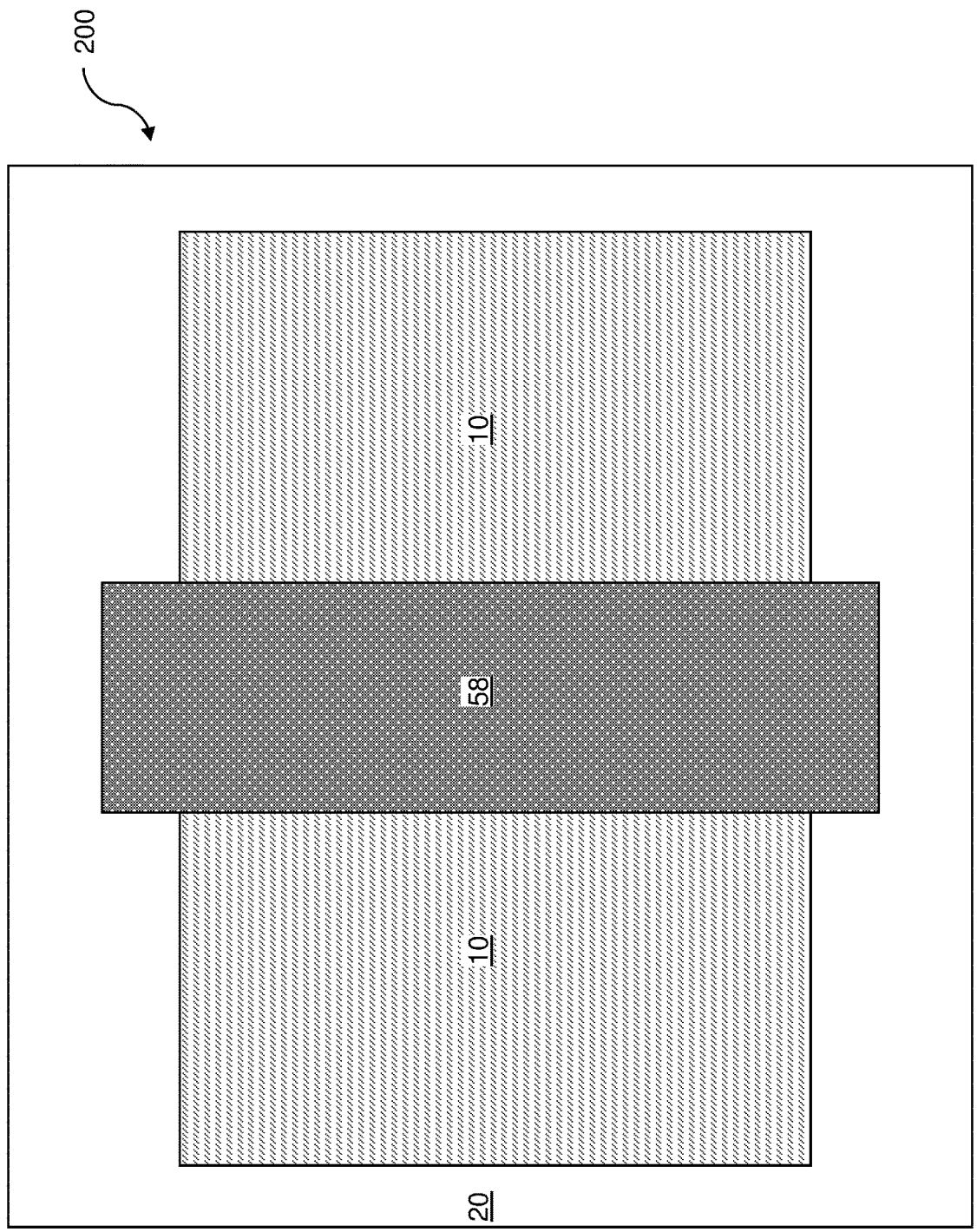
FIG. 3D is a top-down view of the second device region of the first exemplary structure of FIG. 3B.

Referring to FIGS. 3A and 3B, at least one gate electrode material layer and a gate cap dielectric layer can be deposited over the first gate dielectric layer 50L and the second gate dielectric layer 250L. The at least one gate electrode material layer includes one or more layers of an electrically conductive material that can be employed as a gate electrode material. In an illustrative embodiment, the at least one gate electrode material layer can include a semiconductor gate electrode layer including a doped semiconductor material and a metallic gate electrode layer including a metallic gate electrode material. For example, the semiconductor gate electrode layer can include a doped polysilicon layer having a thickness in a range from 30 nm to 150 nm, and the metallic gate electrode layer can include a metallic material such as a transition metal or metal silicide and can have a thickness in a range from 50 nm to 150 nm, although lesser and greater thicknesses may also be employed. The gate cap dielectric layer includes a gate cap dielectric material such as silicon nitride, and can have a thickness in a range from 30 nm to 100 nm, although lesser and greater thicknesses may also be employed.

A photoresist layer can be applied over the gate cap dielectric layer, and can be lithographically patterned to form gate patterns, i.e., patterns of gate electrodes to be subsequently formed. In one embodiment, the gate patterns can cover middle portions of the device regions such as a middle portion of the first device region 100 and a middle portion of the second device region 200. An anisotropic etch process can be performed to transfer the gate patterns through the gate cap dielectric layer, the at least one gate electrode layer, the first gate dielectric layer 50L, and the second gate dielectric layer 250L. A terminal step of the anisotropic etch process can be selective to the semiconductor material of the semiconductor substrate 10 so that overetch into the semiconductor substrate 10 is minimized. The photoresist layer can be removed, for example, by ashing.

Each patterned portion of the gate cap dielectric layer comprises a gate cap dielectric 58. Each patterned portion of the at least one gate electrode layer comprises a gate electrode (52, 54). In case the at least one gate electrode layer includes a semiconductor gate electrode layer and a metallic gate electrode layer, each gate electrode (52, 54) can include a respective stack of a semiconductor gate electrode 52 and a metallic gate electrode 54. A patterned portion of the first gate dielectric layer 50L formed in the first device region 100 includes a first gate dielectric 50, and a patterned portion of the second gate dielectric layer 250L formed in the second device region 200 includes a second gate dielectric 250. The contiguous set of material portions including the first gate dielectric 50, a semiconductor gate electrode 52, a metallic gate electrode 54, and a gate cap dielectric 58 in the first device region 100 comprises a first gate stack structure (50, 52, 54, 58). The continuous set of material portions including the second gate dielectric 250, a semiconductor gate electrode 52, a metallic gate electrode 54, and a gate cap dielectric 58 in the second device region 200 comprises a second gate stack structure (250, 52, 54, 58). The lateral dimension between two edges of the first gate dielectric 50 that contact the semiconductor substrate 10 in the first device region 100 is the first gate length of the first gate stack structure (50, 52, 54, 58), which can be in a range from 200 nm to 3,000 nm, although lesser and greater dimensions may also be employed. The lateral dimension between two edges of the second gate dielectric 250 that contact the semiconductor substrate 10 in the second device region 200 is the second gate length of the second gate stack structure (250, 52, 54, 58), which can be in a range from 5 nm to 100 nm, although lesser and greater dimensions may also be employed.

Figure 4A:
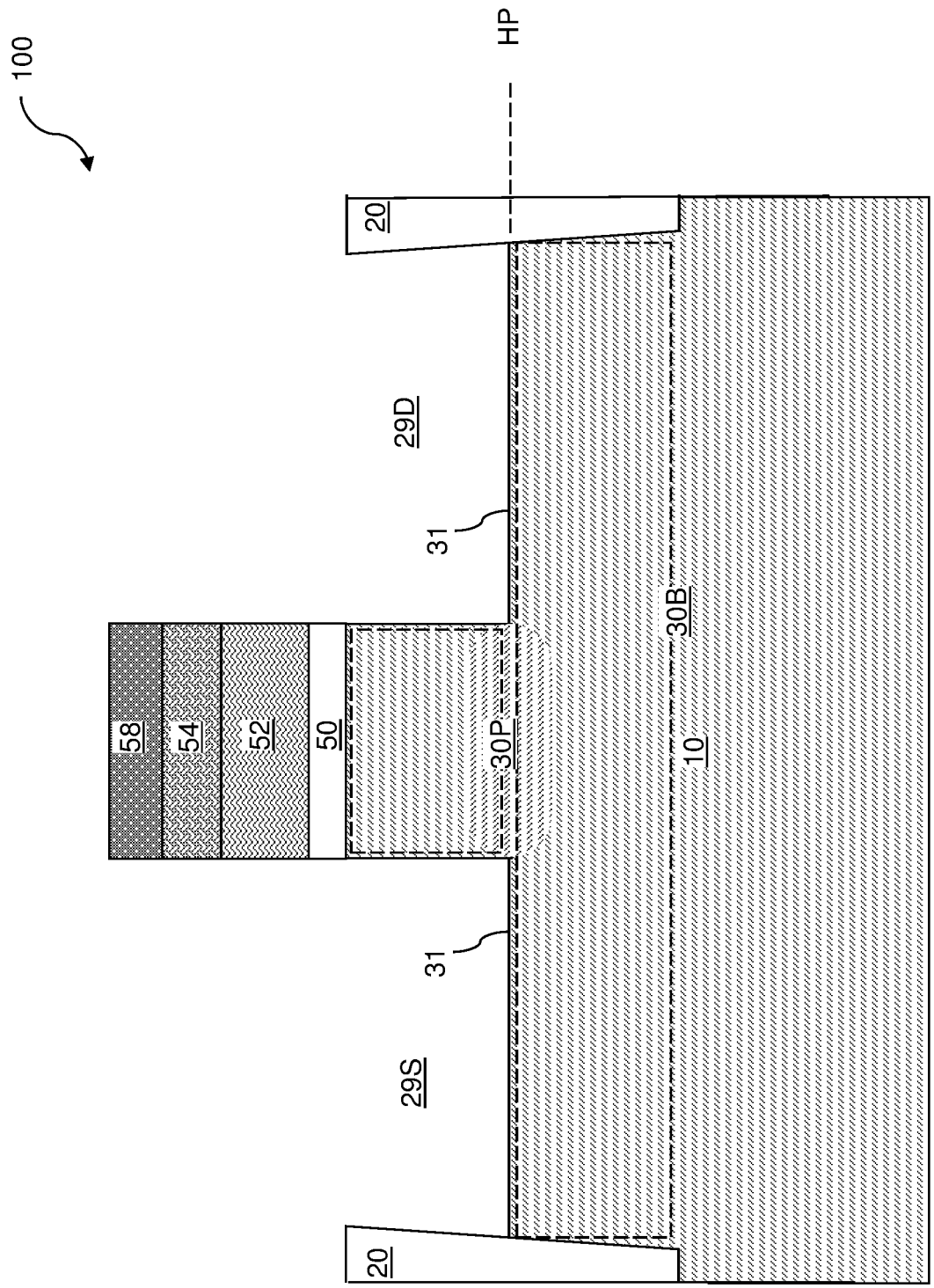
FIG. 4A is a vertical cross-sectional view of the first device region of the first exemplary structure after masking the second device region and formation of a source-side cavity and a drain-side cavity in the first device region according to an embodiment of the present disclosure.
Figure 4B:
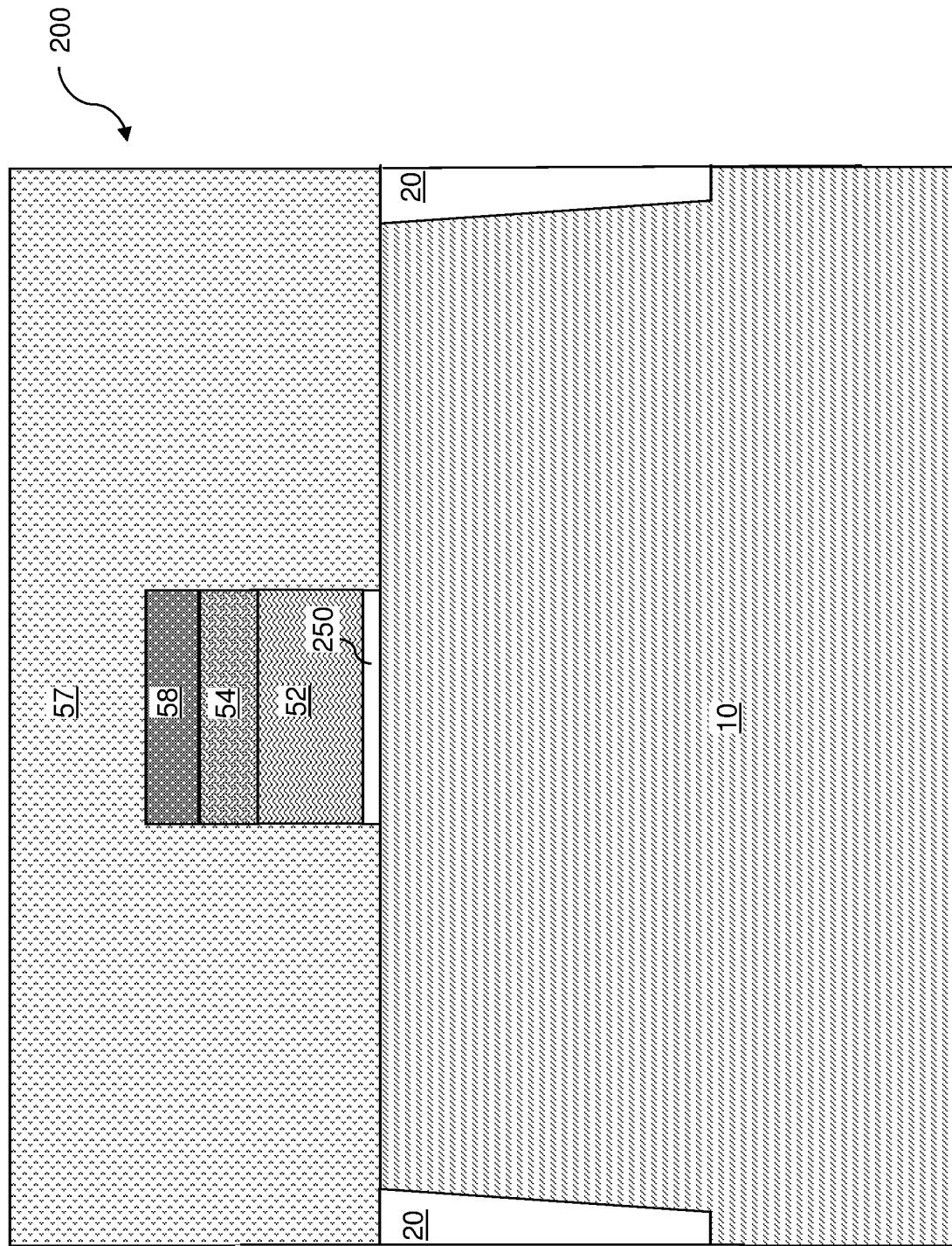
FIG. 4B is a vertical cross-sectional view of the second device region of the first exemplary structure after masking the second device region and formation of a source-side cavity and a drain-side cavity in the first device region according to an embodiment of the present disclosure.

Referring to FIGS. 4A and 4B, a photoresist layer 57 can be applied over the first exemplary structure, and can be lithographically patterned to cover the second device region 200 without covering the first device region 100. According to an aspect of the present disclosure, an anisotropic etch process can be performed to vertically recess the semiconductor material of the semiconductor substrate 10 selective to the dielectric materials of the gate cap dielectric 58 and the shallow trench isolation structure 20. Anisotropic etching of a semiconductor material can be effected, for example, by a Bosch process employing sulfur hexafluoride or by a reactive ion etch process employing a combination of nitrogen trifluoride, halofluorocarbon, and optionally an inert gas (such as argon). Physically exposed portions of the top surface of the semiconductor substrate 10 can be vertically recessed to form a source-side cavity 29S on one side of the first gate stack structure (50, 52, 54, 58) and a drain-side cavity 29D on an opposite side of the first gate stack structure (50, 52, 54, 58).

The shallow trench isolation structure 20 comprises a dielectric material and is embedded within a semiconductor material layer of the semiconductor substrate 10. The shallow trench isolation structure 20 laterally surrounds a first upper portion of the semiconductor material layer in the first device region 100, and laterally surrounds a second upper portion of the semiconductor material layer. A pair of recessed horizontal surfaces of a remaining portion of the semiconductor substrate 10 can be formed at the bottom of the source-side cavity 29S and the drain-side cavity 29D in the first device region 100. The first device region 100 of the semiconductor material layer includes a base semiconductor portion 30B comprising the pair of top horizontal surfaces 31 that are recessed below a bottom surface of the first gate dielectric 50 and a pedestal semiconductor portion 30P located between the pair of top horizontal surfaces 31 and the bottom surface of the gate dielectric 50.

Thus, the first upper portion of the semiconductor material layer in the first device region 100 comprises the base semiconductor portion 30B comprising a pair of top horizontal surfaces 31 and the pedestal semiconductor portion 30P located between the pair of top horizontal surfaces 31 and vertically protruding above a horizontal plane HP including the pair of top horizontal surfaces 31. The base semiconductor portion 30B can be located between the horizontal plane including the bottom surface of the shallow trench isolation structure 20 and the horizontal plane HP including the pair of top horizontal surfaces 31 of the base semiconductor portion 30B.

A horizontal interface between the first gate dielectric 50 and the pedestal semiconductor portion 30P is located above the horizontal plane HP including the pair of top horizontal surfaces 31 of the base semiconductor portion 30B. In one embodiment, a vertical distance between the horizontal interface between the first gate dielectric 50 and the pedestal semiconductor portion 30P and the horizontal plane HP including the pair of top horizontal surfaces 31 of the base semiconductor portion 30B can be in a range from 100 nm to 2 microns, and may be in a range from 300 nm to 1,000 nm, although lesser and greater vertical distances may also be employed.

In one embodiment, a top periphery of the pedestal semiconductor portion 30P comprises a pair of first edges that coincide with a pair of edges of the first gate dielectric 50 and a pair of second edges that are adjoined to the shallow trench isolation structure 20 (outside the vertical plane of FIG. 4A and not shown in FIG. 4A). In one embodiment, the pair of top horizontal surfaces 31 of the base semiconductor portion 30B are adjoined to sidewalls of the shallow trench isolation structure 20. In one embodiment, the base semiconductor portion 30B comprises a first single crystalline semiconductor material (e.g., silicon) portion having a doping of the first conductivity type, and the pedestal semiconductor portion 30P comprises a second single crystalline semiconductor material (e.g., silicon) portion having a doping of the first conductivity type. In one embodiment, the first base semiconductor portion 30B and the pedestal semiconductor portion 30P can have the same material composition and can be epitaxially aligned to each other.

In one embodiment, the pedestal semiconductor portion 30P can have a pair of sidewalls that are each physically exposed to the source-side cavity 29S or to the drain-side cavity 29D, and are laterally spaced apart from each other by a uniform lateral spacing, which can be the same as the gate length. In one embodiment, the pair of sidewalls of the pedestal semiconductor portion 30P can be vertically coincident with overlying sidewalls of the first gate stack structure (50, 52, 54, 58). As used herein, a first surface and a second surface are "vertically coincident" if the second surface overlies or underlies the first surface and if there exists a vertical plane including the first surface and the second surface. Generally, the pedestal semiconductor portion 30P can comprise a pair of sidewalls that are vertically coincident with sidewalls of the first gate stack structure (50, 52, 54, 58). The photoresist layer 57 can be subsequently removed, for example, by ashing.

Figure 5A:
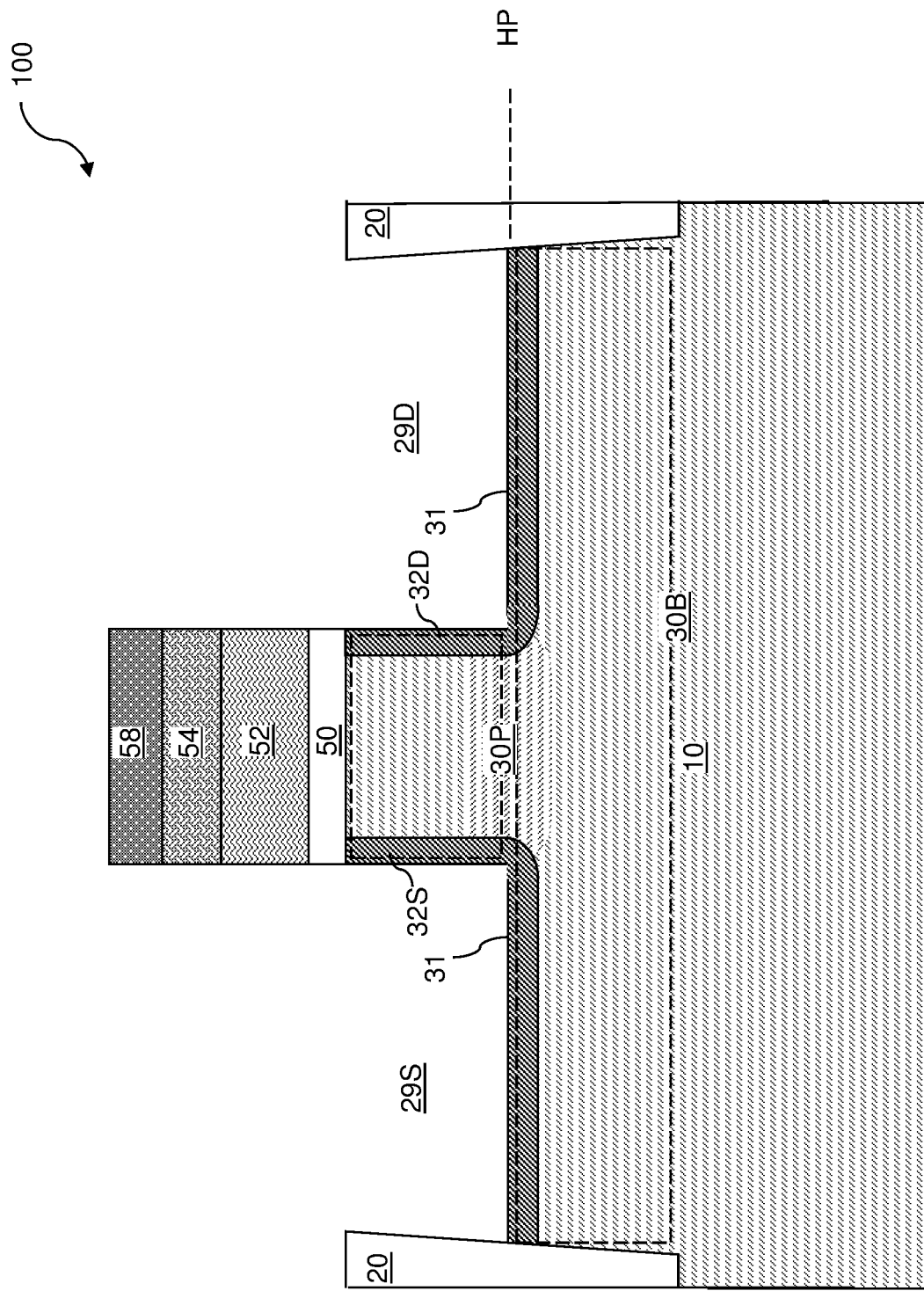
FIG. 5A is a vertical cross-sectional view of the first device region of the first exemplary structure after formation of source extension regions and drain extension regions according to an embodiment of the present disclosure.
Figure 5B:
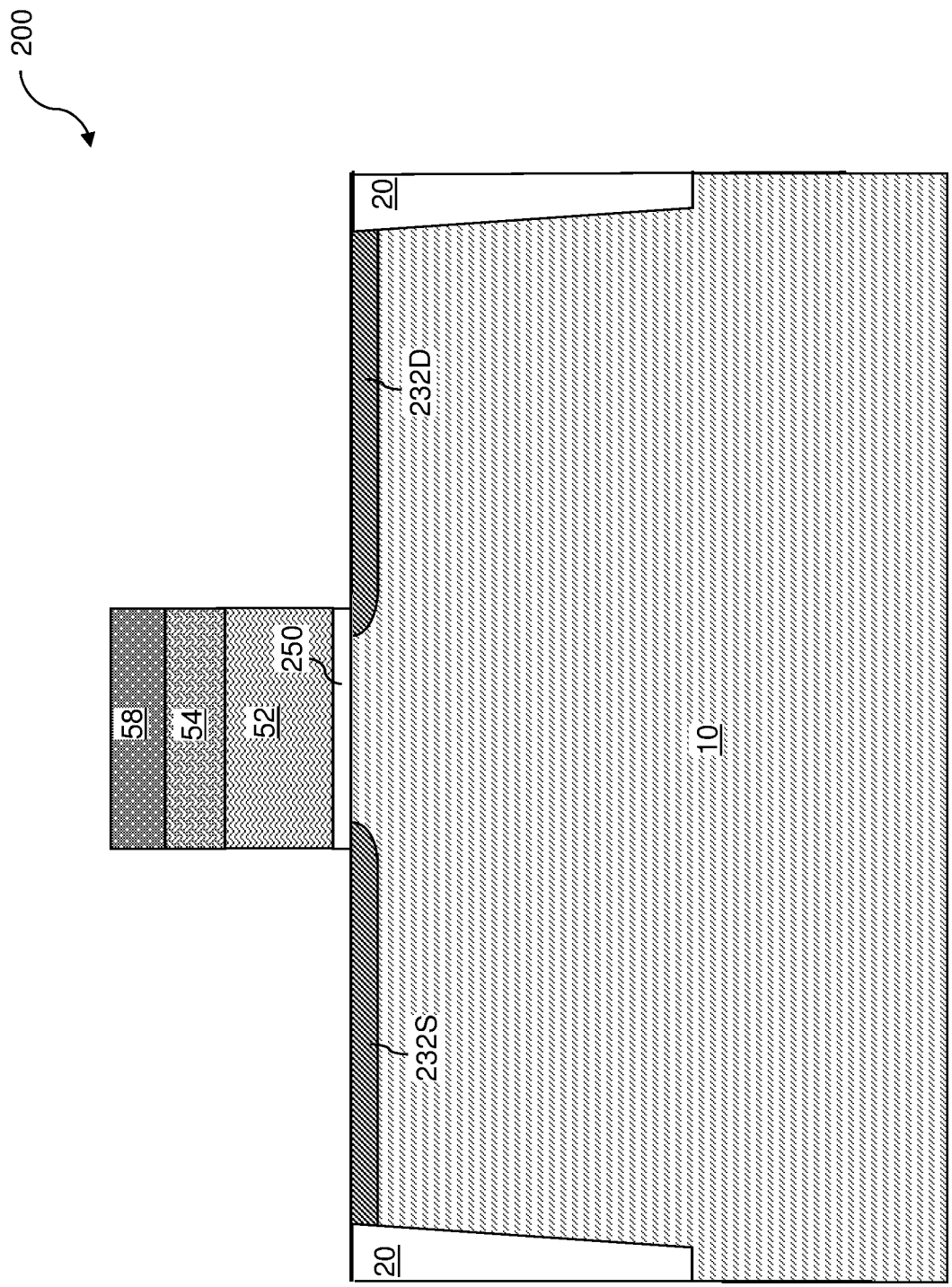
FIG. 5B is a vertical cross-sectional view of the second device region of the first exemplary structure after formation of source extension regions and drain extension regions according to an embodiment of the present disclosure.

Referring to FIGS. 5A and 5B, at least one doped extension region (32S, 32D) having a doping of a second conductivity type that is the opposite of the first conductivity type can be formed underneath at least one sidewall of the pedestal semiconductor portion 30P in the first device region 100. In one embodiment, the at least one doped extension region (32S, 32D) formed in the first device region 100 can include a source extension region 32S and a drain extension region 32D. Generally, dopants of the second conductivity type can be introduced into the physically exposed portions of the semiconductor material layer in the semiconductor substrate 10. For example, at least one ion implantation process and/or at least one plasma doping may be employed to introduce dopants of the second conductivity type into surface portions of the semiconductor material layer in the semiconductor substrate 10. In case p-type transistors and n-type transistors are formed on the semiconductor substrate 10, masked ion implantation processes may be employed to implant dopants of different conductivity type into different field effect transistors.

For example, multiple instances of the first device region 100 can be formed on the semiconductor substrate 10 such that a first subset of the first device regions 100 includes p-type doped portions of the semiconductor substrate 10 (so that the first conductivity type is p-type for the first subset) and a second subset of the first device regions 100 includes n-type doped portions of the semiconductor substrate 10 (so that the first conductivity type is n-type for the second subset). For each first device region 100 having a doping of a respective first conductivity type, dopants of a respective second conductivity type that is the opposite of the first conductivity type can be implanted to form a respective source extension region 32S and a respective drain extension region 32D. For each second device region 200 having a doping of a respective first conductivity type, dopants of a respective second conductivity type that is the opposite of the first conductivity type can be implanted to form a respective source extension region 232S and a respective drain extension region 232D. The source extension regions (32S, 232S) and the drain extension regions (32D, 232D) of different field effect transistors may, or may not, have the same atomic concentration of dopants. Thus, one or more masked ion implantation processes may be employed to provide dopants of a respective second conductivity type at a target atomic concentration within each of the source extension regions (32S, 232S) and the drain extension regions (32D, 232D).

Generally, each source extension region 32S and each drain extension region 32D can include dopants of a respective second conductivity type at an atomic concentration that is less than the atomic concentration of dopants to be employed in source regions and drain regions to be subsequently formed to prevent breakdown of field effect transistors during operation. For example, each source extension region 32S and each drain extension region 32D can include dopants of a respective second conductivity type at an atomic concentration in a range from $1.0 \times 10^{17}/cm^3$ to $1.0 \times 10^{20}/cm^3$, such as from $1.0 \times 10^{18}/cm^3$ to $1.0 \times 10^{19}/cm^3$, although lesser and greater atomic concentrations can also be employed. The extension regions 232S and 232D in the second device region 200 may have the same concentration of dopants of the second conductivity type.

In one embodiment, angled ion implantation processes may be employed to dope surface portions of the pedestal semiconductor portion 30P that underlie the physically exposed sidewalls of the pedestal semiconductor portion 30P, i.e., the sidewalls of the pedestal semiconductor portion 30P that are physically exposed to the source-side cavity 29S or to the drain-side cavity 29D. The thickness of the horizontally-extending portions of the source extension region 32S and the drain extension region 32D in each first device region 100 may be in a range from 10 nm to 200 nm, although lesser and greater thicknesses may also be employed. The width of the vertically-extending portions of the source extension region 32S and the drain extension region 32D in each first device region 100 may be in a range from 10 nm to 200 nm, although lesser and greater thicknesses may also be employed. A single crystalline semiconductor material portions having a doping of the first conductivity type is located within the pedestal semiconductor portion 30P. Each interface between the at least one doped extension region (32S, 32DS) and the single crystalline semiconductor material portion within the pedestal semiconductor portion 30P comprises a p-n junction that is parallel to one of the pair of sidewalls of the pedestal semiconductor portion 30P and is adjoined to a bottom surface of the first gate dielectric 50.

Referring to FIGS. 6A-6D, a conformal dielectric material layer including a dielectric material such as silicon oxide can be deposited, for example, by a chemical vapor deposition process. The thickness of the conformal dielectric material layer can be in a range from 30 nm to 300 nm, although lesser and great thicknesses may also be employed. The conformal dielectric layer can be anisotropically etched by performed an anisotropic etch process such as a reactive ion etch process. A first dielectric gate spacer 56 is formed around the first gate stack structure (50, 52, 54, 58) in the first device region 100, and a second dielectric gate spacer 256 is formed around the second gate stack structure (250, 52, 54, 58) in the second device region 200. The first dielectric gate spacer 56 can be formed on a pair of sidewalls of the first gate stack structure (50, 52, 54, 58) and on a pair of sidewalls of the pedestal semiconductor portion 30P that are vertically coincident with the pair of sidewalls of the first gate stack structure (50, 52, 54, 58). The width of the first dielectric gate spacer 56 and the second dielectric gate spacer 256 can be in a range from 20 nm to 400 nm, such as from 40 nm to 200 nm, although lesser and greater widths can also be employed.

A remaining portion of the conformal dielectric material layer in the first device region 100 comprises a first shallow trench isolation spacer 66 that comprises a same insulating material as the first dielectric gate spacer 56 and the second dielectric gate spacer 256. The first shallow trench isolation spacer 66 contacts sidewalls of the shallow trench isolation structure 20 and peripheral portions of the pair of top horizontal surfaces 31 of the base semiconductor portion 30B. The first shallow trench isolation spacer 66 is adjoined to the first dielectric gate spacer 56 as shown in FIG. 6C.

Dopants of the second conductivity type can be implanted into portions of the semiconductor substrate 10 that are not masked by the gate stack structures (50, 250, 52, 54, 58), the dielectric gate spacers (56, 256), the shallow trench isolation spacers 66, or the shallow trench isolation structures 20 to form source regions (34S, 234S) and drain regions (34D, 234D). For example, at least one ion implantation process may be employed to introduce dopants of the second conductivity type into unmasked surface portions of the semiconductor material layer in the semiconductor substrate 10. In case p-type transistors and n-type transistors are formed on the semiconductor substrate 10, masked ion implantation processes may be employed to implant dopants of different conductivity type into different field effect transistors.

For example, multiple instances of the first device region 100 can be formed on the semiconductor substrate 10 such that a first subset of the first device regions 100 includes p-type doped portions of the semiconductor substrate 10 (so that the first conductivity type is p-type for the first subset) and a second subset of the first device regions 100 includes n-type doped portions of the semiconductor substrate 10 (so that the first conductivity type is n-type for the second subset). For each first device region 100 having a doping of a respective first conductivity type, dopants of a respective second conductivity type that is the opposite of the first conductivity type can be implanted to form a respective source region 34S and a respective drain region 34D. For each second device region 200 having a doping of a respective first conductivity type, dopants of a respective second conductivity type that is the opposite of the first conductivity type can be implanted to form a respective source region 234S and a respective extension region 234D. The source regions (34S, 234S) and the drain regions (34D, 234D) of different field effect transistors may, or may not, have the same atomic concentration of dopants. Thus, one or more masked ion implantation processes may be employed to provide dopants of a respective second conductivity type at a target atomic concentration within each of the source regions (34S, 234S) and the drain regions (34D, 234D).

Generally, each source region (34S, 234S) and each drain region (34D, 234D) can include dopants of a respective second conductivity type at an atomic concentration that is greater than the atomic concentration of dopants in the source extension regions (32S, 232S) and the drain extension regions (32D, 232D). For example, each source region (34S, 234S) and each drain region (34D, 234D) can include dopants of a respective second conductivity type at an atomic concentration in a range from $5.0 \times 10^{18}/cm^3$ to $2.0 \times 10^{21}/cm^3$, such as from $1.0 \times 10^{20}/cm^3$ to $1.0 \times 10^{21}/cm^3$, although lesser and greater atomic concentrations can also be employed.

Due to the lateral straggle of implanted dopants of the second conductivity type, the source regions (34S, 234S) and the drain regions (34D, 234D) can contact bottom surfaces of the respective dielectric gate spacers (56, 256) and bottom surfaces of the shallow trench isolation spacers 66. The thickness of the source region (34S, 234S) and the drain region (34D, 234D) may be in a range from 50 nm to 1,000 nm, although lesser and greater thicknesses may also be employed. A single crystalline semiconductor material portions having a doping of the first conductivity type is located within the base semiconductor portion 30B in the first device region 100. Each interface between the source and drain regions (34S, 34D) and the single crystalline semiconductor material portion within the base semiconductor portion 30B in a first device region 100 comprises a p-n junction that includes a horizontal plane and a non-horizontal peripheral interface.

Generally, a source region 34S and a drain region 34D can be formed within upper portions of the base semiconductor portion 30B by doping regions of the base semiconductor portion 30B that underlies the pair of top horizontal surfaces 31 with dopants of the second conductivity type that is an opposite of the first conductivity type in each first device region 100. Each doped extension region (32S, 32D) is adjoined to a respective one of the source region 34S and the drain region 34D upon formation of the source region 34S and the drain region 34D in the first device region 100.

Figure 7A:
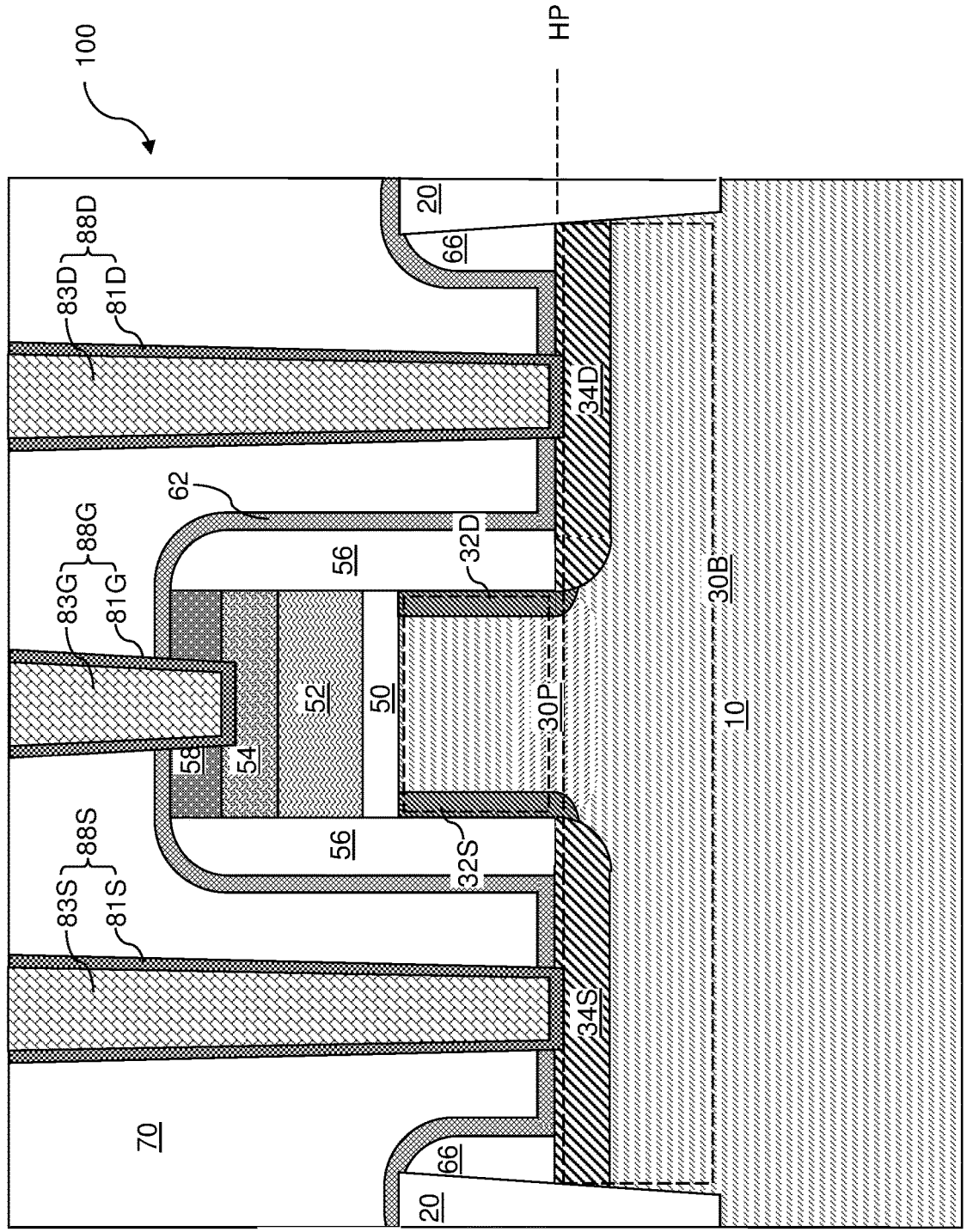
FIG. 7A is a vertical cross-sectional view of the first device region of the first exemplary structure after formation of a planarization dielectric layer and contact via structures according to an embodiment of the present disclosure.
Figure 7B:
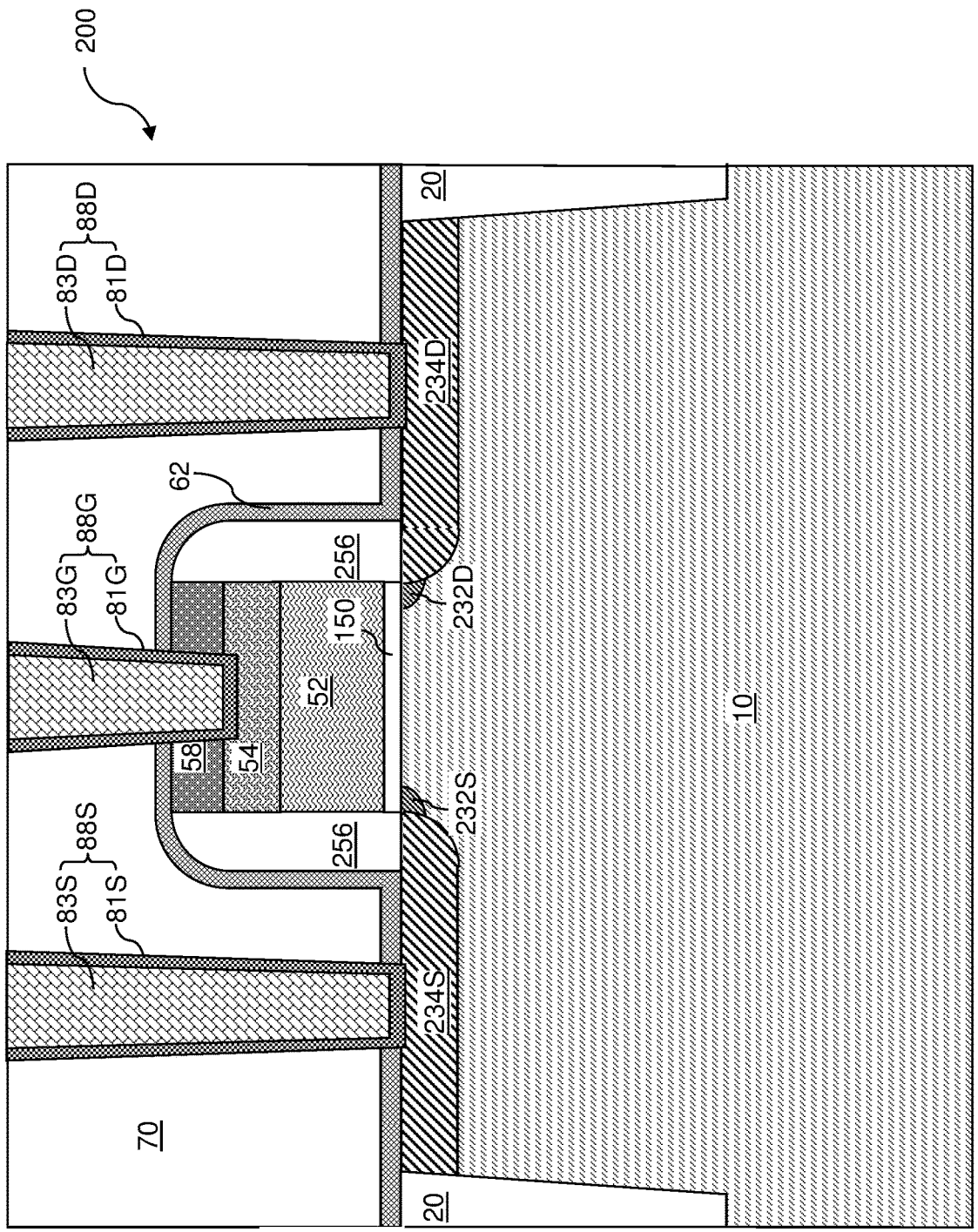
FIG. 7B is a vertical cross-sectional view of the second device region of the first exemplary structure after formation of a planarization dielectric layer and contact via structures according to an embodiment of the present disclosure.
Figure 7C:
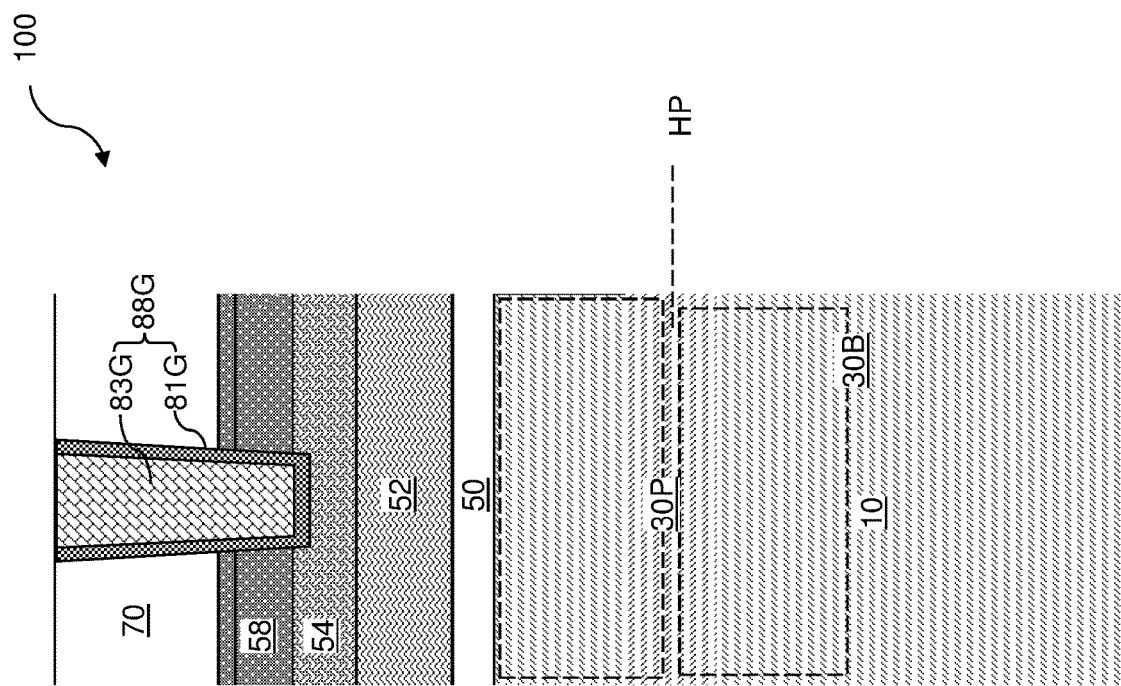
FIG. 7C is a vertical cross-sectional view of the first device region of the first exemplary structure of FIG. 7A along a direction that is parallel to a lengthwise direction of the first gate stack structure according to an embodiment of the present disclosure.

Referring to FIGS. 7A-7C, a dielectric liner 62 can be conformally deposited over the top surface of each source region (34S, 234S), the top surface of each drain region (34D, 234D), an outer sidewall of each dielectric gate spacer (56, 256), and a top surface of each gate stack structure (50, 250, 52, 54, 58). The dielectric liner 62 can include a dielectric diffusion barrier material, such as silicon nitride. In one embodiment, the dielectric liner 62 may include a stress-inducing silicon nitride material that can induce tensile stress or compress stress in the channel regions, i.e., portions of the semiconductor substrate 10 that underlie a gate dielectric (50 or 250). The dielectric liner 62 can be deposited by a conformal deposition process such as a chemical vapor deposition process. The thickness of the dielectric liner 62 can be in a range from 5 nm to 100 nm, such as from 10 nm to 50 nm, although lesser and greater thicknesses may also be employed.

A planarization dielectric layer 70 can be formed over the dielectric liner 62. The planarization dielectric layer 70 can include a self-planarizing dielectric material such as flowable oxide (FOX) or a planarizable dielectric material such as undoped silicate glass or a doped silicate glass. In case the planarization dielectric layer 70 includes undoped silicate glass or a doped silicate glass, a top surface of the planarization dielectric layer 70 can be planarized by performing a chemical mechanical planarization process. The top surface of the planarization dielectric layer 70 may be vertically spaced above the topmost surface of the dielectric liner 62 by a vertical distance in a range from 100 nm to 1,000 nm, such as from 200 nm to 500 nm, although lesser and greater vertical spacings may also be employed.

Via cavities can be formed through the planarization dielectric layer 70 and the dielectric liner 62 on each of the source regions (34S, 234S), the drain regions (34D, 234D), and the gate electrodes (52, 54). For example, a photoresist layer (not shown) can be applied over the planarization dielectric layer 70, and can be lithographically patterned to form discrete openings in areas that overlie the source regions, the drain regions, and the gate electrodes (52, 54). An anisotropic etch process can be performed to transfer the pattern of the openings in the photoresist layer through the planarization dielectric layer 70 and the dielectric liner 62. Surfaces of the source regions, the drain regions, and the gate electrodes (52, 54) are physically exposed underneath the via cavities. The photoresist layer can be subsequently removed, for example, by ashing.

At least one conductive material can be deposited in the via cavities to form various contact via structures (88S, 88D, 88G). For example, a metallic liner (such as a conductive metal nitride liner including TiN, TaN, or WN) and a metallic fill material (such as W, Ti, Co, Cu, Ru, or Al) may be sequentially deposited in the via cavities, and excess portions of the metallic liner and the metallic fill material can be removed from above the planarization dielectric layer 70 by a planarization process such as chemical mechanical planarization or a recess etch. Each contiguous set of remaining conductive material portions constitutes a contact via structure (88S, 88D, or 88G). For example, the contact via structures (88S, 88D, 88G) can include a source contact via structure 88S (i.e., source electrode) that includes a source metallic liner 81S and a source metallic fill material portion 83S, a drain contact via structure 88D (i.e., drain electrode) that includes a drain metallic liner 81D and a drain metallic fill material portion 83D, and a gate contact via structure 88G (i.e., gate contact) that includes a gate metallic liner 81G and a gate metallic fill material portion 83G. The source contact via structure 88S contacts a top surface of a source region (34S, 234S), the drain contact via structure 88D contacts a top surface of a drain region (34D, 234D), and a gate contact via structure 88G contacts a top surface of a gate electrode (52, 54).

Figure 8A:
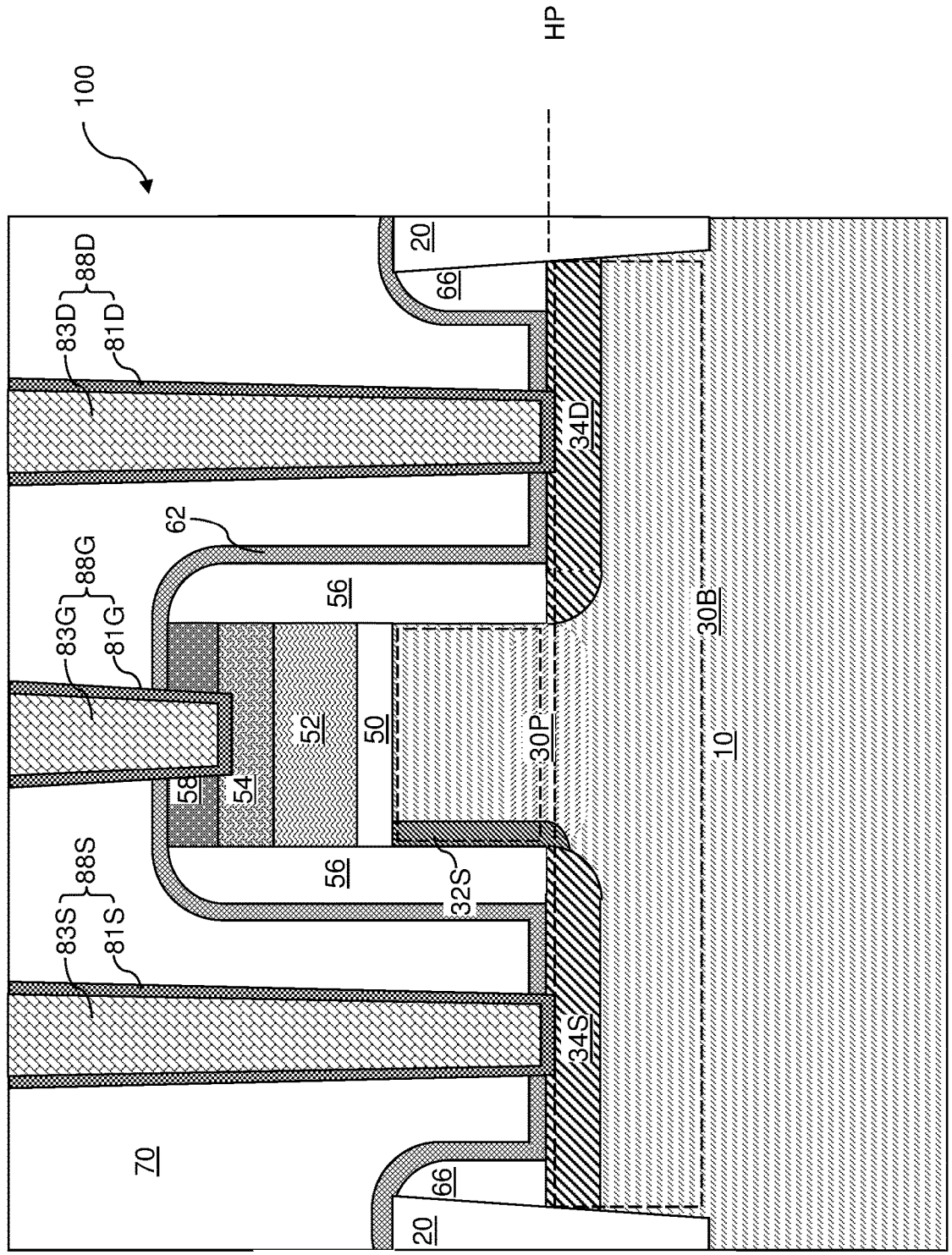
FIG. 8A is a vertical cross-sectional view of a first alternative configuration of the first device region of the first exemplary structure according to an embodiment of the present disclosure.

Referring to FIG. 8A, a first alternative configuration of the first device region 100 of the first exemplary structure can be derived from the first device region 100 of the first exemplary structure by omitting formation of a drain extension region 32D at the processing steps of FIGS. 5A and 5B. For example, the first device region 100 can be tilted such that implanted ions of the second conductivity type are implanted only on the side of the source-side cavity 29S and not on the side of the drain-side cavity 29D. The tilt angle of the direction of the implanted ions relative to the vertical direction of the first exemplary structure may be in a range from 20 degrees to 80 degrees, such as from 30 degrees to 60 degrees, although lesser and greater tilt angles can also be employed. In this case, a sidewall of a single crystalline semiconductor material portion in the pedestal semiconductor portion 30P can contact an inner sidewall of the first dielectric gate spacer 56 in the first device region 100.

Figure 8B:
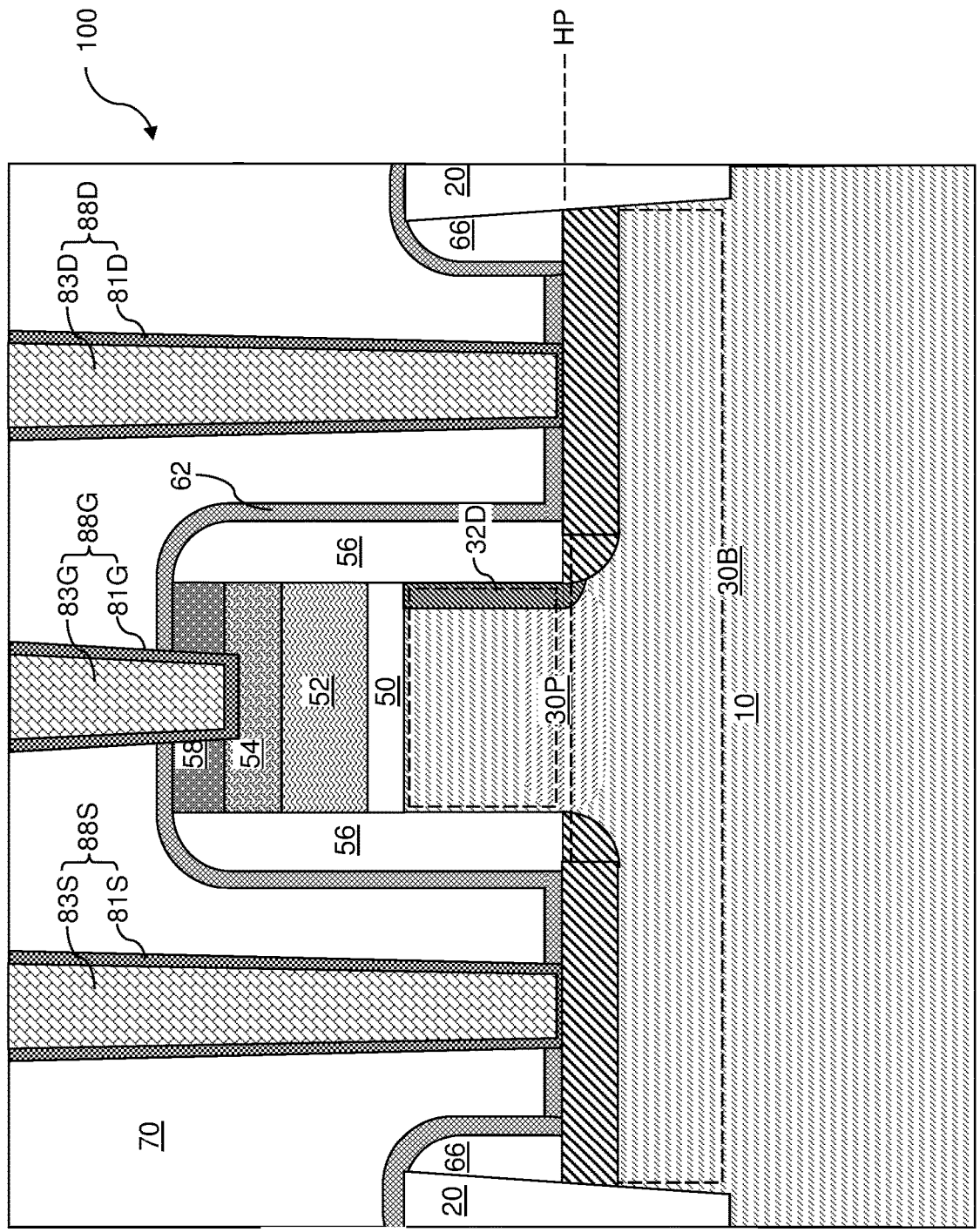
FIG. 8B is a vertical cross-sectional view of a second alternative configuration of the first device region of the first exemplary structure according to an embodiment of the present disclosure.

Referring to FIG. 8B, a second alternative configuration of the first device region 100 of the first exemplary structure can be derived from the first device region 100 of the first exemplary structure by omitting formation of a source extension region 32S at the processing steps of FIGS. 5A and 5B. For example, the first device region 100 can be tilted such that implanted ions of the second conductivity type are implanted only on the side of the drain-side cavity 29D and not on the side of the source-side cavity 29S. The tilt angle of the direction of the implanted ions relative to the vertical direction of the first exemplary structure may be in a range from 20 degrees to 80 degrees, such as from 30 degrees to 60 degrees, although lesser and greater tilt angles can also be employed. In this case, a sidewall of a single crystalline semiconductor material portion in the pedestal semiconductor portion 30P can contact an inner sidewall of the first dielectric gate spacer 56 in the first device region 100.

Figure 8C:
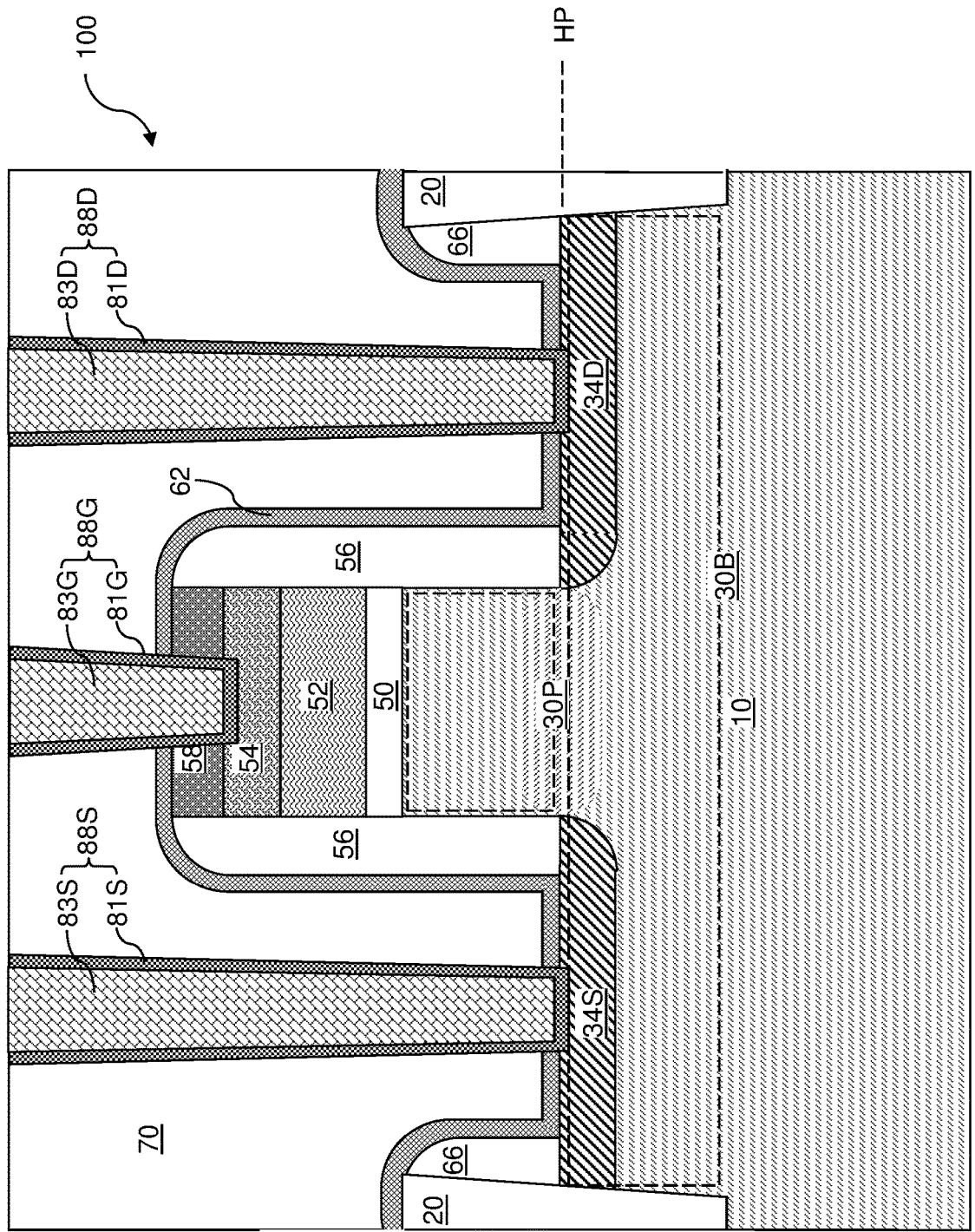
FIG. 8C is a vertical cross-sectional view of a third alternative configuration of the first device region of the first exemplary structure according to an embodiment of the present disclosure.

Referring to FIG. 8C, a third alternative configuration of the first device region 100 of the first exemplary structure can be derived from the first device region 100 of the first exemplary structure by omitting formation of a source extension region 32S and a drain extension region 32D at the processing steps of FIGS. 5A and 5B. In this case, the first device region 100 can be covered with an ion implantation mask (such as a patterned photoresist layer) during formation of a source extension region 232S and a drain extension region 232D in the second device region 200. In this case, a pair of sidewalls of a single crystalline semiconductor material portion in the pedestal semiconductor portion 30P can contact a pair of inner sidewalls of the first dielectric gate spacer 56 in the first device region 100.

Figure 9A:
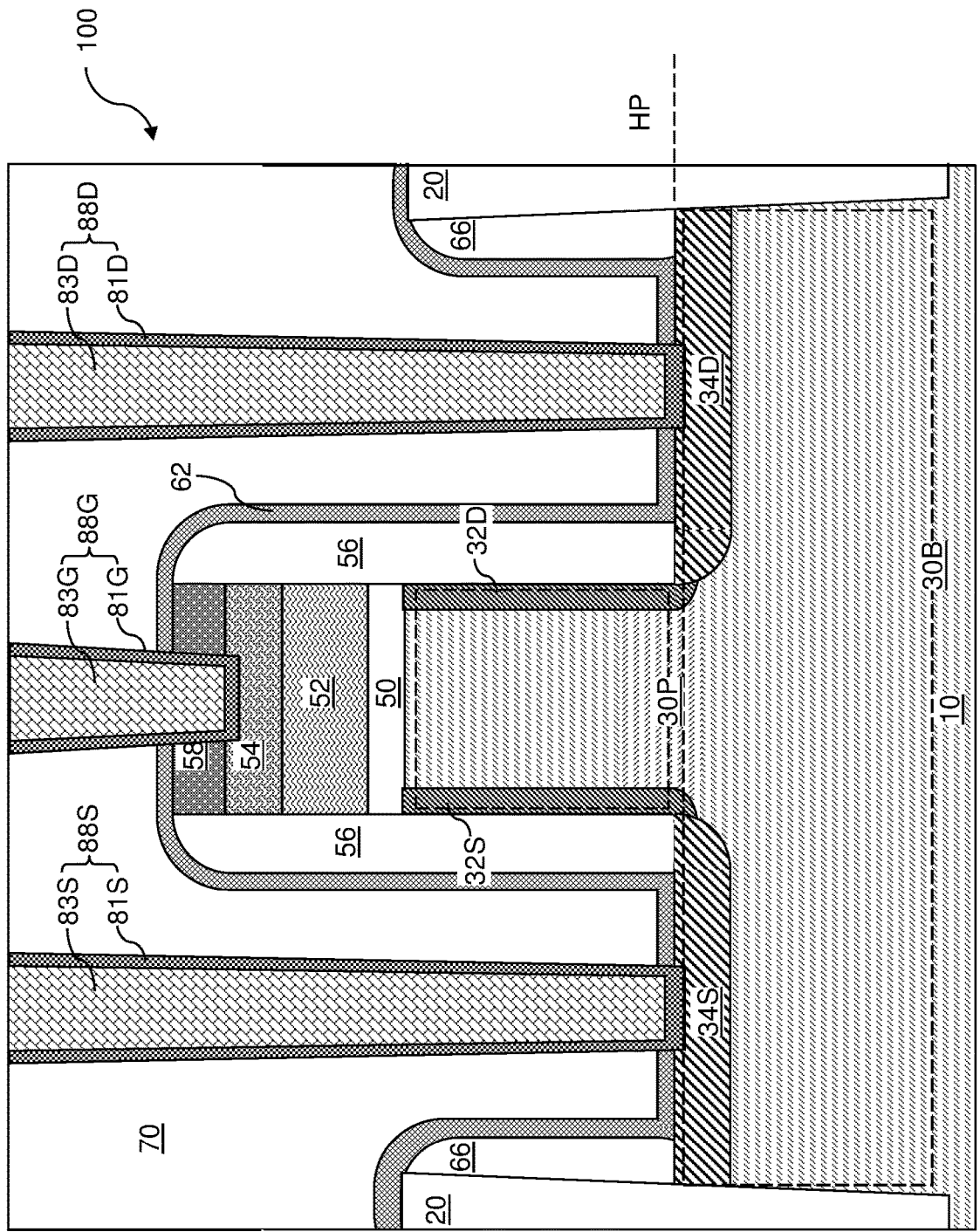
FIG. 9A is a vertical cross-sectional view of a fourth alternative configuration of the first device region of the first exemplary structure according to an embodiment of the present disclosure.

Referring to FIG. 9A, a fourth alternative configuration of the first device region 100 of the first exemplary structure can be derived from the first device region 100 illustrated in FIGS. 7A-7C by increasing the depth of the source-side cavity 29S and the drain-side cavity 29D at the processing steps of FIGS. 5A and 5B. In one embodiment, a vertical distance between the horizontal interface between the first gate dielectric 50 and the pedestal semiconductor portion 30P and the horizontal plane HP including the pair of top horizontal surfaces 31 of the base semiconductor portion 30B can be in a range from 500 nm to 2 microns, and may be in a range from 600 nm to 900 nm, although lesser and greater vertical distances may also be employed.

Figure 9B:
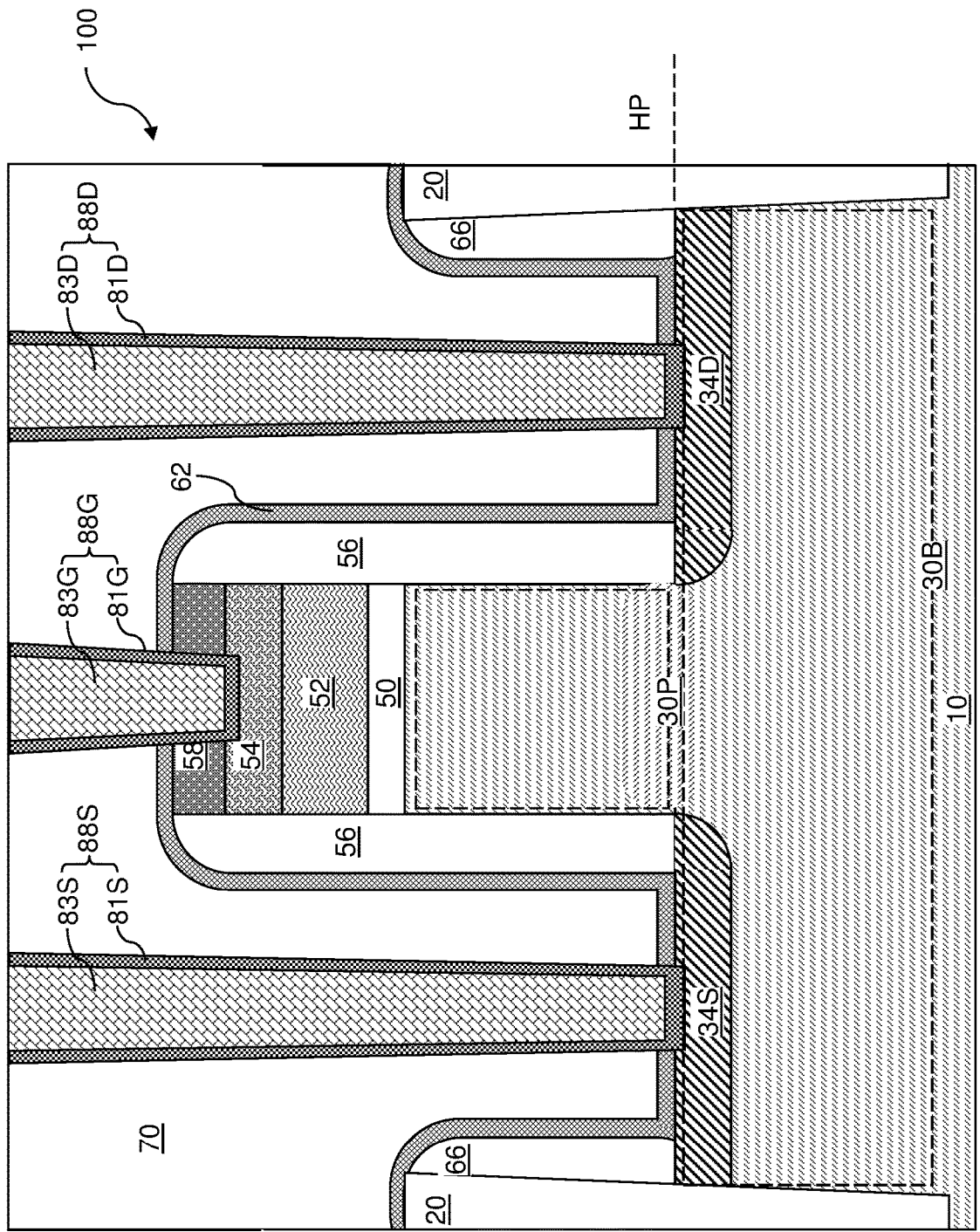
FIG. 9B is a vertical cross-sectional view of a fifth alternative configuration of the first device region of the first exemplary structure according to an embodiment of the present disclosure.

Referring to FIG. 9B, a fifth alternative configuration of the first device region 100 of the first exemplary structure by omitting formation of at least one doped extension region (32S, 32D). In one embodiment, the source extension region 32S and the drain extension region 32D can be omitted from the first device region 100. In one embodiment, the source extension region 32S may be omitted, and the drain extension region 32D may be present. In one embodiment, the source extension region 32S may be present, and the drain extension region 32D may be omitted.

Referring to FIGS. 1A-9B and according to various embodiments of the present disclosure, a semiconductor structure is provided, which comprises: a shallow trench isolation structure 20 comprising a dielectric material embedded within a semiconductor material layer (e.g., a well in or an epitaxial layer in the semiconductor substrate 10) and laterally surrounding an upper portion of the semiconductor material layer, wherein the upper portion of the semiconductor material layer comprises a base semiconductor portion 30B comprising a pair of top horizontal surfaces 31 and a pedestal semiconductor portion 30P located between the pair of top horizontal surfaces 31 and vertically protruding above a horizontal plane HP including the pair of top horizontal surfaces; a gate stack structure (50, 52, 54, 58) comprising a gate dielectric 50 and a gate electrode (52, 54) and including a pair of sidewalls that are vertically coincident with a pair of sidewalls of the pedestal semiconductor portion 30P; a dielectric gate spacer 56 contacting the pair of sidewalls of the gate stack structure (50, 52, 54, 58) and the pair of sidewalls of the pedestal semiconductor portion 30P; and a source region 34S and a drain region 34D located within the base semiconductor portion 30B and having a respective top surface located within the horizontal plane HP including the pair of top horizontal surfaces of the base semiconductor portion 30B.

In one embodiment, a horizontal interface between the gate dielectric 50 and the pedestal semiconductor portion 30P is located above the horizontal plane HP including the pair of top horizontal surfaces 31 of the base semiconductor portion 30B. In one embodiment, a vertical distance between the horizontal interface between the gate dielectric 50 and the pedestal semiconductor portion 30P and the horizontal plane HP including the pair of top horizontal surfaces 31 of the base semiconductor portion 30B is in a range from 100 nm to 2 microns.

In one embodiment, the semiconductor structure comprises a shallow trench isolation spacer 66 that comprises a same insulating material as the dielectric gate spacer 56, adjoined to the dielectric gate spacer 56, and contacts sidewalls of the shallow trench isolation structure 20 that are located above the horizontal plane HP including the pair of top horizontal surfaces 31 of the base semiconductor portion 30B.

In one embodiment, a top surface of the source region 34S contacts a bottom portion of a first segment of the dielectric gate spacer 56 within the horizontal plane HP including the pair of top horizontal surfaces 31 of the base semiconductor portion 30B; and a top surface of the drain region 34D contacts a bottom surface of a second segment of the dielectric gate spacer 56 within the horizontal plane HP including the pair of top horizontal surfaces 31 of the base semiconductor portion 30B. In one embodiment, a top periphery of the pedestal semiconductor portion 30P comprises: a pair of first edges that coincide with a pair of edges of the gate dielectric 50; and a pair of second edges that are adjoined to the shallow trench isolation structure 20. In one embodiment, the pair of top horizontal surfaces 31 of the base semiconductor portion 30B are adjoined to sidewalls of the shallow trench isolation structure 20.

In one embodiment, the semiconductor structure comprises: a dielectric liner 62 continuously extending over, and contacting, a top surface of the source region 34S, a top surface of the drain region 34D, an outer sidewall of the dielectric gate spacer 56, and a top surface of the gate stack structure (50, 52, 54, 58); a planarization dielectric layer 70 overlying the dielectric liner 62 and having a planar top surface; and contact via structures (88S, 88D, 88G) vertically extending through the planarization dielectric layer 70 and the dielectric liner 62 and contacting a respective one of the source region 34S, the drain region 34D, and the gate electrode (52, 54).

In one embodiment, the base semiconductor portion 30B comprises a first single crystalline semiconductor material portion having a doping of the first conductivity type; the source region 34S and the drain region 34D have a doping of a second conductivity type that is an opposite of the first conductivity type; and the pedestal semiconductor portion 30P consists of a second single crystalline semiconductor material portion having a doping of the first conductivity type as illustrated in FIGS. 8C and 9B. In one embodiment, the first single crystalline semiconductor material portion and the second single crystalline semiconductor material portion have a same material composition and are epitaxially aligned to each other.

In one embodiment, the base semiconductor portion 30B comprises a first single crystalline semiconductor material portion having a doping of the first conductivity type; the source region 34S and the drain region 34D have a doping of a second conductivity type that is an opposite of the first conductivity type; and the pedestal semiconductor portion 30P comprises of a second single crystalline semiconductor material portion having a doping of the first conductivity type and at least one doped extension region (32S, 32D) having a doping of the second conductivity type and adjoined to a respective one of the source region 34S and the drain region 34D as illustrated in FIGS. 7A, 8A, 8B, and 9A. In one embodiment, each of the at least one doped extension region (32S, 32D) has a uniform lateral width and contacts a surface segment of the dielectric gate spacer 56. In one embodiment, each interface between the at least one doped extension region (32S, 32D) and the second single crystalline semiconductor material portion (which has a doping of a first conductivity type and is located within the pedestal semiconductor portion 30P) comprises a p-n junction that is parallel to one of the pair of sidewalls of the pedestal semiconductor portion 30P and is adjoined to a bottom surface of the gate dielectric 50.

Figure 10A:
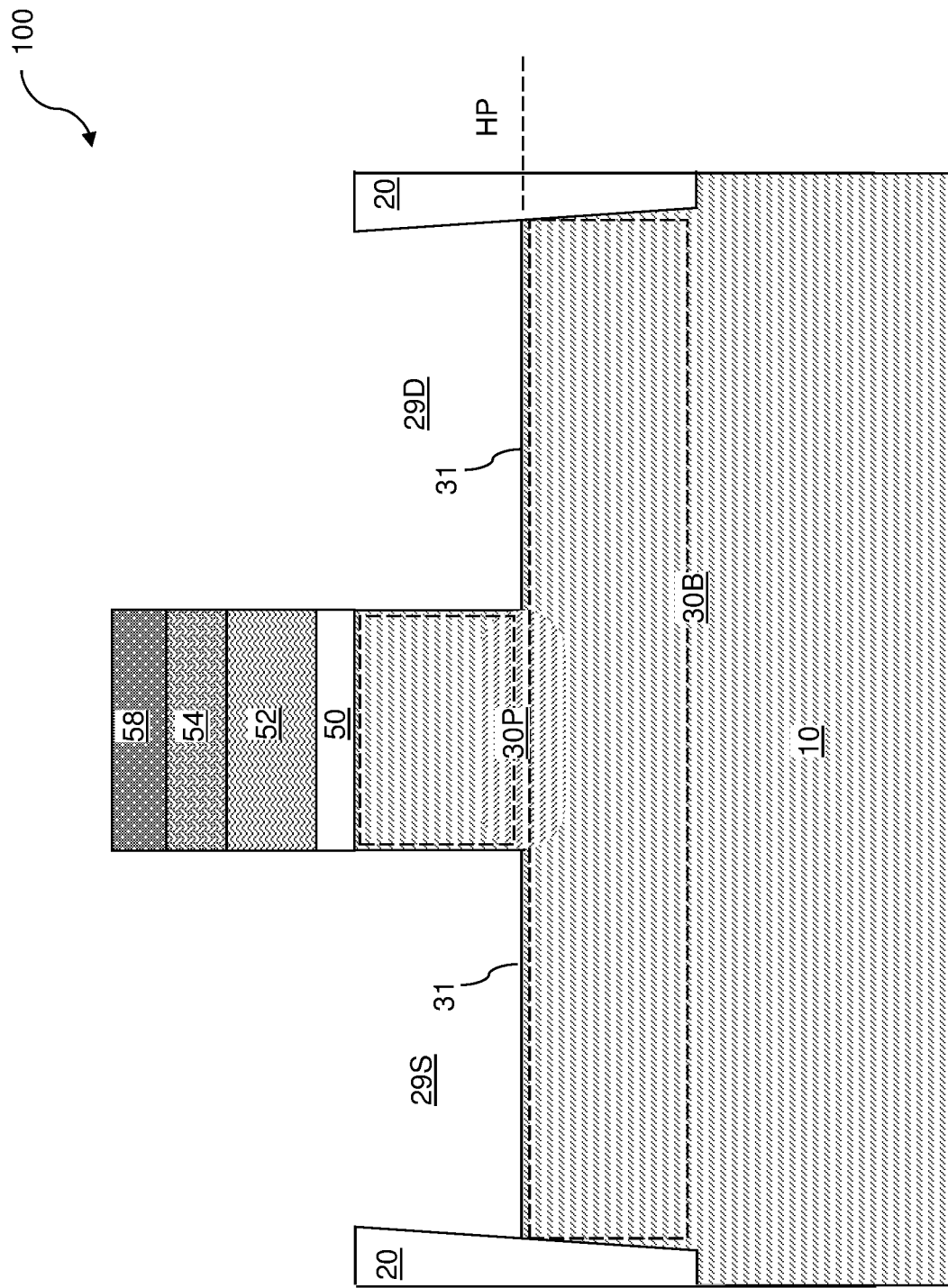
FIG. 10A is a vertical cross-sectional view of a first device region of a second exemplary structure after formation of a source-side cavity and a drain-side cavity in the first device region according to an embodiment of the present disclosure.
Figure 10B:
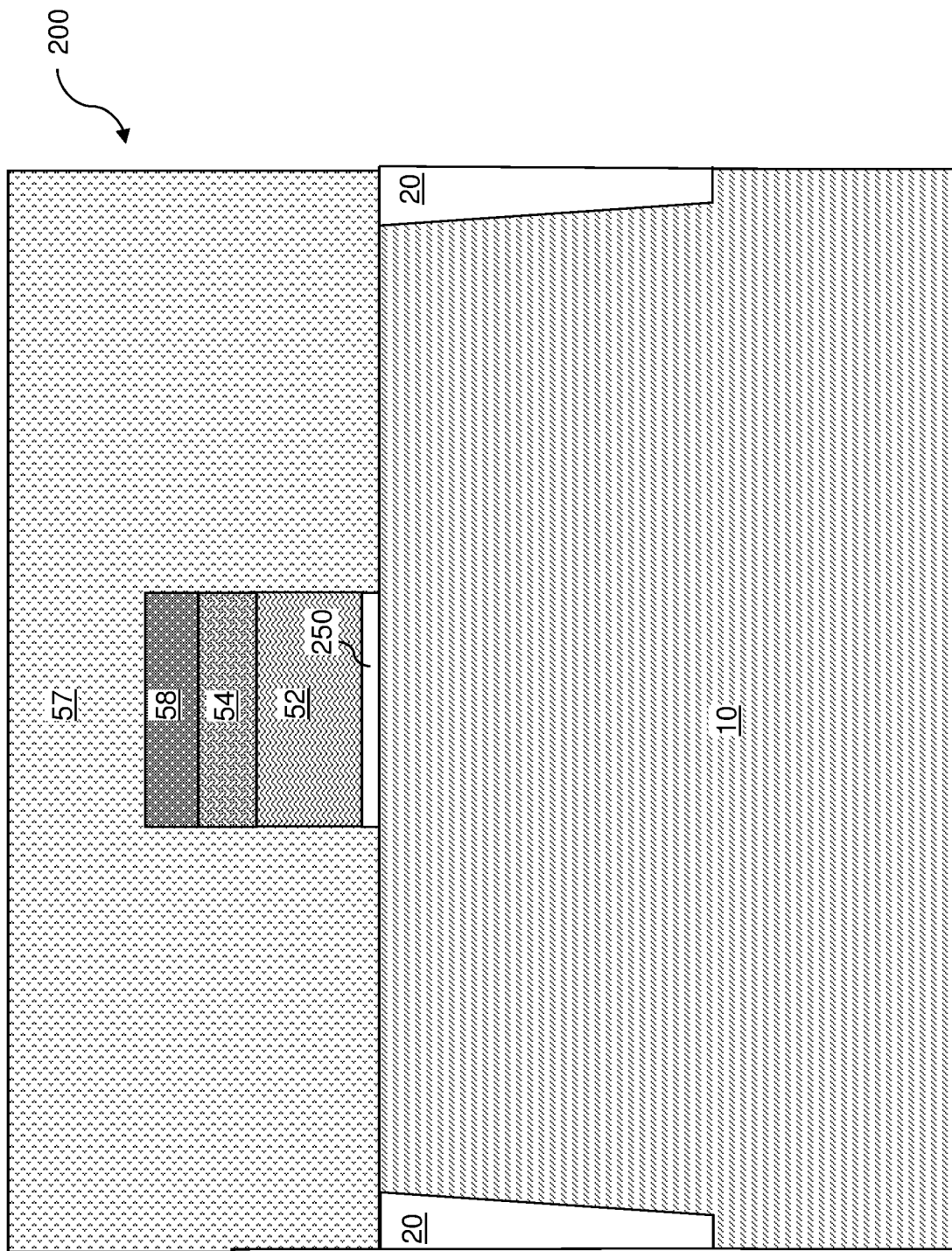
FIG. 10B is a vertical cross-sectional view of a second device region of a second exemplary structure after formation of a source-side cavity and a drain-side cavity in the first device region in the second device region according to an embodiment of the present disclosure.

Referring to FIGS. 10A and 10B, a second exemplary structure according to an embodiment of the present disclosure can be the same as the first exemplary structure illustrated in FIGS. 4A and 4B. Generally, the areas of the first device region 100 are vertically recessed employing the first gate stack structure (50, 52, 54, 58) as an etch mask. The pedestal semiconductor portion 30P comprises a pair of sidewalls that are vertically coincident with sidewalls of the first gate stack structure (50, 52, 54, 58).

Figure 11A:
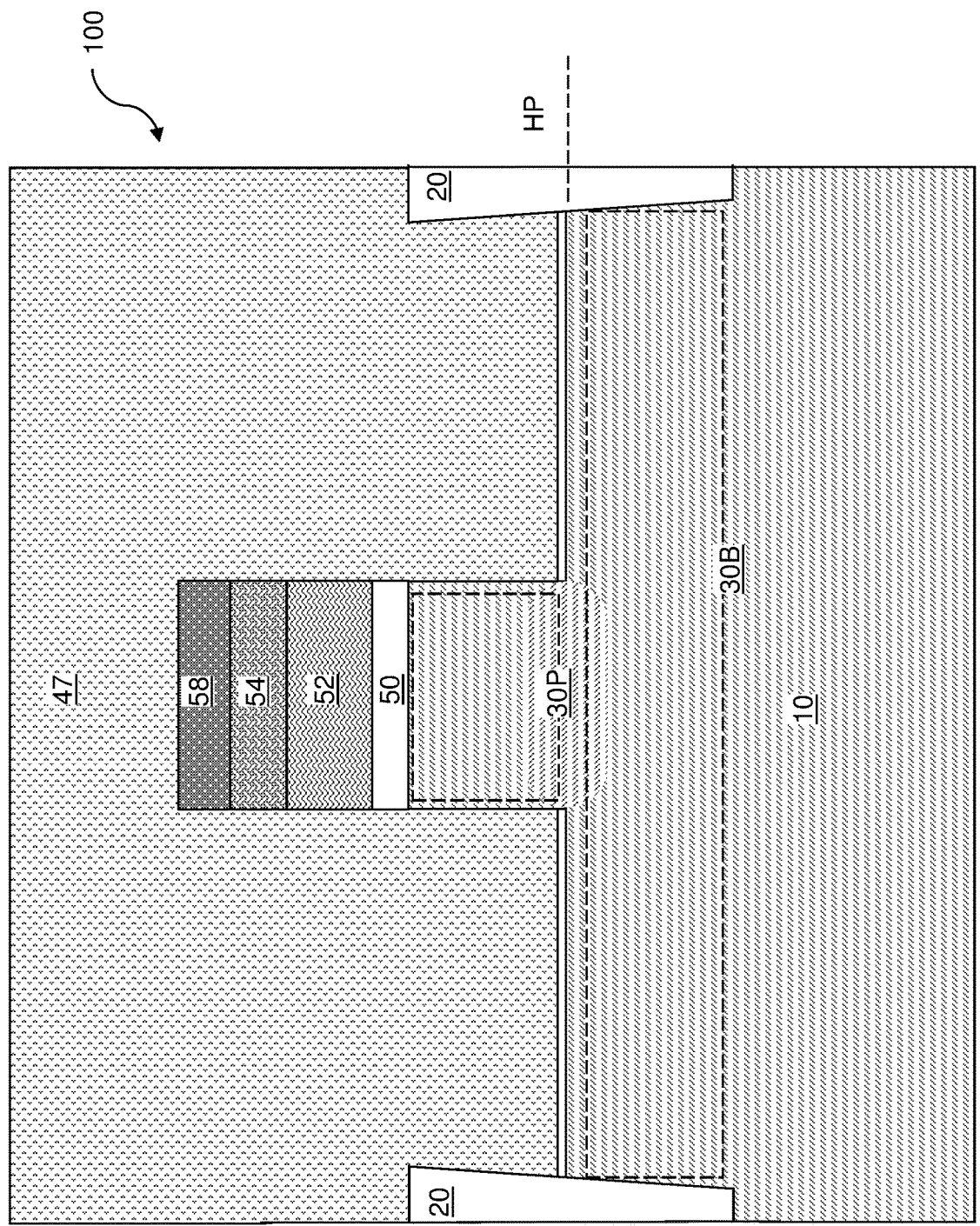
FIG. 11A is a vertical cross-sectional view of the first device region of the second exemplary structure after formation of a source extension region and a drain extension region in the second device region according to an embodiment of the present disclosure.
Figure 11B:
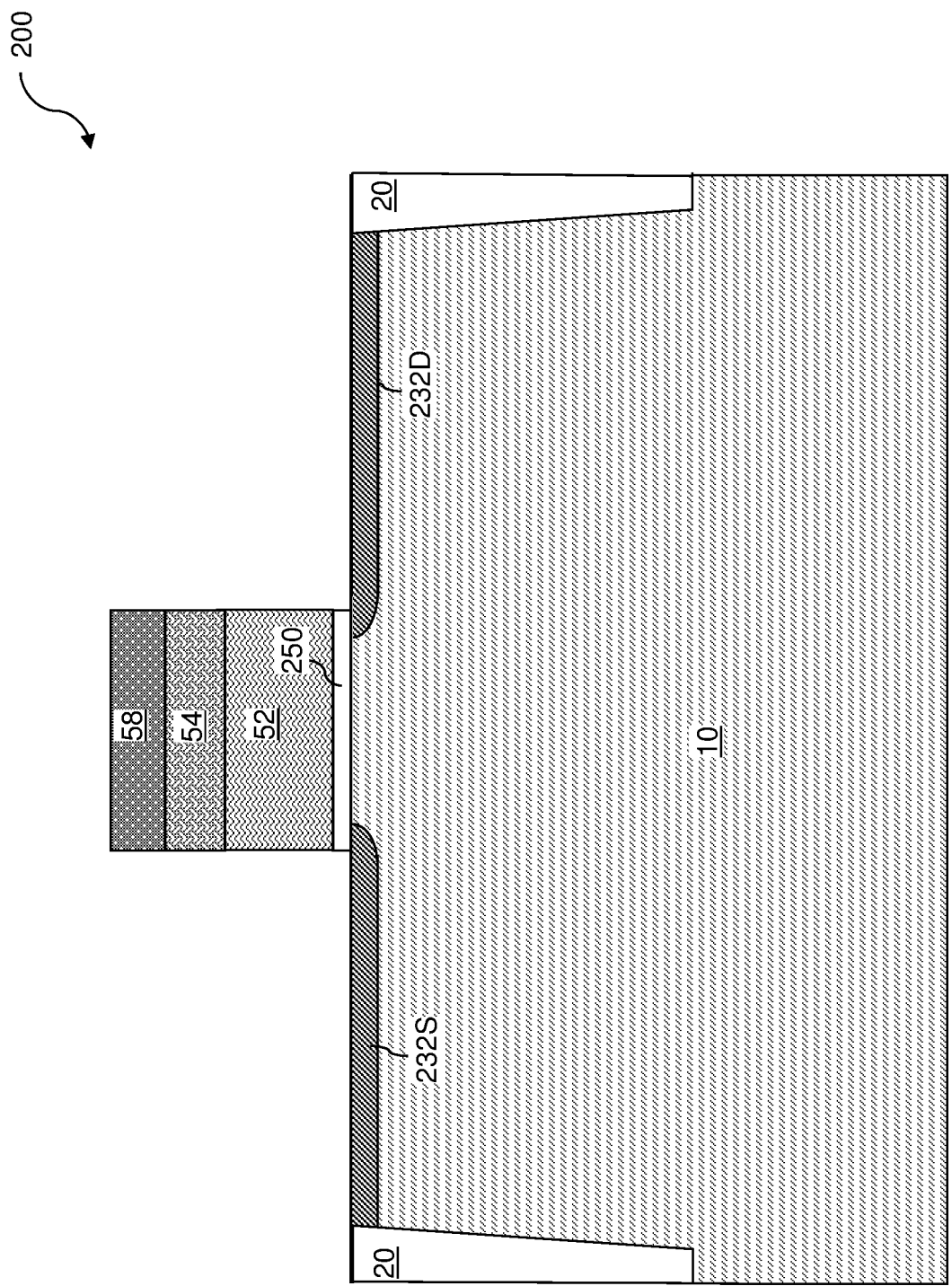
FIG. 11B is a vertical cross-sectional view of the second device region of the second exemplary structure after formation of a source extension region and a drain extension region in the second device region according to an embodiment of the present disclosure.

Referring to FIGS. 11A and 11B, a photoresist layer 47 can be applied over the second exemplary structure, and can be lithographically patterned to cover the first device region 100 without covering the second device region 200. Dopants of the second conductivity type can be implanted into unmasked surface portions of the semiconductor substrate 10 in the second device region 200 to form a source extension region 232S and a drain extension region 232D. The processing steps of FIGS. 5A and 5B may be performed while the patterned photoresist layer 47 covers the first device region 100 and prevents formation of any doped extension region in the first device region 100. Subsequently, the photoresist layer 47 can be removed, for example, by ashing.

Figure 6A:
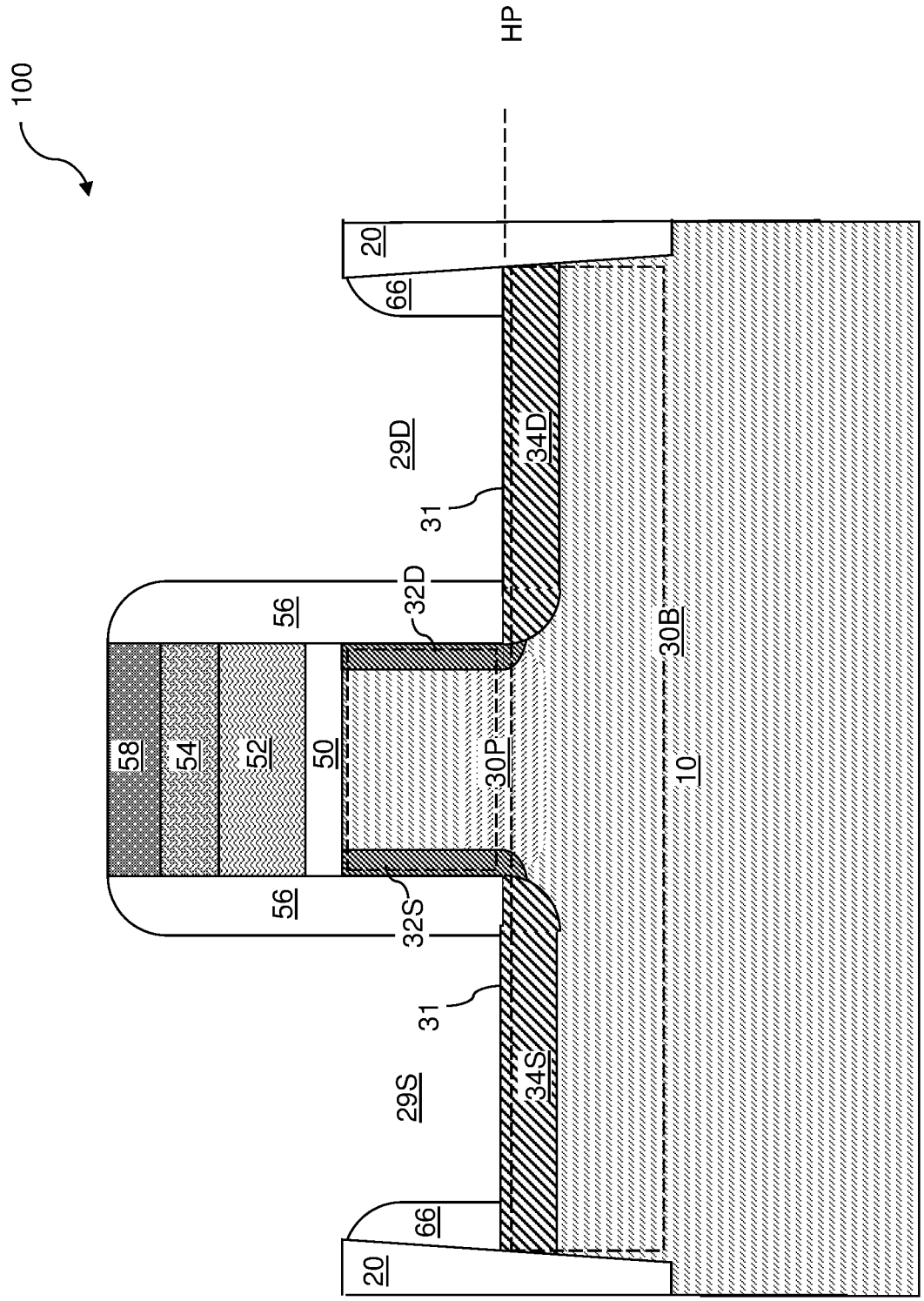
FIG. 6A is a vertical cross-sectional view of the first device region of the first exemplary structure after formation of dielectric gate spacers, shallow trench isolation spacers, source regions, and drain regions according to an embodiment of the present disclosure.
Figure 6B:
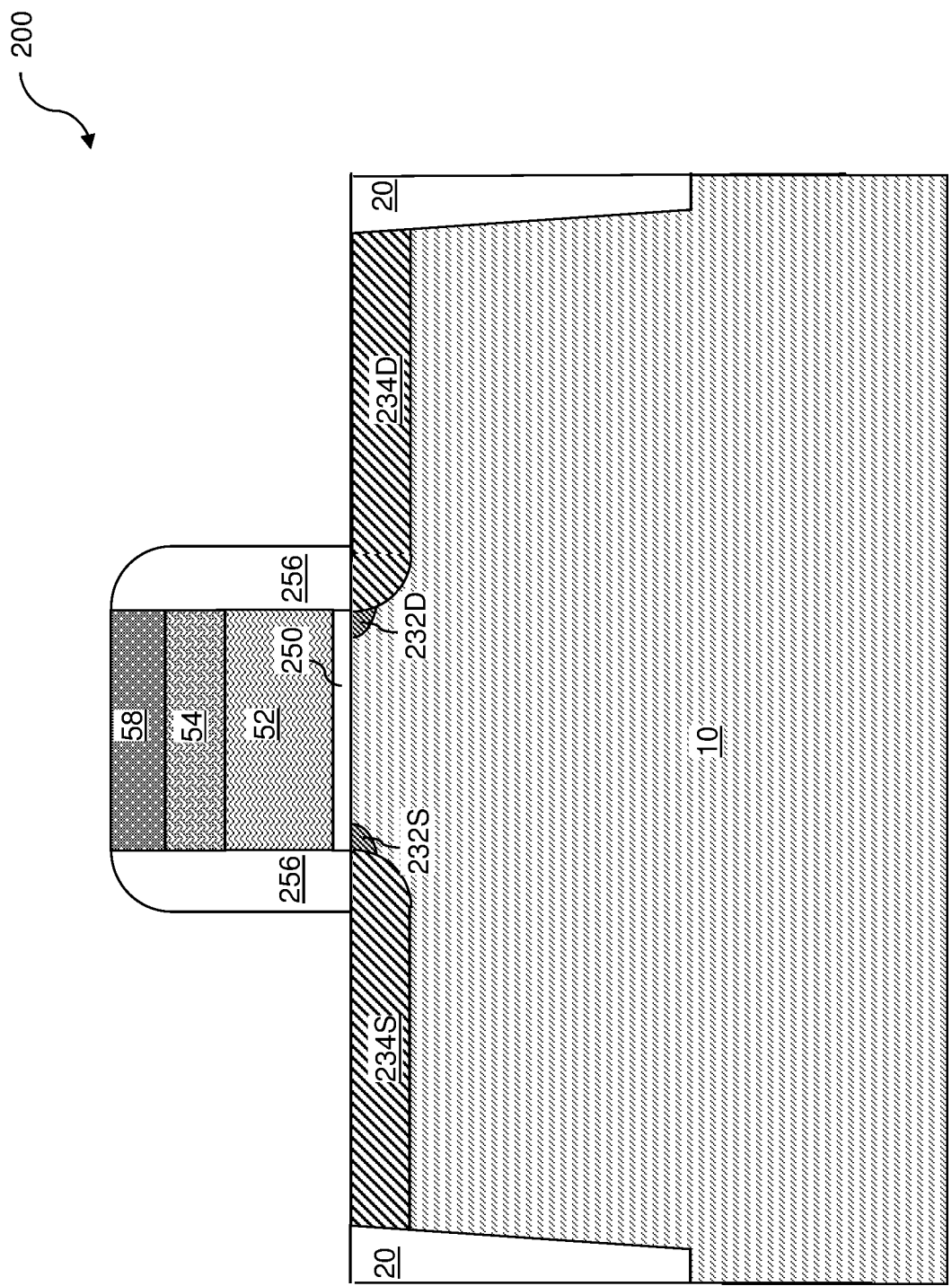
FIG. 6B is a vertical cross-sectional view of the second device region of the first exemplary structure after formation of dielectric gate spacers, shallow trench isolation spacers, source regions, and drain regions according to an embodiment of the present disclosure.
Figure 6C:
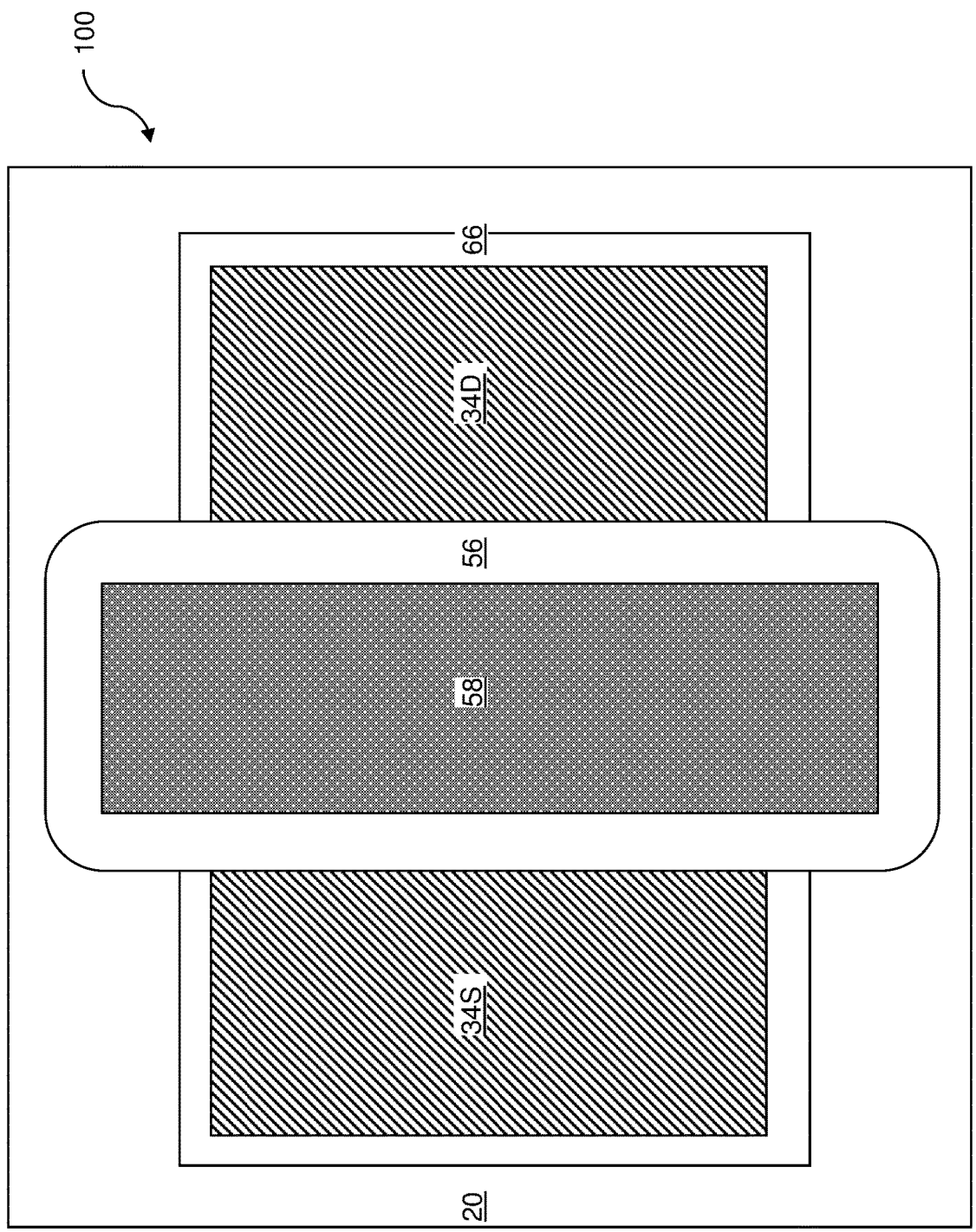
FIG. 6C is a top-down view of the first device region of the first exemplary structure of FIG. 6A.
Figure 6D:
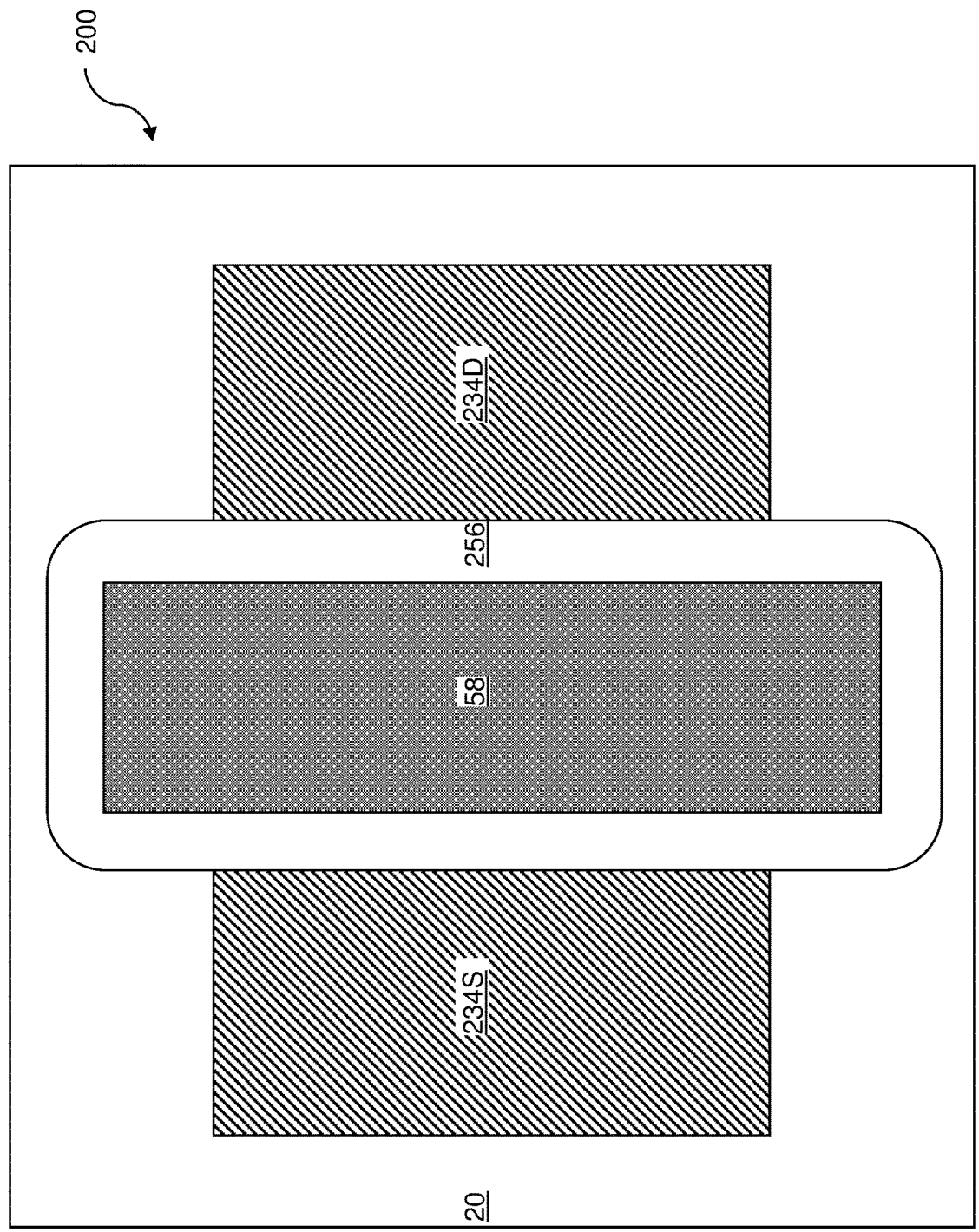
FIG. 6D is a top-down view of the second device region of the first exemplary structure of FIG. 6B.
Figure 12A:
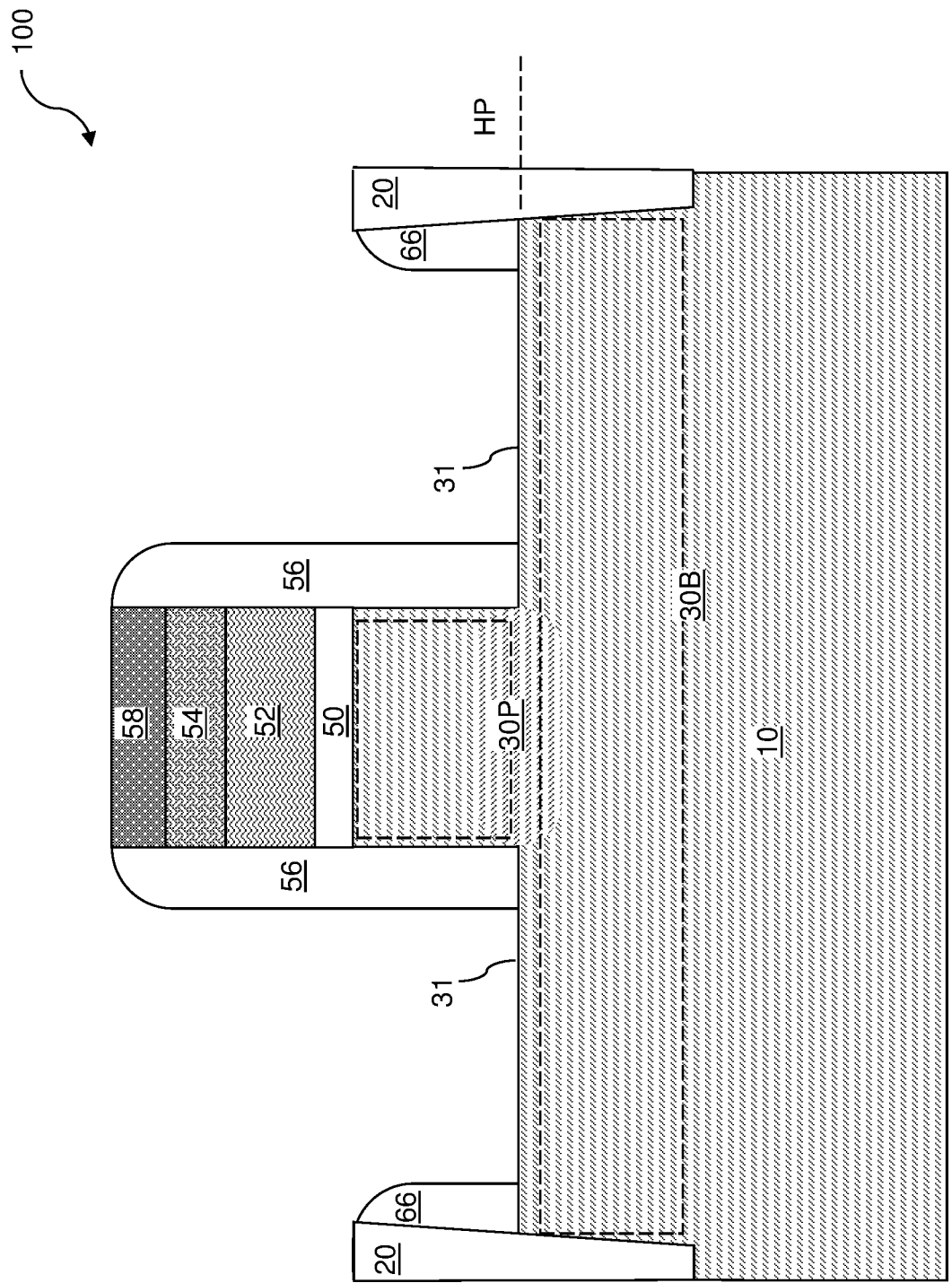
FIG. 12A is a vertical cross-sectional view of the first device region of the second exemplary structure after formation of a dielectric gate spacer and a shallow trench isolation spacer according to an embodiment of the present disclosure.
Figure 12B:
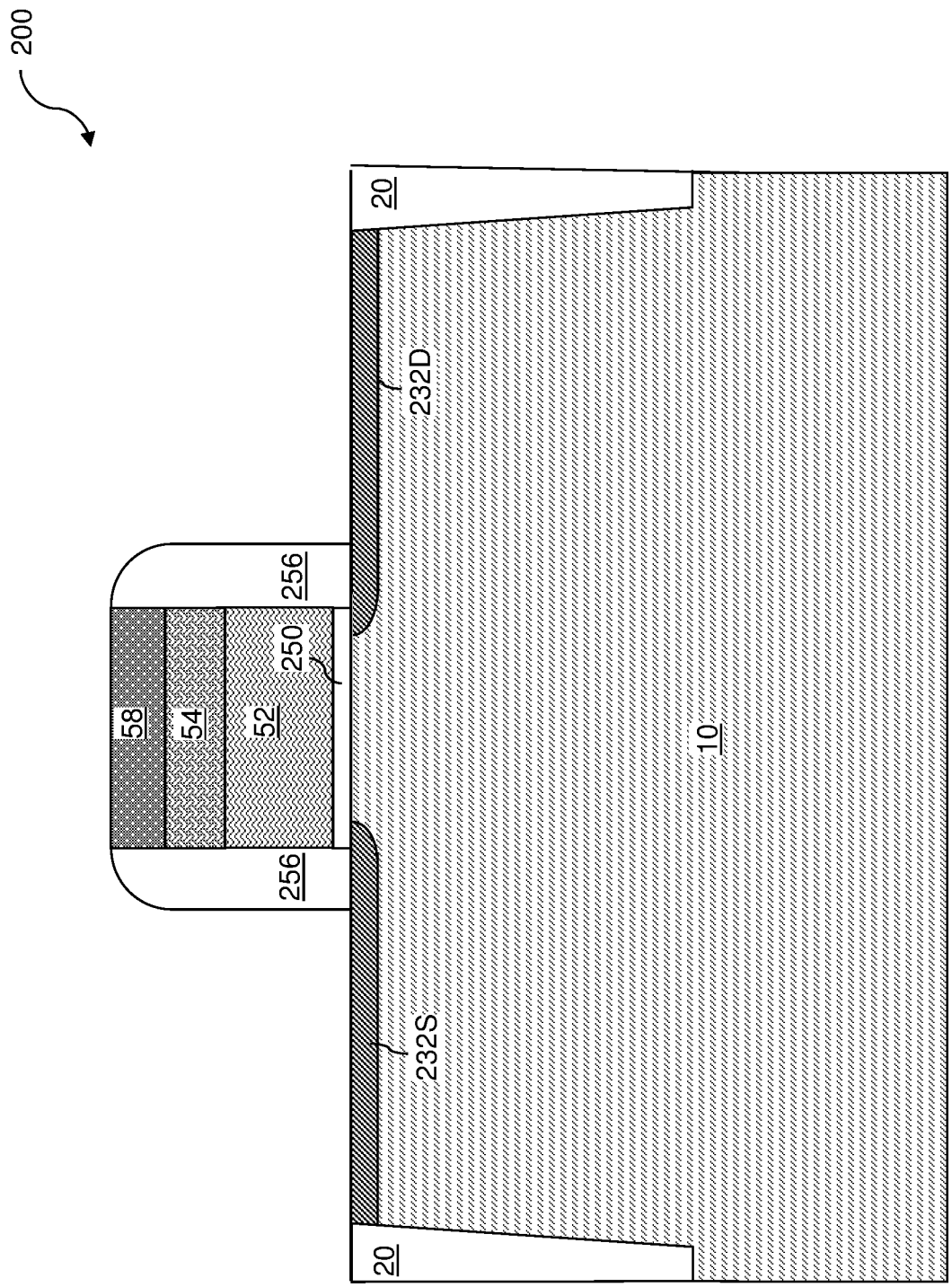
FIG. 12B is a vertical cross-sectional view of the second device region of the second exemplary structure after formation of a dielectric gate spacer and a shallow trench isolation spacer according to an embodiment of the present disclosure.

Referring to FIGS. 12A and 12B, the processing steps of FIGS. 6A and 6B can be performed to form dielectric gate spacers (56, 256) and shallow trench isolation spacers 66. For example, a conformal dielectric material layer including a dielectric material such as silicon oxide can be deposited, and can be subsequently etched by performing an anisotropic etch process, such as a reactive ion etch process. A first dielectric gate spacer 56 is formed around the first gate stack structure (50, 52, 54, 58) in the first device region 100, and a second dielectric gate spacer 256 is formed around the second gate stack structure (250, 52, 54, 58) in the second device region 200. The first dielectric gate spacer 56 can be formed on a pair of sidewalls of the first gate stack structure (50, 52, 54, 58) and on a pair of sidewalls of the pedestal semiconductor portion 30P that are vertically coincident with the pair of sidewalls of the first gate stack structure (50, 52, 54, 58). The width of the first dielectric gate spacer 56 and the second dielectric gate spacer 256 can be in a range from 20 nm to 400 nm, such as from 40 nm to 20 nm, although lesser and greater widths can also be employed.

A remaining portion of the conformal dielectric material layer in the first device region 100 comprises a first shallow trench isolation spacer 66 that comprises a same insulating material as the first dielectric gate spacer 56 and the second dielectric gate spacer 256. The first shallow trench isolation spacer 66 contacts sidewalls of the shallow trench isolation structure 20 and peripheral portions of the pair of top horizontal surfaces 31 of the base semiconductor portion 30B. The first shallow trench isolation spacer 66 is adjoined to the first dielectric gate spacer 56.

Figure 13A:
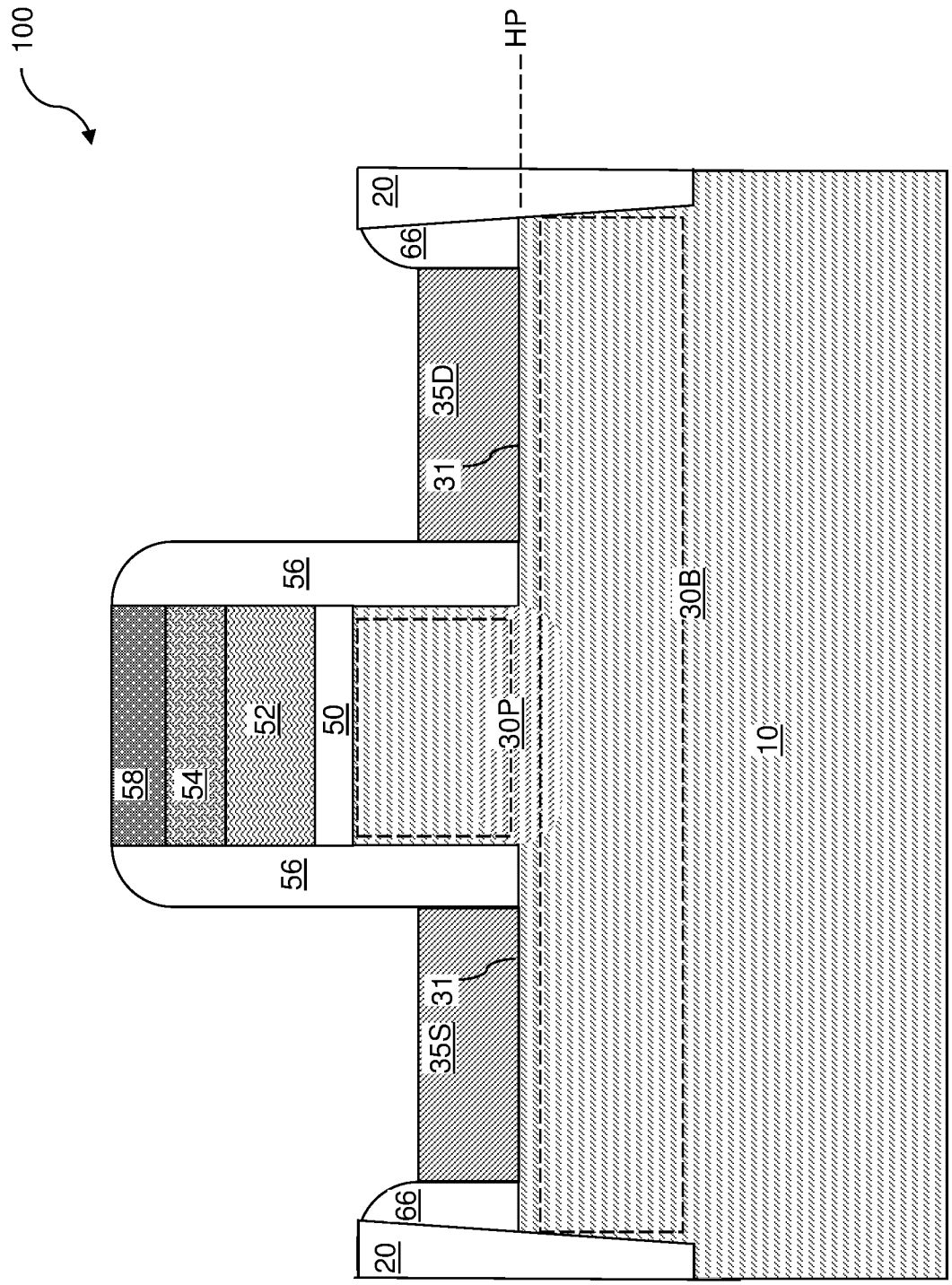
FIG. 13A is a vertical cross-sectional view of the first device region of the second exemplary structure after covering the second device region with a dielectric cover layer and formation of epitaxial semiconductor material portions according to an embodiment of the present disclosure.
Figure 13B:
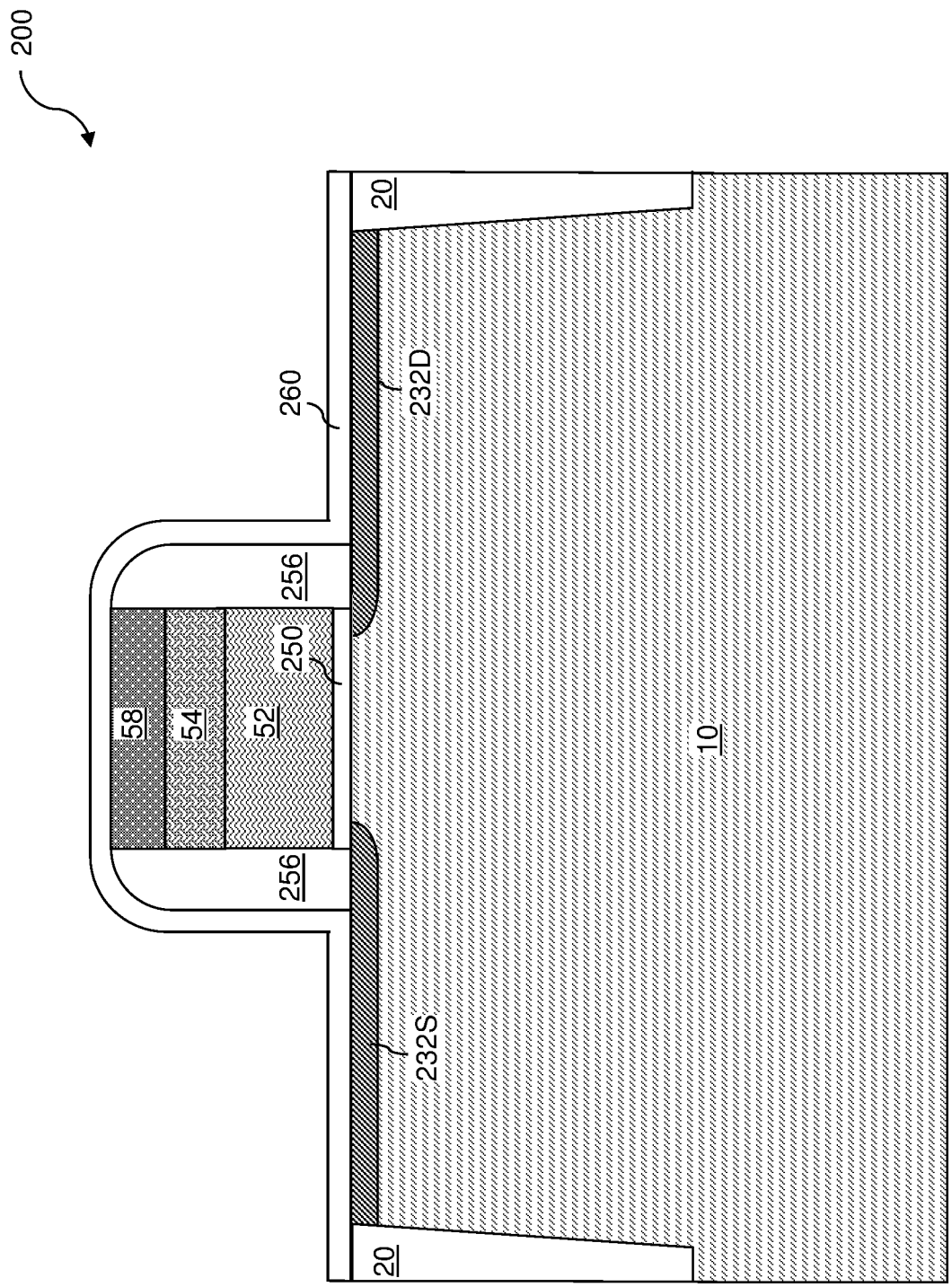
FIG. 13B is a vertical cross-sectional view of the second device region of the second exemplary structure after covering the second device region with a dielectric cover layer and formation of epitaxial semiconductor material portions according to an embodiment of the present disclosure.

Referring to FIGS. 13A and 13B, a dielectric cover layer 260 can be conformally deposited over the second exemplary structure, and can be lithographically patterned to cover the second device region 200 without covering the first device region 100. The dielectric cover layer 260 includes a dielectric material, such as silicon oxide or silicon nitride. The thickness of the dielectric cover layer 260 may be in a range from 10 nm to 50 nm, although lesser and greater thicknesses may also be employed.

A selective semiconductor deposition process can be performed to deposit a single crystalline or polycrystalline semiconductor material (e.g., single crystal silicon or polysilicon) from each physically exposed surface of the semiconductor substrate 10. Particularly, a single crystalline or polycrystalline semiconductor material is deposited on each physically exposed portion of the top horizontal surfaces 31 of the base semiconductor portion 30B in the first device region 100. The dielectric cover layer 260 prevents deposition of a semiconductor material over the second device region 200.

In one embodiment, the selective semiconductor deposition process may comprise a selective epitaxy process that grows single crystalline semiconductor materials from physically exposed semiconductor surfaces such as the physically exposed portions of the top horizontal surfaces 31 of the base semiconductor portion 30B in the first device region 100. In this case, the second exemplary structure can be placed within a vacuum enclosure of a selective epitaxy process chamber, and a precursor gas for depositing a semiconductor material and an etchant gas can be simultaneously or alternately flowed into the vacuum enclosure to effect the selective semiconductor deposition process. The precursor gas may include, for example, silane, disilane, dichlorosilane, trichlorosilane, germane, digermane, and/or other semiconductor precursor gases known in the art. The etchant gas may include, for example, gas phase hydrogen chloride. Epitaxial semiconductor material portions can grow from the physically exposed portions of the top horizontal surfaces 31 of the base semiconductor portion 30B in the first device region 100.

In one embodiment, a pair of epitaxial semiconductor material portions can be formed by growing a single crystalline semiconductor material (e.g., single crystal silicon) from the pair of top horizontal surfaces 31 of the base semiconductor portion 30B in the first device region 100. In one embodiment, the epitaxial semiconductor material portions can have a doping of an opposite conductivity type from that of the base semiconductor portion 30B, i.e., a doping of the second conductivity type. In this case, the single crystalline semiconductor material can be grown with in-situ doping with dopants of the second conductivity type. In one embodiment, the entirety of the base semiconductor portion 30B and the pedestal semiconductor portion 30P can have a doping of the first conductivity type during formation of the pair of epitaxial semiconductor material portions. The epitaxial semiconductor material portions can function as extensions of a body region, and are herein referred to as extension regions (35S, 35D). The extension regions (35S, 35D) include a source extension region 35S formed in the source-side cavity 29S, and a drain extension region 35D formed in the drain-side cavity 29D.

For example, each source extension region 35S and each drain extension region 35D can include dopants of a respective second conductivity type at an atomic concentration in a range from $1.0 \times 10^{17}/cm^3$ to $1.0 \times 10^{20}/cm^3$, such as from $1.0 \times 10^{18}/cm^3$ to $1.0 \times 10^{19}/cm^3$, although lesser and greater atomic concentrations can also be employed.

The semiconductor material of the extension regions (35S, 35D) (i.e., the material composition excluding dopants) may be the same as, or may be different, from the semiconductor material of the base semiconductor portion 30B. For example, if the base semiconductor portion 30B is a single crystalline silicon portion having a doping of the first conductivity type, the extension regions (35S, 35D) may be a single crystalline silicon portion having a doping of the second conductivity type or a single crystalline silicon-germanium portion having a doping of the second conductivity type. The single crystalline semiconductor material of the extension regions (35S, 35D) can be epitaxially aligned to the single crystalline semiconductor material of the base semiconductor portion 30B.

The thickness of the extension regions (35S, 35D) (i.e., the vertical distance between the top surface and the bottom surface of each of the extension regions (35S, 35D)) may be the same as, greater than, or less than, the height of the sidewalls of the pedestal semiconductor portion 30P that contact the first dielectric gate spacer 56. In one embodiment, the thickness of the extension regions (35S, 35D) may be in a range from 50 nm to 1,000 nm, such as from 300 nm to 500 nm, although lesser and greater vertical distances may also be employed. In one embodiment, top surfaces of the extension regions (35S, 35D) can be located below the horizontal plane including the top surface of the shallow trench isolation structure 20. The dielectric cover layer 260 can be subsequently removed, for example, by an isotropic etch process such as a wet etch process.

Figure 14A:
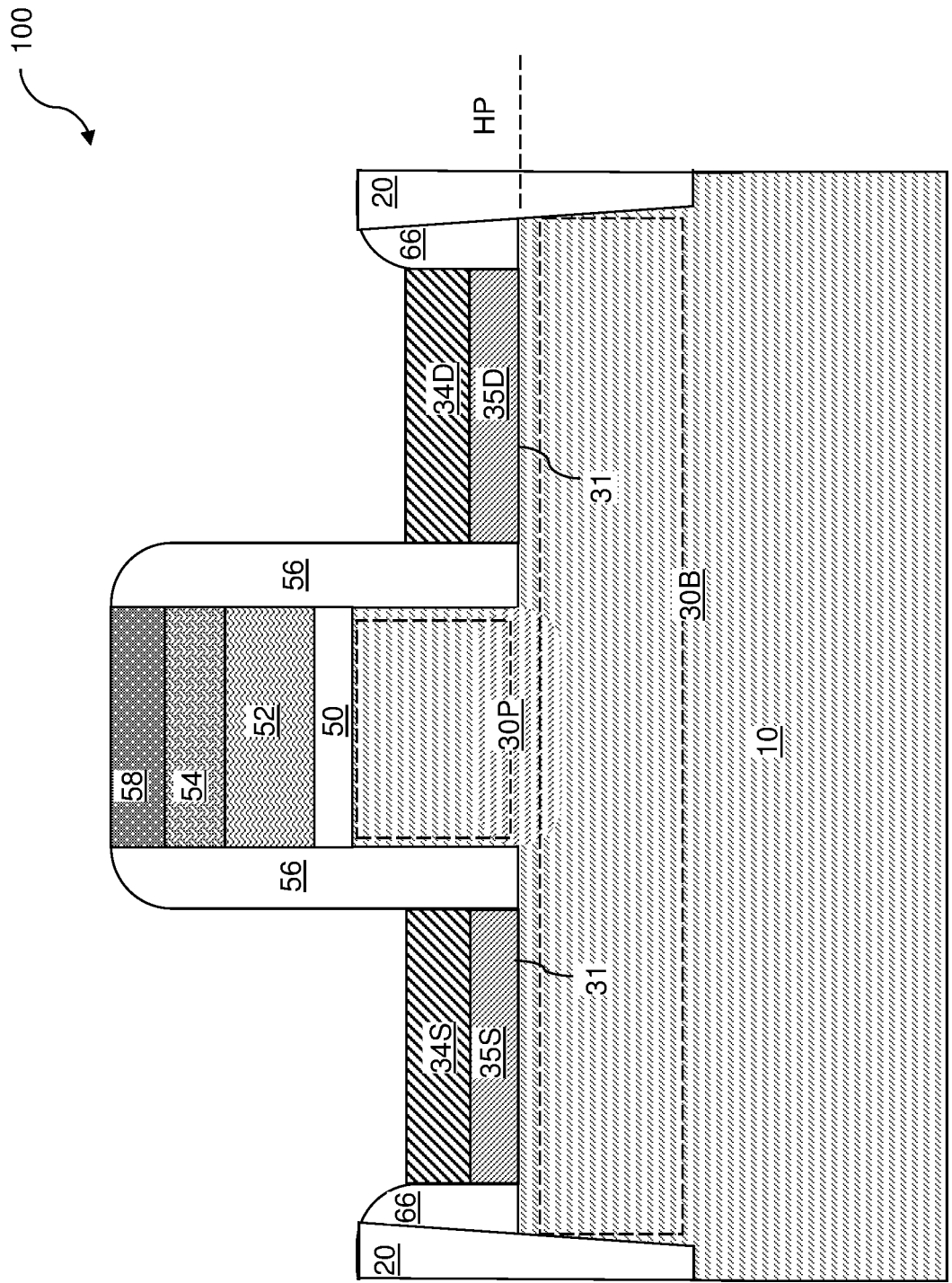
FIG. 14A is a vertical cross-sectional view of the first device region of the second exemplary structure after formation of a source region and a drain region according to an embodiment of the present disclosure.
Figure 14B:
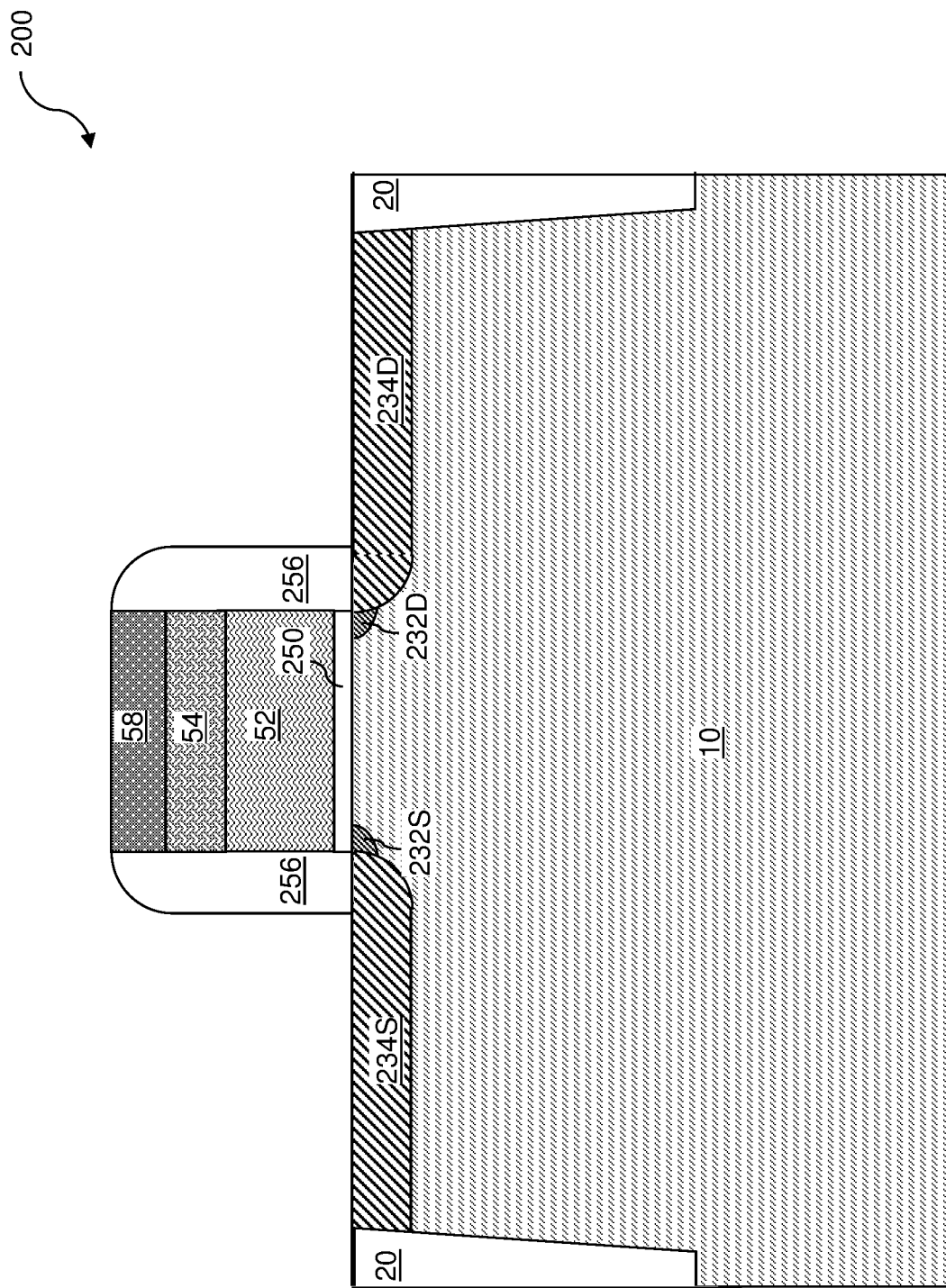
FIG. 14B is a vertical cross-sectional view of the second device region of the second exemplary structure after formation of a source region and a drain region according to an embodiment of the present disclosure.

Referring to FIGS. 14A and 14B, a source region 34S and a drain region 34D having a doping of the second conductivity type (which is an opposite of the first conductivity type) are formed within upper regions of the pair of epitaxial semiconductor material portions by converting the upper regions of the pair of epitaxial semiconductor material portions into the source region 34S and the drain region 34D or by epitaxially growing additional single crystal semiconductor material doped with a higher concentration of dopants of the second conductivity type on the extension regions (35S, 35D). In one embodiment, dopants of the second conductivity type can be implanted into upper portions of the extension regions (35S, 35D) in the first device region 100 and into upper portions of the semiconductor substrate 10 that are not masked by the second gate stack structure (250, 52, 54, 58), the dielectric gate spacers (56, 256), the shallow trench isolation spacers 66, or the shallow trench isolation structures 20 in the second device region 200. For example, at least one ion implantation process may be employed to introduce dopants of the second conductivity type into surface portions of the extension regions (35S, 35D), thereby converting the implanted surface portions of the extension regions (35S, 35D) into a source region 34S and a drain region 34D in the first device region 100. Dopants of the second conductivity type can be introduced into surface portion of the semiconductor substrate 10 in the second device region 200 to form a source region 234S and a drain region 234D. In case p-type transistors and n-type transistors are formed on the semiconductor substrate 10, masked ion implantation processes may be employed to implant dopants of different conductivity type into different field effect transistors.

For example, multiple instances of the first device region 100 can be formed on the semiconductor substrate 10 such that a first subset of the first device regions 100 includes p-type doped portions of the semiconductor substrate 10 (so that the first conductivity type is p-type for the first subset) and a second subset of the first device regions 100 includes n-type doped portions of the semiconductor substrate 10 (so that the first conductivity type is n-type for the second subset). For each first device region 100 having a doping of a respective first conductivity type, dopants of a respective second conductivity type that is the opposite of the first conductivity type can be implanted to form a respective source region 34S and a respective drain region 34D. For each second device region 200 having a doping of a respective first conductivity type, dopants of a respective second conductivity type that is the opposite of the first conductivity type can be implanted to form a respective source region 34S and a respective extension region 34D. The source regions 34S and the drain regions 34D of different field effect transistors may, or may not, have the same atomic concentration of dopants. Thus, one or more masked ion implantation processes may be employed to provide dopants of a respective second conductivity type at a target atomic concentration within each of the source regions 34S and the drain regions 34D. In one embodiment, each source region (34S, 234S) and each drain region (34D, 234D) can include dopants of a respective second conductivity type at an atomic concentration in a range from $5.0 \times 10^{18}/cm^3$ to $2.0 \times 10^{21}/cm^3$, m, such as from $1.0 \times 10^{20}/cm^3$ to $1.0 \times 10^{21}/cm^3$, although lesser and greater atomic concentrations can also be employed.

The thickness of the source region 34S and the drain region 34D in each first device region 100 can be less than the thickness of the extension regions (35S, 35D) as formed at the processing steps of FIGS. 13A and 13B. For example, the thickness of the source region 34S and the drain region 34D in each first device region 100 may be in a range from 50 nm to 1,000 nm, such as 100 nm to 300 nm, although lesser and greater thicknesses may also be employed. Thus, unimplanted portions of the extension regions (35S, 35D) remain under the source region 34S and the drain region 34D after formation of the source region 34S and the drain region 34D in the first device region 100.

Figure 15A:
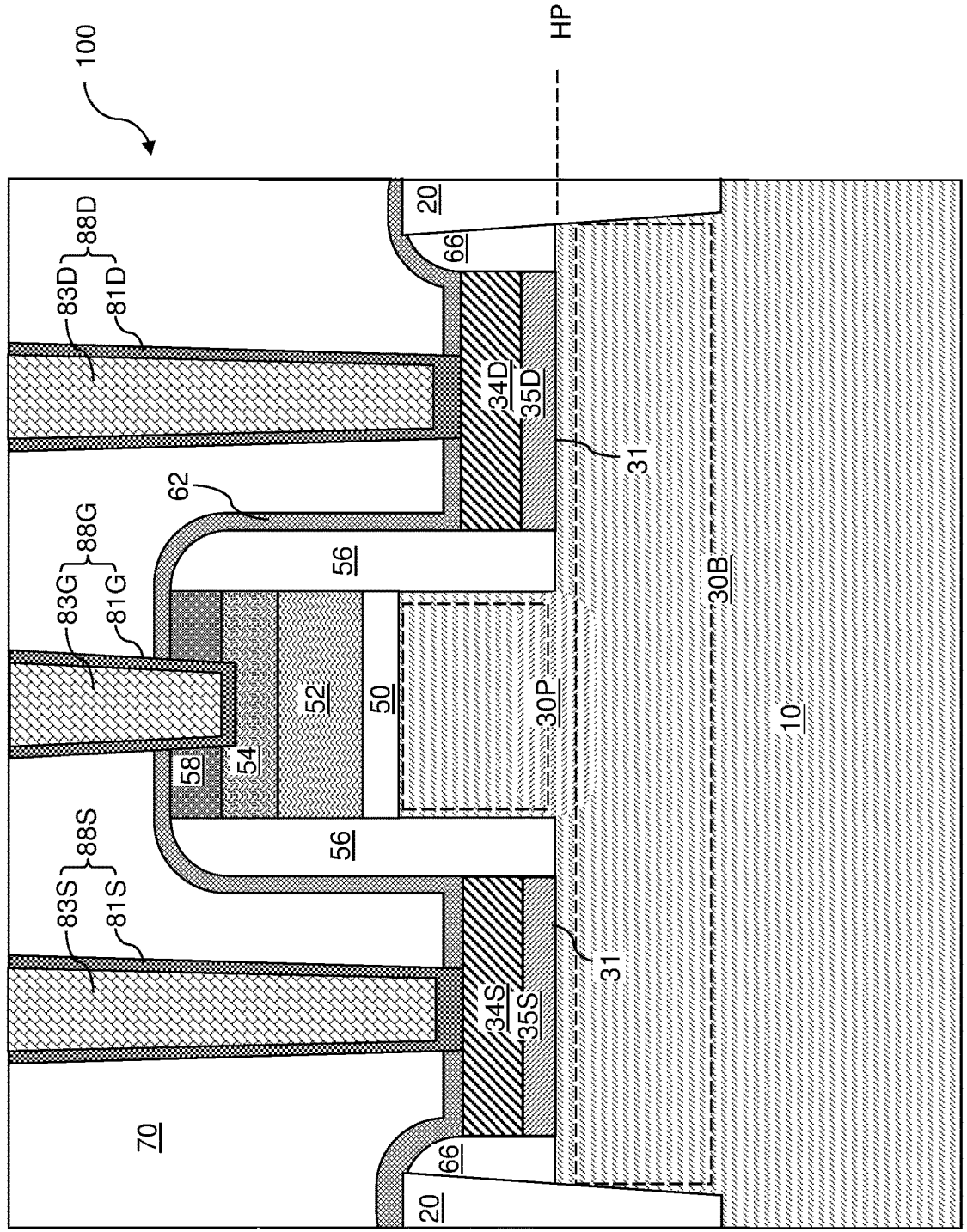
FIG. 15A is a vertical cross-sectional view of the first device region of the second exemplary structure after formation of a planarization dielectric layer and contact via structures according to an embodiment of the present disclosure.
Figure 15B:
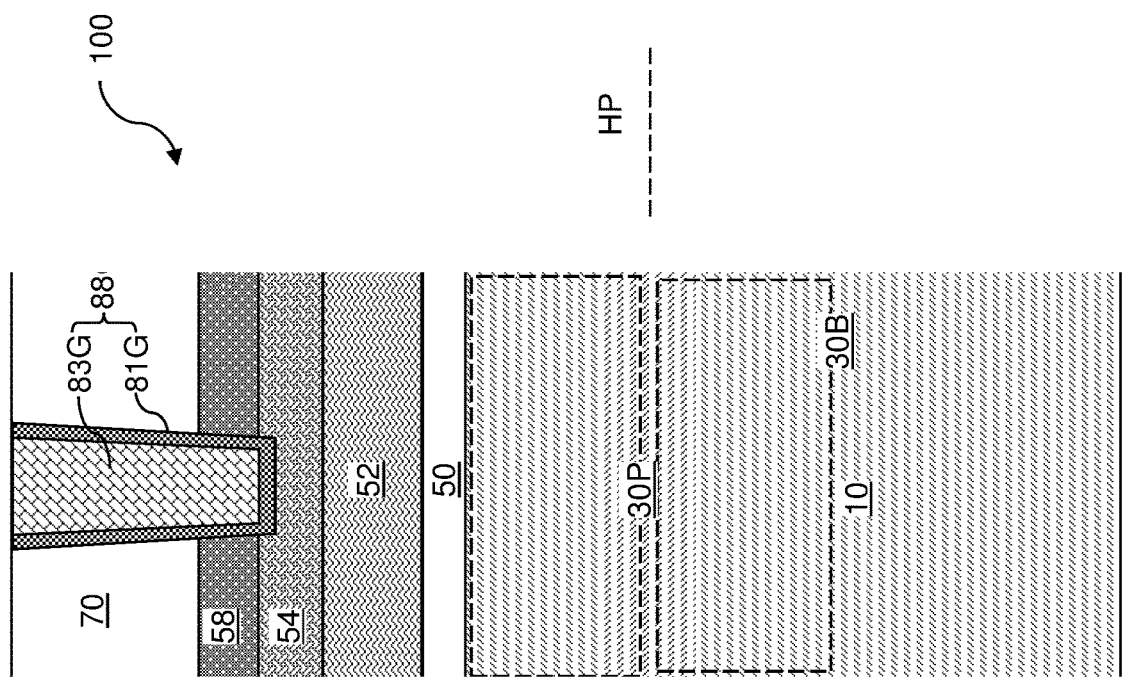
FIG. 15B is another vertical cross-sectional view of the first device region of the second exemplary structure of FIG. 15A along a lengthwise direction of the gate stack structure according to an embodiment of the present disclosure.

Referring to FIGS. 15A and 15B, the processing steps of FIGS. 7A-7C can be performed to form a dielectric liner 62, a planarization dielectric layer 70, and contact via structures (88S, 88D, 88G). The contact via structures (88S, 88D, 88G) can include a source contact via structure 88S (i.e., source electrode) that includes a source metallic liner 81S and a source metallic fill material portion 83S, a drain contact via structure 88D (i.e., drain electrode) that includes a drain metallic liner 81D and a drain metallic fill material portion 83D, and a gate contact via structure 88G (i.e., gate contact) that includes a gate metallic liner 81G and a gate metallic fill material portion 83G. The source contact via structure 88S contacts a top surface of a source region (34S, 234S), the drain contact via structure 88D contacts a top surface of a drain region (34D, 234D), and a gate contact via structure 88G contacts a top surface of a gate electrode (52, 54).

Figure 16A:
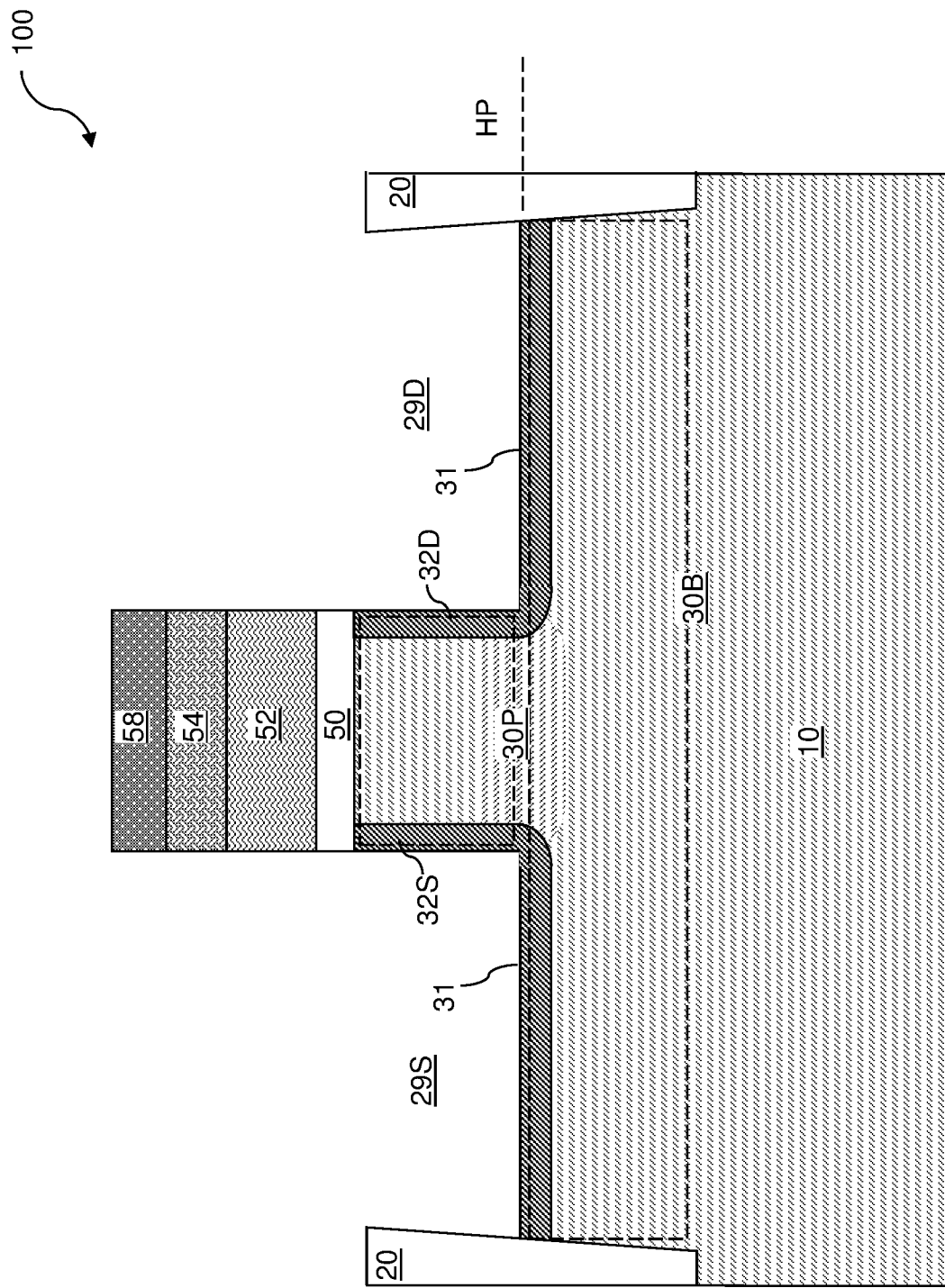
FIG. 16A is a vertical cross-sectional view of a first device region of a third exemplary structure after formation of source extension regions and drain extension regions according to an embodiment of the present disclosure.
Figure 16B:
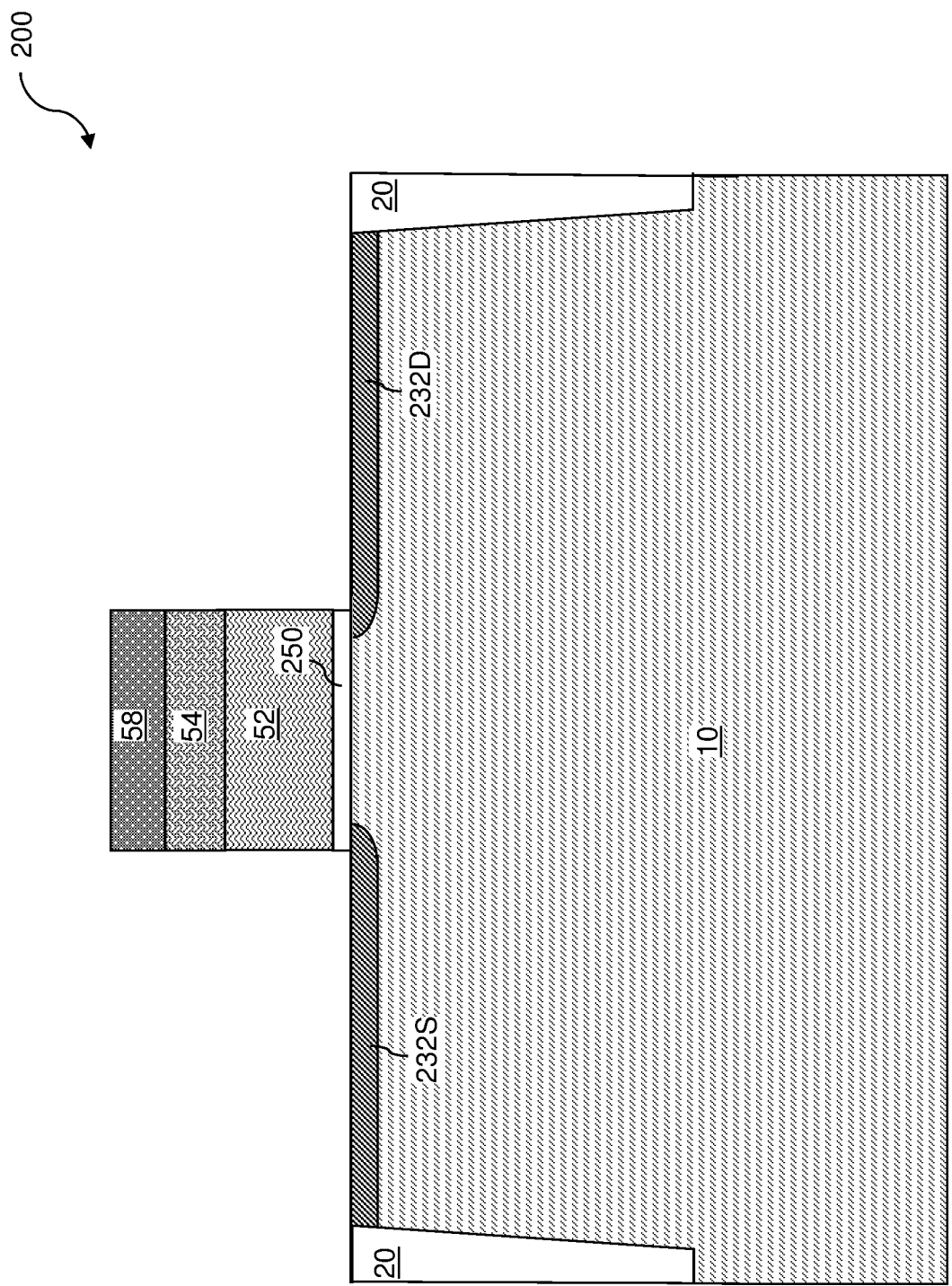
FIG. 16B is a vertical cross-sectional view of a second device region of the third exemplary structure after formation of source extension regions and drain extension regions according to an embodiment of the present disclosure.

Referring to FIGS. 16A and 16B, a third exemplary structure according to an embodiment of the present disclosure can be the same as the first exemplary structure of FIGS. 5A and 5B.

Figure 17A:
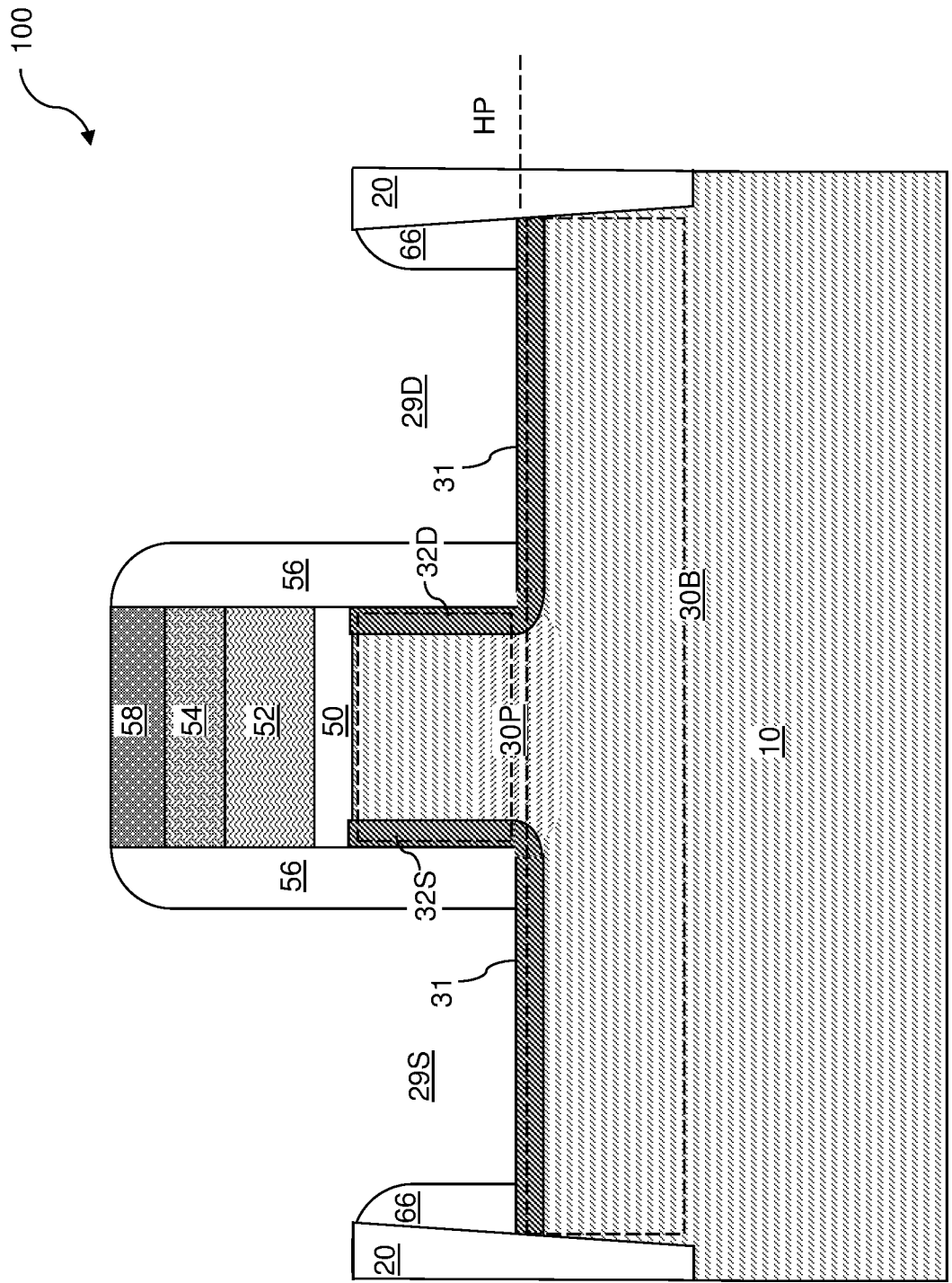
FIG. 17A is a vertical cross-sectional view of the first device region of the third exemplary structure after formation of dielectric gate spacers and shallow trench isolation spacers according to an embodiment of the present disclosure.
Figure 17B:
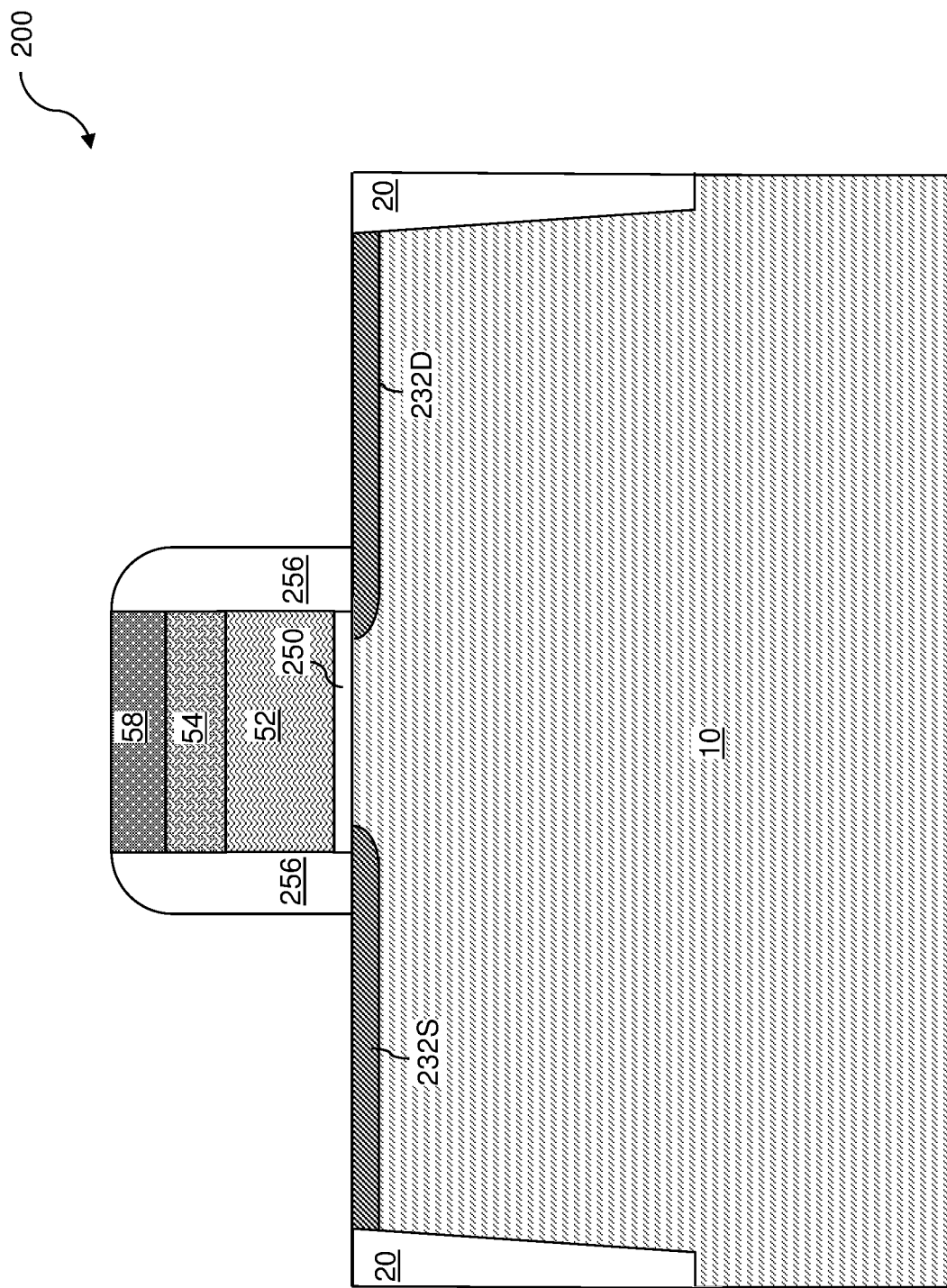
FIG. 17B is a vertical cross-sectional view of the second device region of the third exemplary structure after formation of dielectric gate spacers and shallow trench isolation spacers according to an embodiment of the present disclosure.

Referring to FIGS. 17A and 17B, the processing steps of FIGS. 6A and 6B can be performed to form dielectric gate spacers (56, 256) and shallow trench isolation spacers 66. For example, a conformal dielectric material layer including a dielectric material such as silicon oxide can be deposited, and can be subsequently anisotropically etched by performed an anisotropic etch process such as a reactive ion etch process. A first dielectric gate spacer 56 is formed around the first gate stack structure (50, 52, 54, 58) in the first device region 100, and a second dielectric gate spacer 256 is formed around the second gate stack structure (250, 52, 54, 58) in the second device region 200. The first dielectric gate spacer 56 can be formed on a pair of sidewalls of the first gate stack structure (50, 52, 54, 58) and on a pair of sidewalls of the pedestal semiconductor portion 30P that are vertically coincident with the pair of sidewalls of the first gate stack structure (50, 52, 54, 58). The width of the first dielectric gate spacer 56 and the second dielectric gate spacer 256 can be in a range from 20 nm to 400 nm, such as from 40 nm to 20 nm, although lesser and greater widths can also be employed.

A remaining portion of the conformal dielectric material layer in the first device region 100 comprises a first shallow trench isolation spacer 66 that comprises a same insulating material as the first dielectric gate spacer 56 and the second dielectric gate spacer 256. The first shallow trench isolation spacer 66 contacts sidewalls of the shallow trench isolation structure 20 and peripheral portions of the pair of top horizontal surfaces 31 of the base semiconductor portion 30B. The first shallow trench isolation spacer 66 is adjoined to the first dielectric gate spacer 56.

Figure 18A:
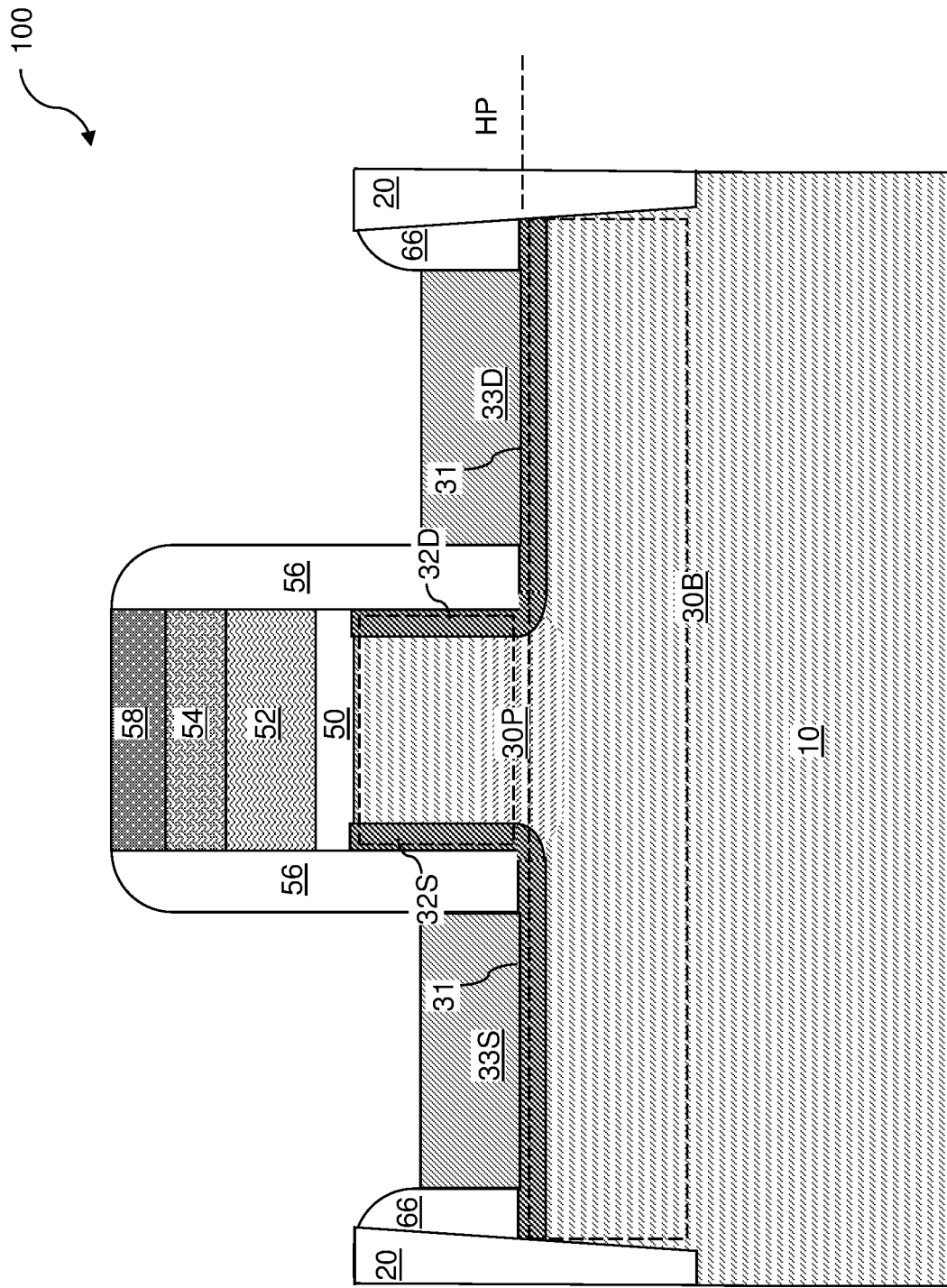
FIG. 18A is a vertical cross-sectional view of the first device region of the third exemplary structure after covering the second device region with a dielectric cover layer and formation of epitaxial semiconductor material portions according to an embodiment of the present disclosure.

Referring to FIGS. 18A and 18B, a dielectric cover layer 260 can be conformally deposited over the second exemplary structure, and can be lithographically patterned to cover the second device region 200 without covering the first device region 100. The dielectric cover layer 260 includes a dielectric material such as silicon oxide or silicon nitride. The thickness of the dielectric cover layer 260 may be in a range from 10 nm to 50 nm, although lesser and greater thicknesses may also be employed.

A selective semiconductor deposition process can be performed to grow a single crystalline or polycrystalline semiconductor material (e.g., silicon) from each physically exposed surface of the semiconductor substrate 10. Particularly, a single crystalline or polycrystalline semiconductor material is deposited on each physically exposed portion of the top horizontal surfaces 31 of the base semiconductor portion 30B in the first device region 100. The dielectric cover layer 260 prevents deposition of a semiconductor material over the second device region 200.

In one embodiment, the selective semiconductor deposition process may comprise a selective epitaxy process that grows single crystalline semiconductor materials from physically exposed semiconductor surfaces such as the physically exposed portions of the top horizontal surfaces 31 of the base semiconductor portion 30B in the first device region 100. In this case, the second exemplary structure can be placed within a vacuum enclosure of a selective epitaxy process chamber, and a precursor gas for depositing a semiconductor material and an etchant gas can be simultaneously or alternately flowed into the vacuum enclosure to effect the selective semiconductor deposition process. The precursor gas may include, for example, silane, disilane, dichlorosilane, trichlorosilane, germane, digermane, and/or other semiconductor precursor gases known in the art. The etchant gas may include, for example, gas phase hydrogen chloride. Epitaxial semiconductor material portions can grow from the physically exposed portions of the top horizontal surfaces 31 of the base semiconductor portion 30B in the first device region 100.

In one embodiment, a pair of epitaxial semiconductor material portions can be formed by growing a single crystalline semiconductor material from the pair of top horizontal surfaces 31 of the base semiconductor portion 30B in the first device region 100. In one embodiment, the epitaxial semiconductor material portions can have a doping of a second conductivity type that is the opposite of the first conductivity type. In this case, the single crystalline semiconductor material can be grown with in-situ doping with dopants of the second conductivity type. The epitaxial semiconductor material portions can function as additional extensions of a source region and a drain region, and are herein referred to as a raised source extension regions 33S and a raised drain extension region 33D. The raised source extension region 33S is formed on a top surface of the source extension region 32S and the raised drain extension region 33D is formed on a top surface of the drain extension region 32D in the first device region 100. In this case, the single crystalline semiconductor material of the raised source extension region 33S and the raised drain extension region 33D can be grown with in-situ doping with dopants of the second conductivity type.

The raised source extension region 33S and the raised drain extension region 33D may include dopants of the second conductivity type at an atomic concentration that may be the same as, or may be different from, the atomic concentration of dopants of the second conductivity type within the source extension region 32S and the drain extension region 32D. For example, the raised source extension region 33S and the raised drain extension region 33D may include dopants of the second conductivity type at an atomic concentration in a range from $1.0 \times 10^{18}/cm^3$ to $1.0 \times 10^{20}/cm^3$, such as from $5.0 \times 10^{18}/cm^3$ to $5.0 \times 10^{19}/cm^3$, although lesser and greater atomic concentrations can also be employed.

The semiconductor material of the raised source extension region 33S and the raised drain extension region 33D (i.e., the material composition excluding dopants) may be the same as, or may be different, from the semiconductor material of the base semiconductor portion 30B. For example, if the base semiconductor portion 30B comprises a single crystalline silicon portion, the extension regions (35S, 35D) may be a single crystalline silicon portion having a doping of the second conductivity type or a single crystalline silicon-germanium portion having a doping of the second conductivity type. The single crystalline semiconductor material of raised source extension region 33S and the raised drain extension region 33D can be epitaxially aligned to the single crystalline semiconductor material of the base semiconductor portion 30B.

The thickness of raised source extension region 33S and the raised drain extension region 33D (i.e., the vertical distance between the top surface and the bottom surface of each of the raised source extension region 33S and the raised drain extension region 33D) may be the same as, greater than, or less than, the height of the sidewalls of the pedestal semiconductor portion 30P that contact the first dielectric gate spacer 56. In one embodiment, the thickness of raised source extension region 33S and the raised drain extension region 33D may be in a range from 50 nm to 1,500 nm, such as from 150 nm to 1,000 nm, although lesser and greater vertical distances may also be employed. In one embodiment, top surfaces of raised source extension region 33S and the raised drain extension region 33D can be located below the horizontal plane including the top surface of the shallow trench isolation structure 20.

In the third exemplary structure, at least one doped extension region (32S, 32D) having a doping of the second conductivity type can be formed underneath at least one sidewall of the pedestal semiconductor portion 30P prior to formation of the first dielectric gate spacer 56. Each of the at least one doped extension region (32S, 32D) is adjoined to a respective one of the pair of epitaxial semiconductor material portions (i.e., the raised source extension region 33S and the raised drain extension region 33D) upon formation of the pair of epitaxial semiconductor material portions. The dielectric cover layer 260 can be subsequently removed, for example, by an isotropic etch process such as a wet etch process.

Figure 19A:
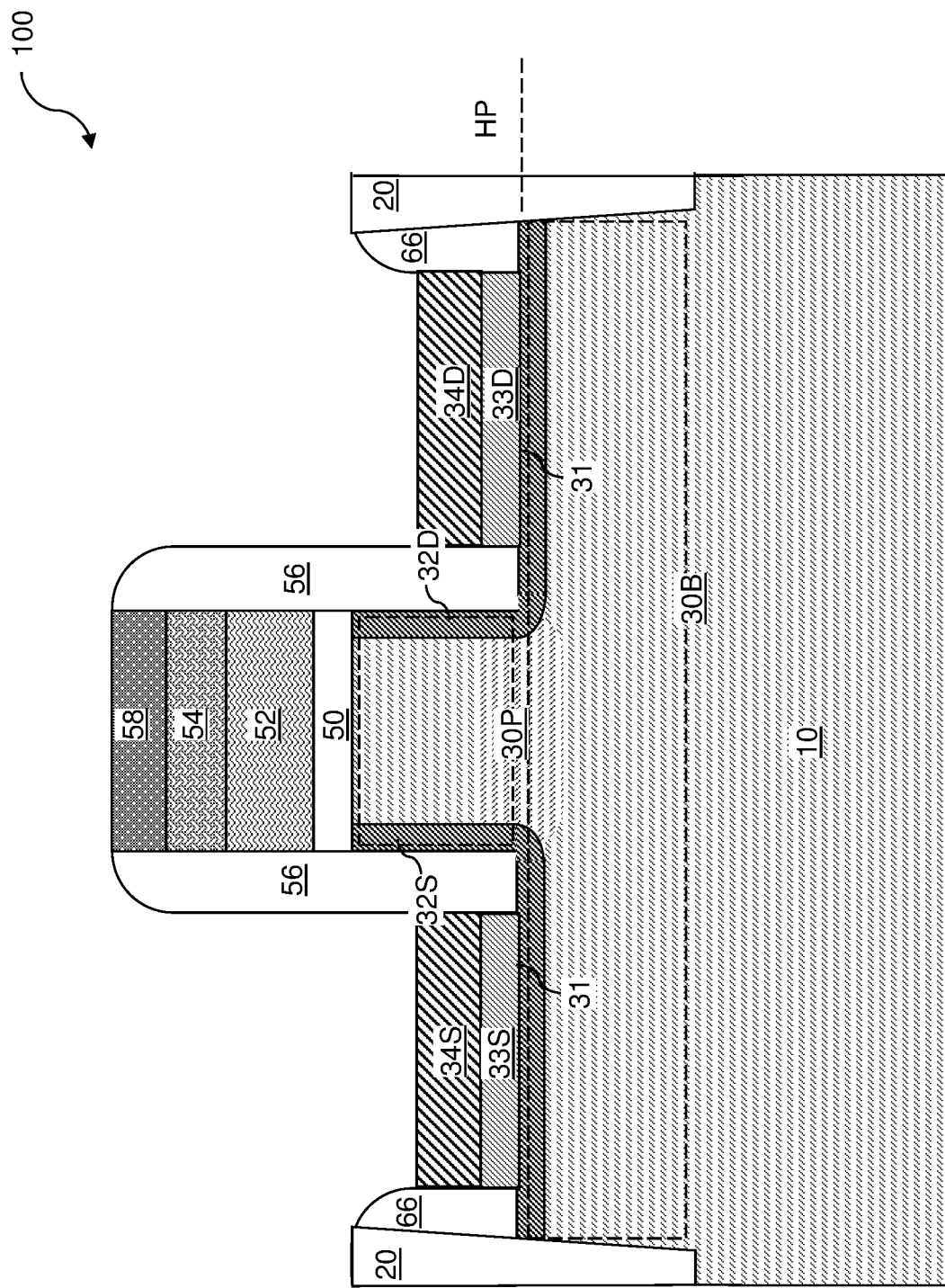
FIG. 19A is a vertical cross-sectional view of the first device region of the third exemplary structure after formation of a source region and a drain region according to an embodiment of the present disclosure.
Figure 19B:
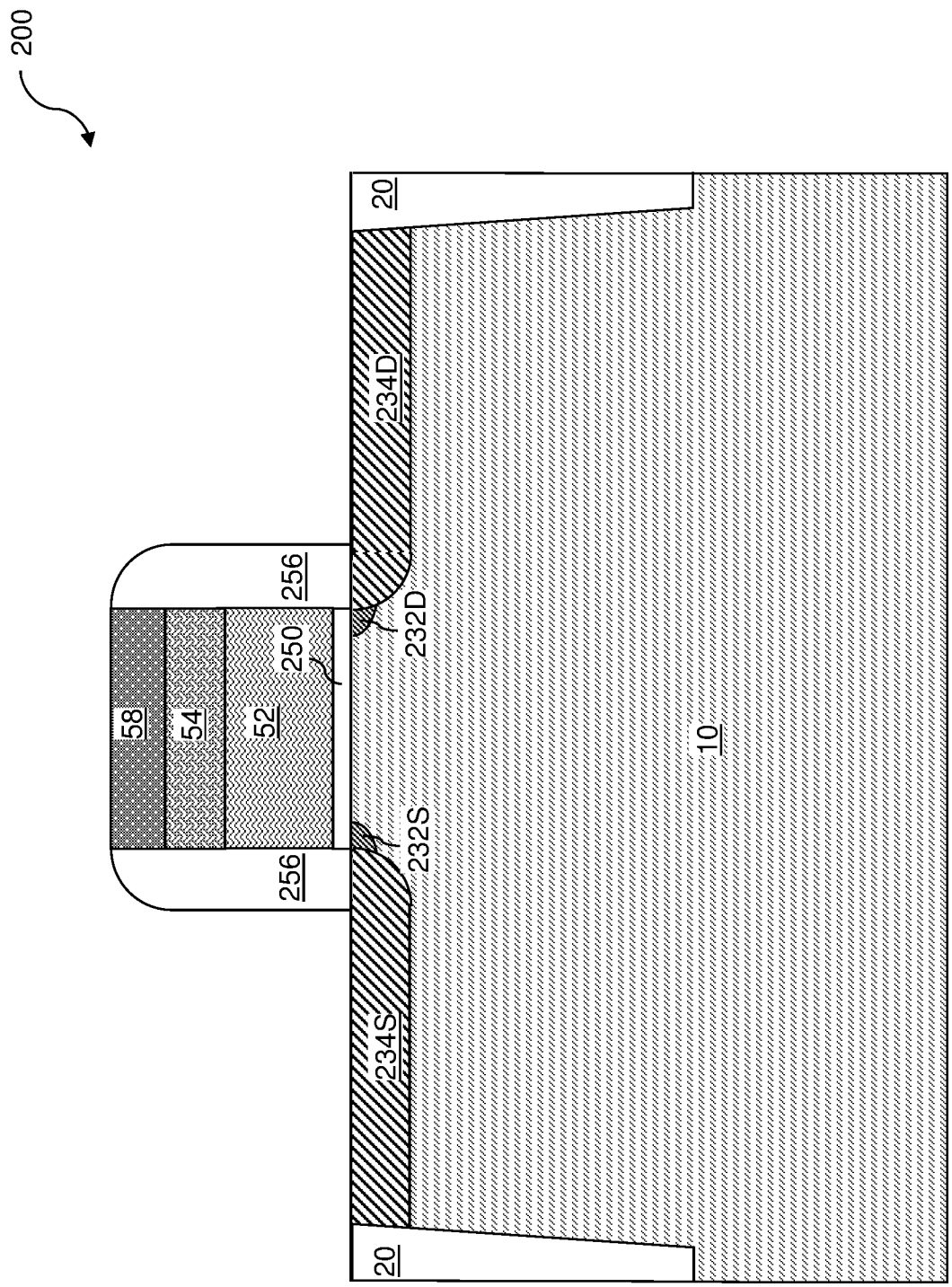
FIG. 19B is a vertical cross-sectional view of the second device region of the third exemplary structure after formation of a source region and a drain region according to an embodiment of the present disclosure.

Referring to FIGS. 19A and 19B, a source region 34S and a drain region 34D having a doping of the second conductivity type (which is an opposite of the first conductivity type) are formed within upper regions by the pair of epitaxial semiconductor material portions or by epitaxially growing additional single crystal semiconductor material doped with a higher concentration of dopants of the second conductivity type on the pair of epitaxial semiconductor material portions. In one embodiment, dopants of the second conductivity type can be implanted into upper portions of the raised source extension region 33S and the raised drain extension region 33D in the first device region 100, and into upper portions of the semiconductor substrate 10 that are not masked by the second gate stack structure (250, 52, 54, 58), the dielectric gate spacers (56, 256), the shallow trench isolation spacers 66, or the shallow trench isolation structures 20 in the second device region 200. For example, at least one ion implantation process may be employed to introduce dopants of the second conductivity type into surface portions of the raised source extension region 33S and the raised drain extension region 33D, thereby converting the implanted surface portions of the raised source extension region 33S and the raised drain extension region 33D into a source region 34S and a drain region 34D in the first device region 100. Dopants of the second conductivity type can be introduced into surface portion of the semiconductor substrate 10 in the second device region 200 to form a source region 34S and a drain region 34D. In case p-type transistors and n-type transistors are formed on the semiconductor substrate 10, masked ion implantation processes may be employed to implant dopants of different conductivity type into different field effect transistors.

For example, multiple instances of the first device region 100 can be formed on the semiconductor substrate 10 such that a first subset of the first device regions 100 includes p-type doped portions of the semiconductor substrate 10 (so that the first conductivity type is p-type for the first subset) and a second subset of the first device regions 100 includes n-type doped portions of the semiconductor substrate 10 (so that the first conductivity type is n-type for the second subset). For each first device region 100 having a doping of a respective first conductivity type, dopants of a respective second conductivity type that is the opposite of the first conductivity type can be implanted to form a respective source region 34S and a respective drain region 34D. For each second device region 200 having a doping of a respective first conductivity type, dopants of a respective second conductivity type that is the opposite of the first conductivity type can be implanted to form a respective source region 234S and a respective extension region 234D. The source regions (34S, 234S) and the drain regions (34D, 234D) of different field effect transistors may, or may not, have the same atomic concentration of dopants. Thus, one or more masked ion implantation processes may be employed to provide dopants of a respective second conductivity type at a target atomic concentration within each of the source regions and the drain regions. In one embodiment, each source region and each drain region can include dopants of a respective second conductivity type at an atomic concentration in a range from $5.0 \times 10^{18}/cm^3$ to $2.0 \times 10^{21}/cm^3$, such as from $1.0 \times 10^{20}/cm^3$ to $1.0 \times 10^{21}/cm^3$, although lesser and greater atomic concentrations can also be employed.

The thickness of the source region 34S and the drain region 34D in each first device region 100 can be less than the thickness of the raised source extension region 33S and the raised drain extension region 33D as formed at the processing steps of FIGS. 18A and 18B. For example, the thickness of the source region 34S and the drain region 34D in each first device region 100 may be in a range from 50 nm to 1,000 nm, although lesser and greater thicknesses may also be employed. Thus, unimplanted portions of the raised source extension region 33S and the raised drain extension region 33D remain under the source region 34S and the drain region 34D after formation of the source region 34S and the drain region 34D in the first device region 100.

Figure 20:
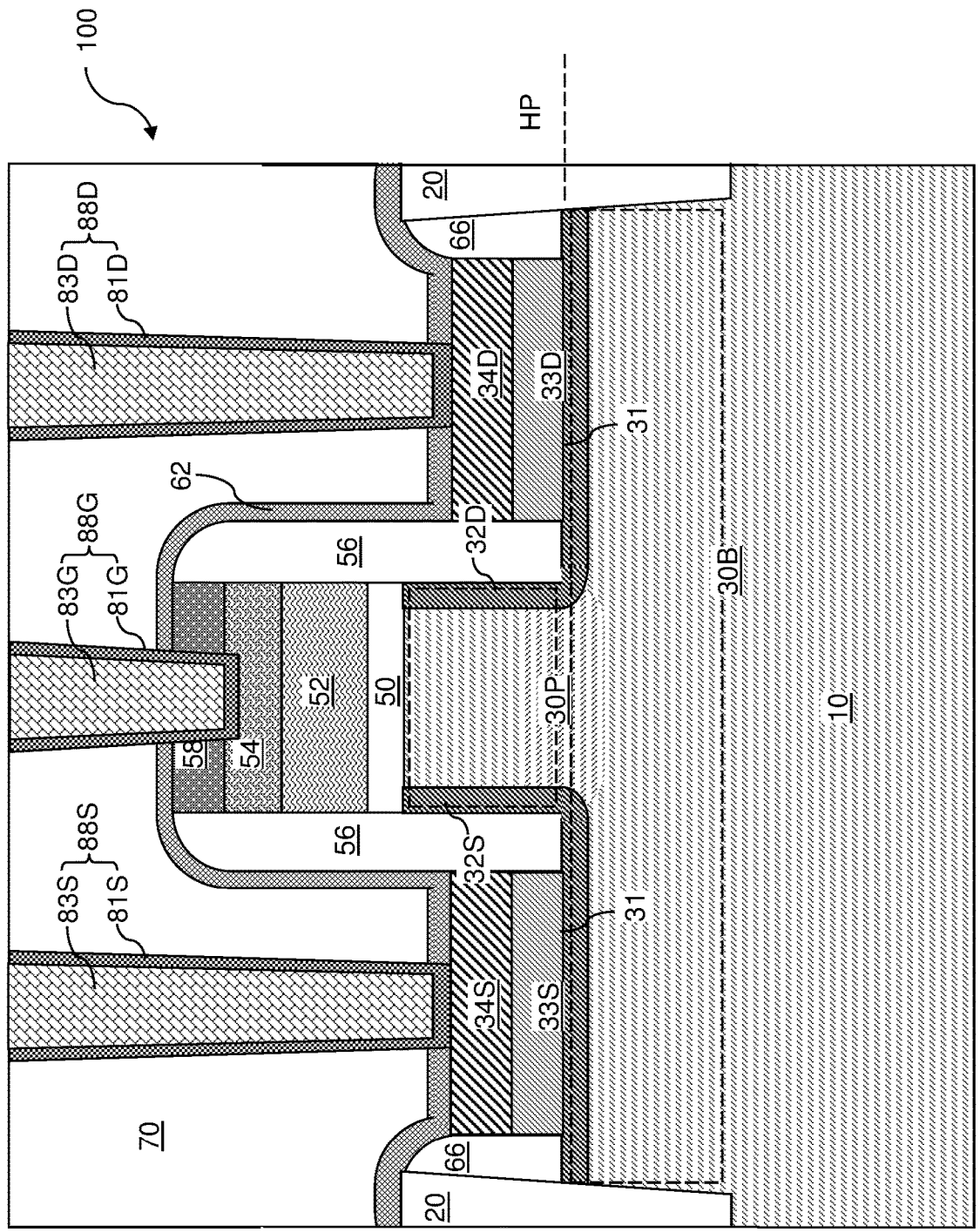
FIG. 20 is a vertical cross-sectional view of the first device region of the third exemplary structure after formation of a planarization dielectric layer and various contact via structures according to an embodiment of the present disclosure.

Referring to FIG. 20, the processing steps of FIGS. 7A-7C can be performed to form a dielectric liner 62, a planarization dielectric layer 70, and contact via structures (88S, 88D, 88G). The contact via structures (88S, 88D, 88G) can include a source contact via structure 88S (i.e., source electrode) that includes a source metallic liner 81S and a source metallic fill material portion 83S, a drain contact via structure 88D (i.e., drain electrode) that includes a drain metallic liner 81D and a drain metallic fill material portion 83D, and a gate contact via structure 88G (i.e., gate contact) that includes a gate metallic liner 81G and a gate metallic fill material portion 83G. The source contact via structure 88S contacts a top surface of a source region (34S, 234S), the drain contact via structure 88D contacts a top surface of a drain region (34D, 234D), and a gate contact via structure 88G contacts a top surface of a gate electrode (52, 54). The top surfaces of the source region 34S and the drain region 34D in the first device region 100 can be located above the horizontal plane including the interface between the first gate dielectric 50 and the pedestal semiconductor portion 30P.

Referring to FIGS. 10A-20 and all related drawings of the first exemplary structure and according to various embodiments of the present disclosure, a semiconductor structure is provided, which comprises: a shallow trench isolation structure 20 comprising a dielectric material embedded within a semiconductor material layer (e.g., a well in or an epitaxial layer in the semiconductor substrate 10) and laterally surrounding an upper portion (30B, 30P) of the semiconductor material layer, wherein the upper portion of the semiconductor material layer comprises a base semiconductor portion 30B comprising a pair of top horizontal surfaces 31 and a pedestal semiconductor portion 30P located between the pair of top horizontal surfaces 31 and vertically protruding above a horizontal plane HP including the pair of top horizontal surfaces 31; a gate stack structure (50, 52, 54, 58) comprising a gate dielectric 50 and a gate electrode (52, 54) and including a pair of sidewalls that are vertically coincident with a pair of sidewalls of the pedestal semiconductor portion 30P; a dielectric gate spacer 56 contacting the pair of sidewalls of the gate stack structure (50, 52, 54, 58) and the pair of sidewalls of the pedestal semiconductor portion 30P; and a pair of epitaxial semiconductor material portions {(35S, 35D, 34S, 34D) or (33S, 33D, 34S, 34D)} located on, and above, the pair of top horizontal surfaces 31 of the base semiconductor portion 30B and epitaxially aligned to the base semiconductor portion 30B, wherein the pair of epitaxial semiconductor material portions {(35S, 35D, 34S, 34D) or (33S, 33D, 34S, 34D)} comprises a source region 34S and a drain region 34D.

In one embodiment, a bottom surface of the source region 34S and a bottom surface of the drain region 34D are located above a horizontal plane HP including the pair of top horizontal surfaces 31 of the base semiconductor portion 30.

In one embodiment, the dielectric gate spacer 56 contacts peripheral portions of the pair of top horizontal surfaces 31 of the base semiconductor portion 30B.

In one embodiment, a horizontal interface between the gate dielectric 50 and the pedestal semiconductor portion 30P is located above the horizontal plane HP including the pair of top horizontal surfaces 31 of the base semiconductor portion 30B; and a vertical distance between the horizontal interface between the gate dielectric 50 and the pedestal semiconductor portion 30P and the horizontal plane HP including the pair of top horizontal surfaces 31 of the base semiconductor portion 30B is in a range from 100 nm to 2 microns.

In one embodiment, the semiconductor structure comprises a shallow trench isolation spacer 66 that comprises a same insulating material as the dielectric gate spacer 56, adjoined to the dielectric gate spacer 56, and contacts sidewalls of the shallow trench isolation structure 20 that are located above the horizontal plane HP including the pair of top horizontal surfaces 31 of the base semiconductor portion 30B. In one embodiment, an entirety of sidewalls of pair of epitaxial semiconductor material portions {(35S, 35D, 34S, 34D) or (33S, 33D, 34S, 34D)} contacts a respective sidewall of the dielectric gate spacer 56 or a respective sidewall of the shallow trench isolation spacer 66.

In one embodiment, semiconductor structure comprises: a dielectric liner 62 continuously extending over, and contacting, a top surface of the source region 34S, a top surface of the drain region 34D, an outer sidewall of the dielectric gate spacer 56, and a top surface of the gate stack structure (50, 52, 54, 58); a planarization dielectric layer 70 overlying the dielectric liner 62 and having a planar top surface; and contact via structures (88S, 88D, 88G) vertically extending through the planarization dielectric layer 70 and the dielectric liner 62 and contacting a respective one of the source region 34S, the drain region, 34D and the gate electrode (52, 54).

In one embodiment, the base semiconductor portion 30B comprises a first single crystalline semiconductor material portion having a doping of a first conductivity type; the pedestal semiconductor portion 30P comprises of a second single crystalline semiconductor material portion having a doping of a second conductivity type that is an opposite of the first conductivity type; and the source region 34S and the drain region 34D have a doping of the second conductivity type. In one embodiment, the first single crystalline semiconductor material portion and the second single crystalline semiconductor material portion have a same material composition and are epitaxially aligned to each other.

In one embodiment, each of the pair of epitaxial semiconductor material portions (35S, 35D, 34S, 34D) comprises a respective extension region (35S, 35D) having a doping of the second conductivity type and contacting a bottom surface of a respective one of the source region 34S and the drain region 34D.

In one embodiment, the second single crystalline semiconductor material portion (having a doping of the second conductivity type) contacts sidewalls of the dielectric gate spacer 56, as illustrated in FIGS. 15A and 15B.

In one embodiment, the pedestal semiconductor portion 30P comprises of a source extension region 32S and a drain extension region 32D having a doping of the second conductivity type, adjoined to a bottom surface of the gate dielectric 50, contacting a bottom surface of the dielectric gate spacer 56, and including a horizontally-extending region having a respective top surface within the horizontal plane including the pair of top horizontal surfaces 31.

In one embodiment, the pair of epitaxial semiconductor material portions (33S, 33D, 34S, 34D) comprises: a raised source extension region 33S contacting a bottom surface of the source region 34S and having a bottom surface located within the horizontal plane HP including the pair of top horizontal surfaces 31; and a raised drain extension region 33D contacting a bottom surface of the drain region 34D and having a bottom surface located within the horizontal plane HP including the pair of top horizontal surfaces 31.

Figure 21:
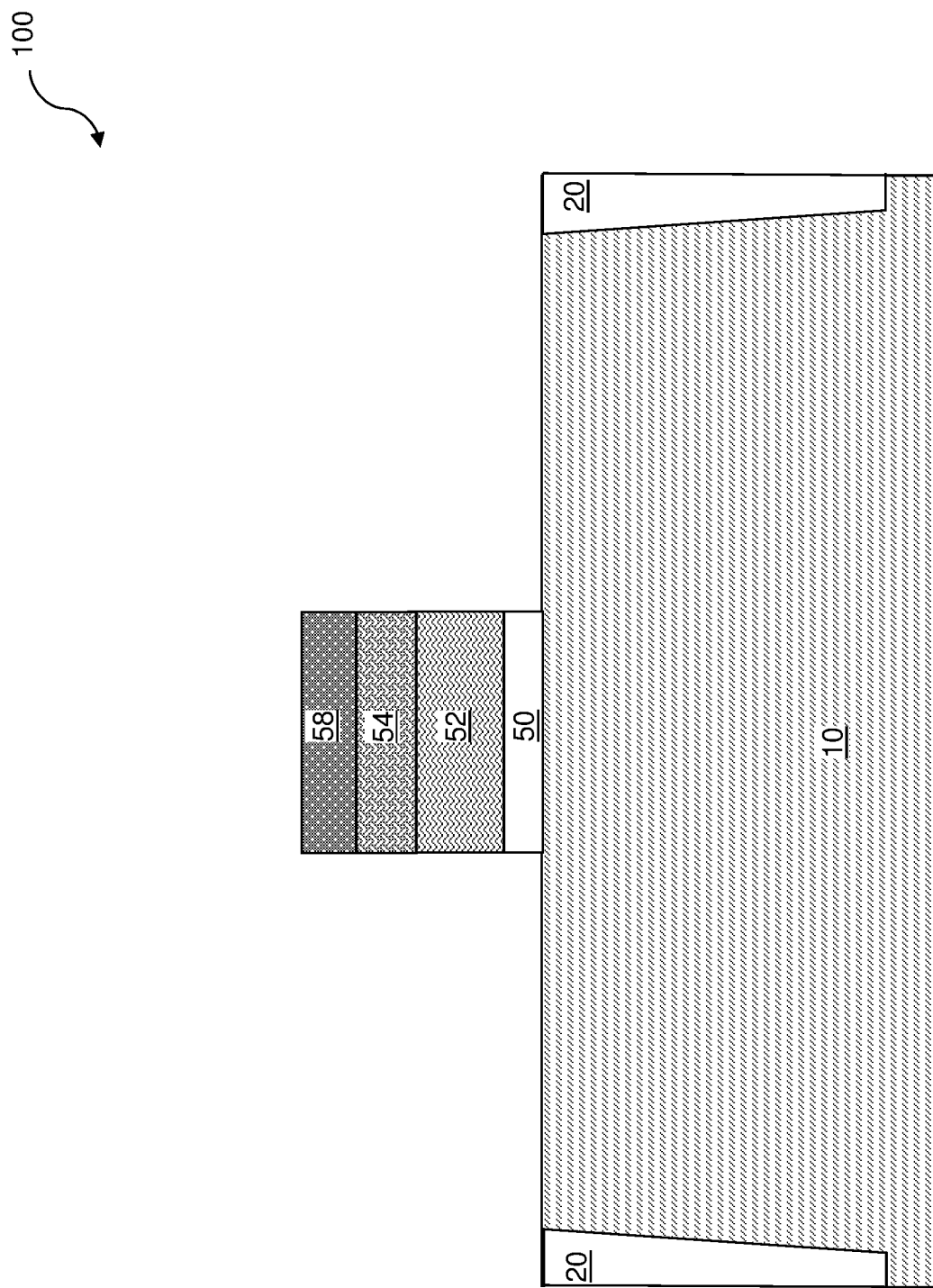
FIG. 21 is a vertical cross-sectional view of a first device region of a fourth exemplary structure after formation of gate stack structures according to an embodiment of the present disclosure.

Referring to FIG. 21, a first device region 100 of a fourth exemplary structure according to an embodiment of the present disclosure is illustrated. The fourth exemplary structure may be the same as the first exemplary structure of FIGS. 3A-3D at this processing step. The fourth exemplary structure may include a second device region 200 as in the first exemplary structure of FIG. 3A-3D.

Figure 22:
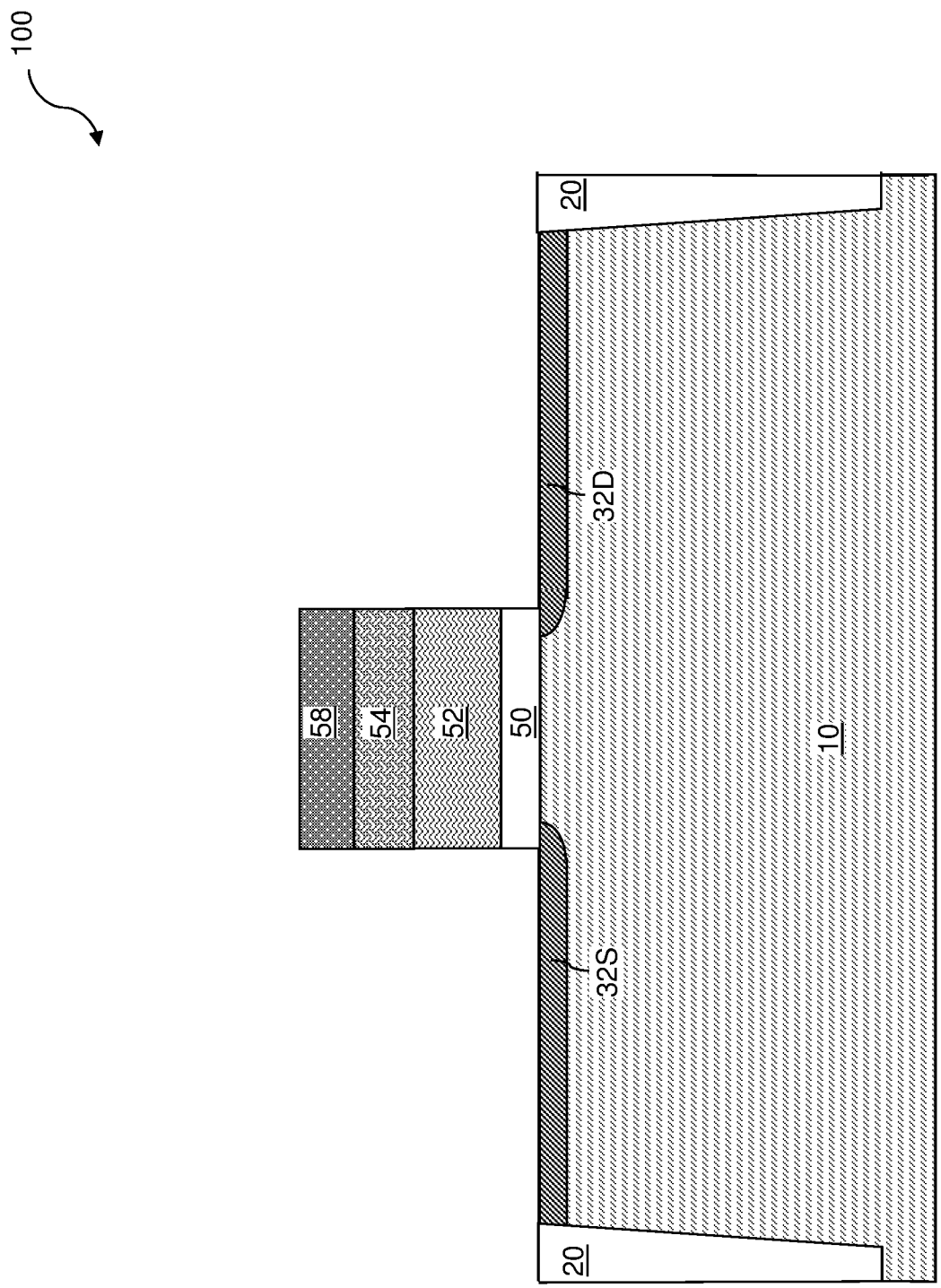
FIG. 22 is a vertical cross-sectional view of the first device region of the fourth exemplary structure after formation of a source extension region and a drain extension region according to an embodiment of the present disclosure.

Referring to FIG. 22, the processing steps of FIGS. 5A and 5B can be performed to form a source extension region 32S and a drain extension region 32D in the first device region 100. The second device region 200 (not illustrated) of the fourth exemplary structure may be the same as the second device region 200 of the first exemplary structure illustrated in FIG. 5B at this processing step.

Figure 23:
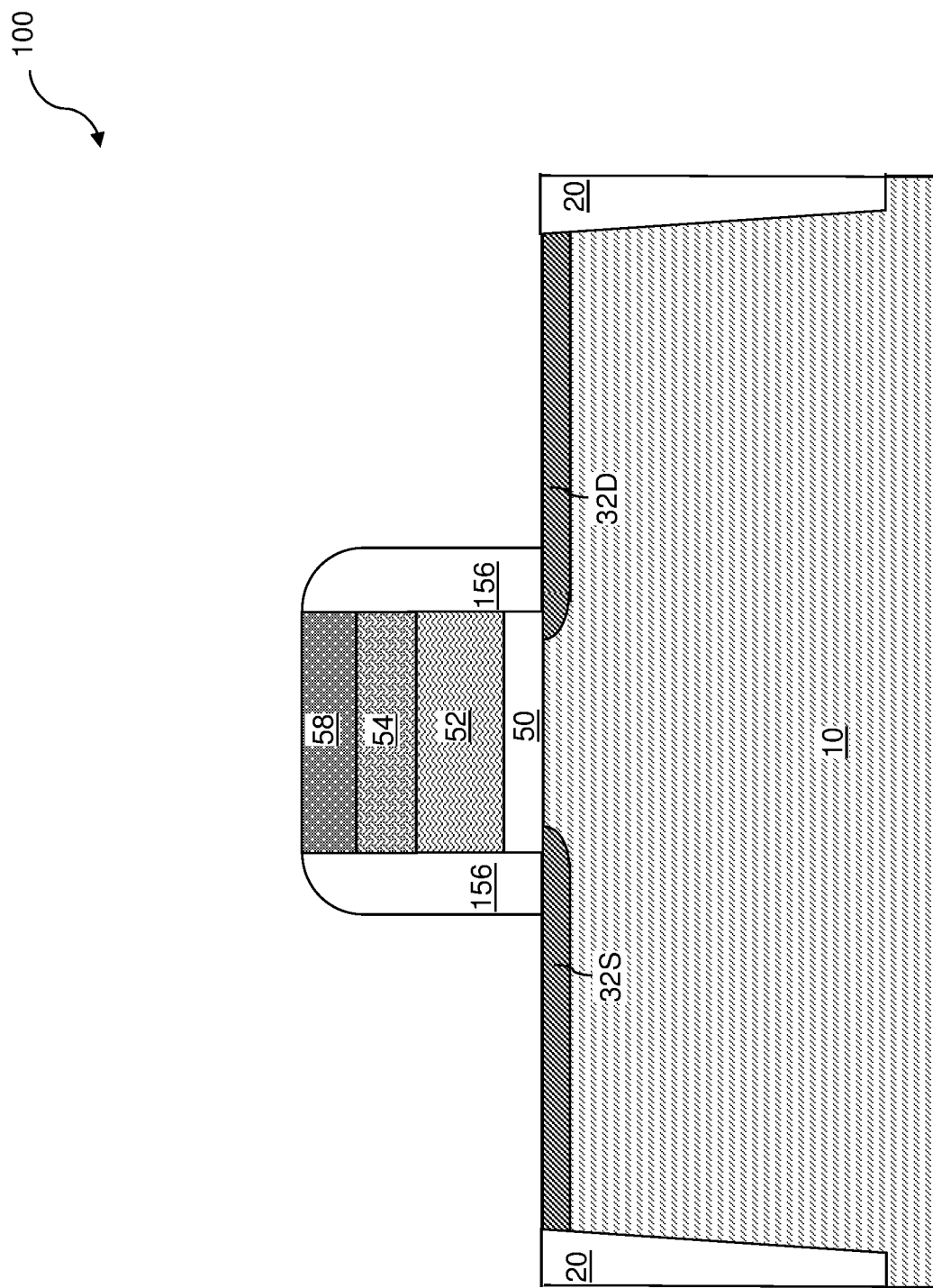
FIG. 23 is a vertical cross-sectional view of the first device region of the fourth exemplary structure after formation of a dielectric gate spacer and a shallow trench isolation spacer according to an embodiment of the present disclosure.

Referring to FIG. 23, the processing steps of FIGS. 6A and 6B can be performed to form a first dielectric gate spacer 56 and a first shallow trench isolation spacer 66 in the first device region 100. In one embodiment, the bottom surface of the first dielectric gate spacer 56 may be formed within the horizontal plane including the bottom surface of the first gate dielectric 50. A second dielectric gate spacer 256 can be formed in the second device region 200 in the same manner as illustrated in FIG. 6B.

Figure 24:
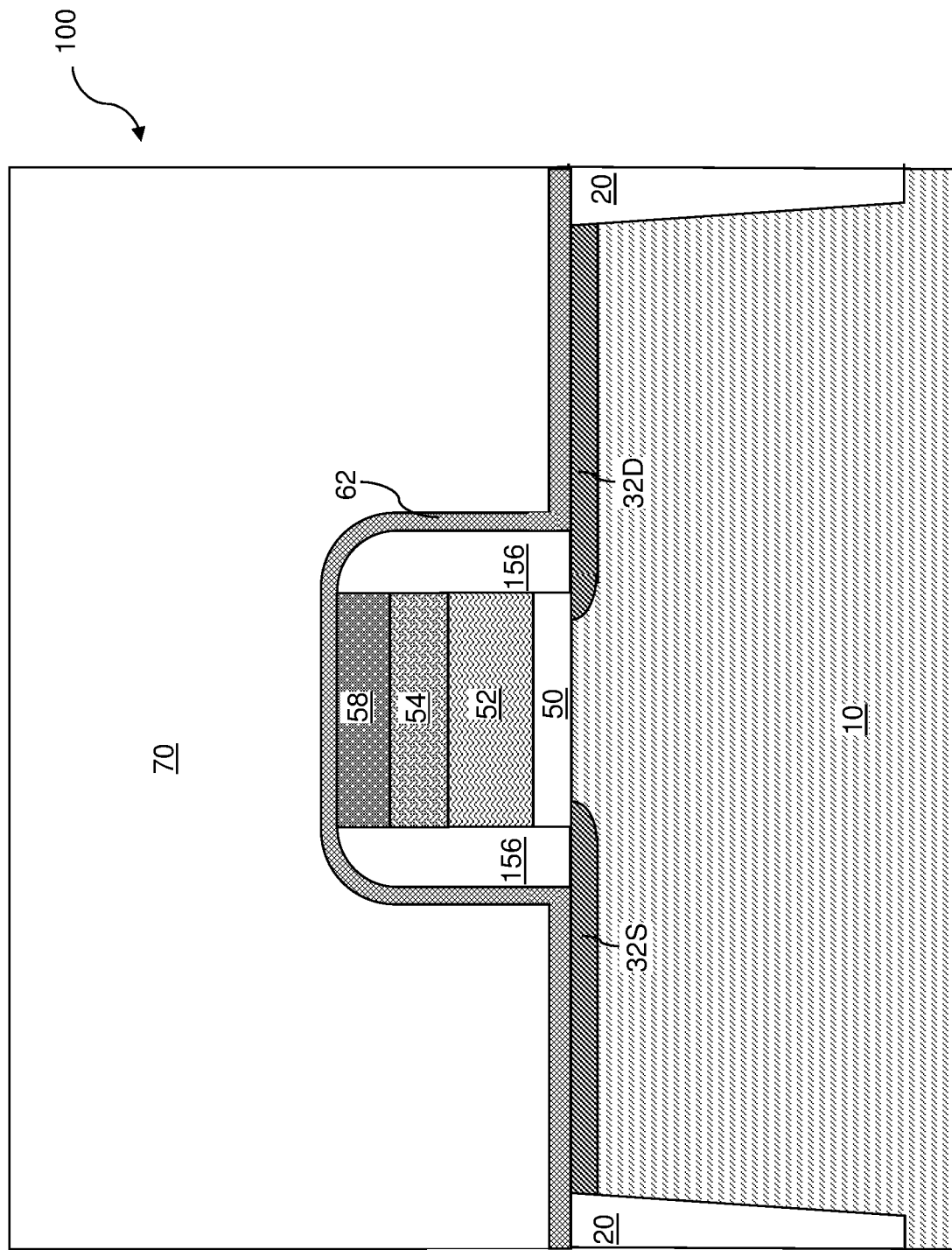
FIG. 24 is a vertical cross-sectional view of a first device region of a fourth exemplary structure after formation of a planarization dielectric layer according to an embodiment of the present disclosure.

Referring to FIG. 24, a dielectric liner 62 can be conformally deposited over the top surface of each source extension region 32S and a drain extension region 32D, an outer sidewall of each dielectric gate spacer (56, 256), and a top surface of each gate stack structure ((50 or 250), 52, 54, 58) in the first device region 100 and the second device region 200. The dielectric liner 62 can include a dielectric diffusion barrier material, such as silicon nitride. In one embodiment, the dielectric liner 62 may include a stress-inducing silicon nitride material that can induce tensile stress or compress stress in the channel regions, i.e., portions of the semiconductor substrate 10 that underlie a gate dielectric (50 or 250). The dielectric liner 62 can be deposited by a conformal deposition process such as a chemical vapor deposition process. The thickness of the dielectric liner 62 can be in a range from 5 nm to 100 nm, such as from 10 nm to 50 nm, although lesser and greater thicknesses may also be employed.

A planarization dielectric layer 70 can be formed over the dielectric liner 62. The planarization dielectric layer 70 can include a self-planarizing dielectric material such as flowable oxide (FOX) or a planarizable dielectric material such as undoped silicate glass or a doped silicate glass. In case the planarization dielectric layer 70 includes undoped silicate glass or a doped silicate glass, a top surface of the planarization dielectric layer 70 can be planarized by performing a chemical mechanical planarization process. The top surface of the planarization dielectric layer 70 may be vertically spaced above the topmost surface of the dielectric liner 62 by a vertical distance in a range from 100 nm to 1,000 nm, such as from 200 nm to 500 nm, although lesser and greater vertical spacings may also be employed.

Figure 25A:
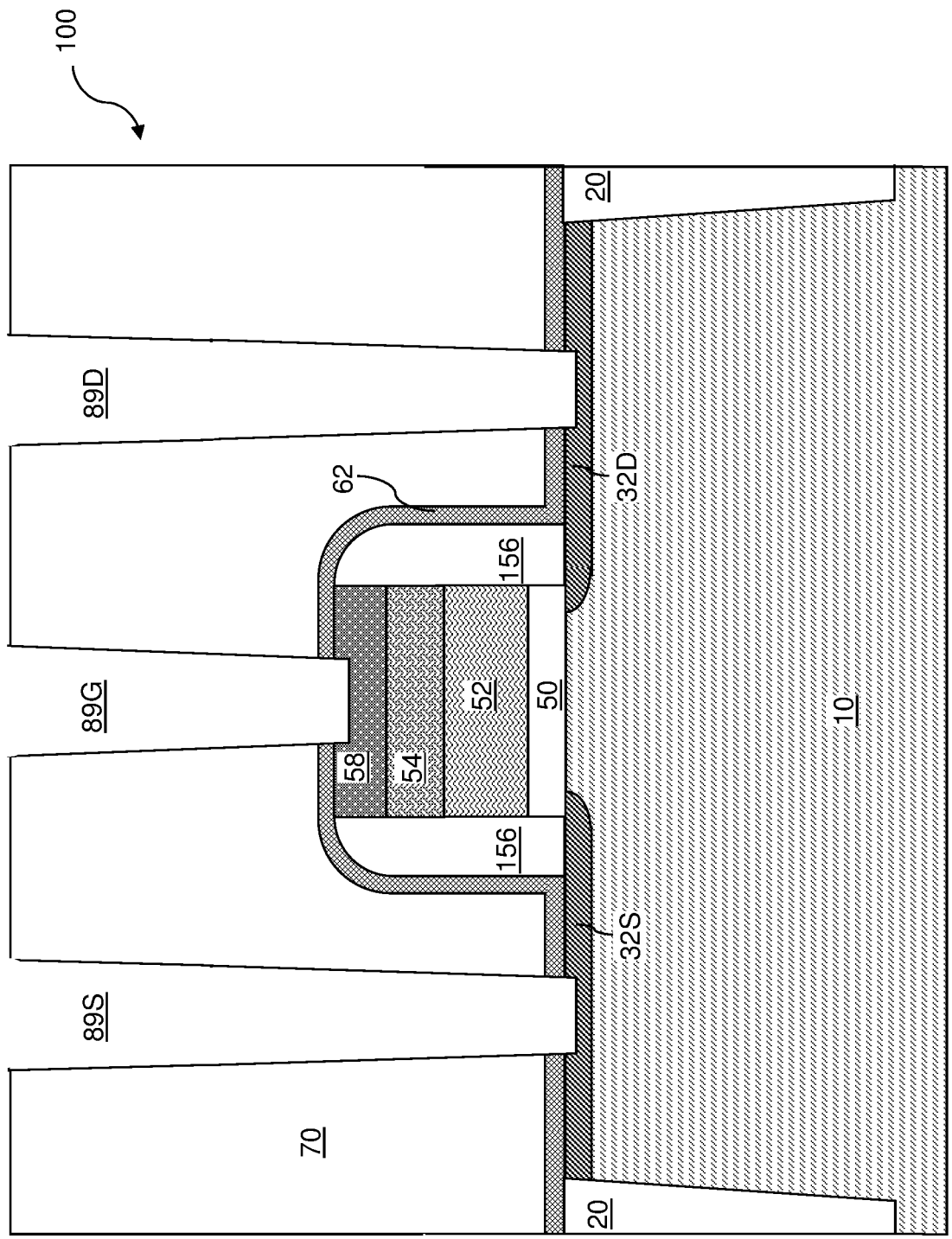
FIG. 25A is a vertical cross-sectional view of the first device region of the fourth exemplary structure after formation of contact via structures according to an embodiment of the present disclosure.
Figure 25B:
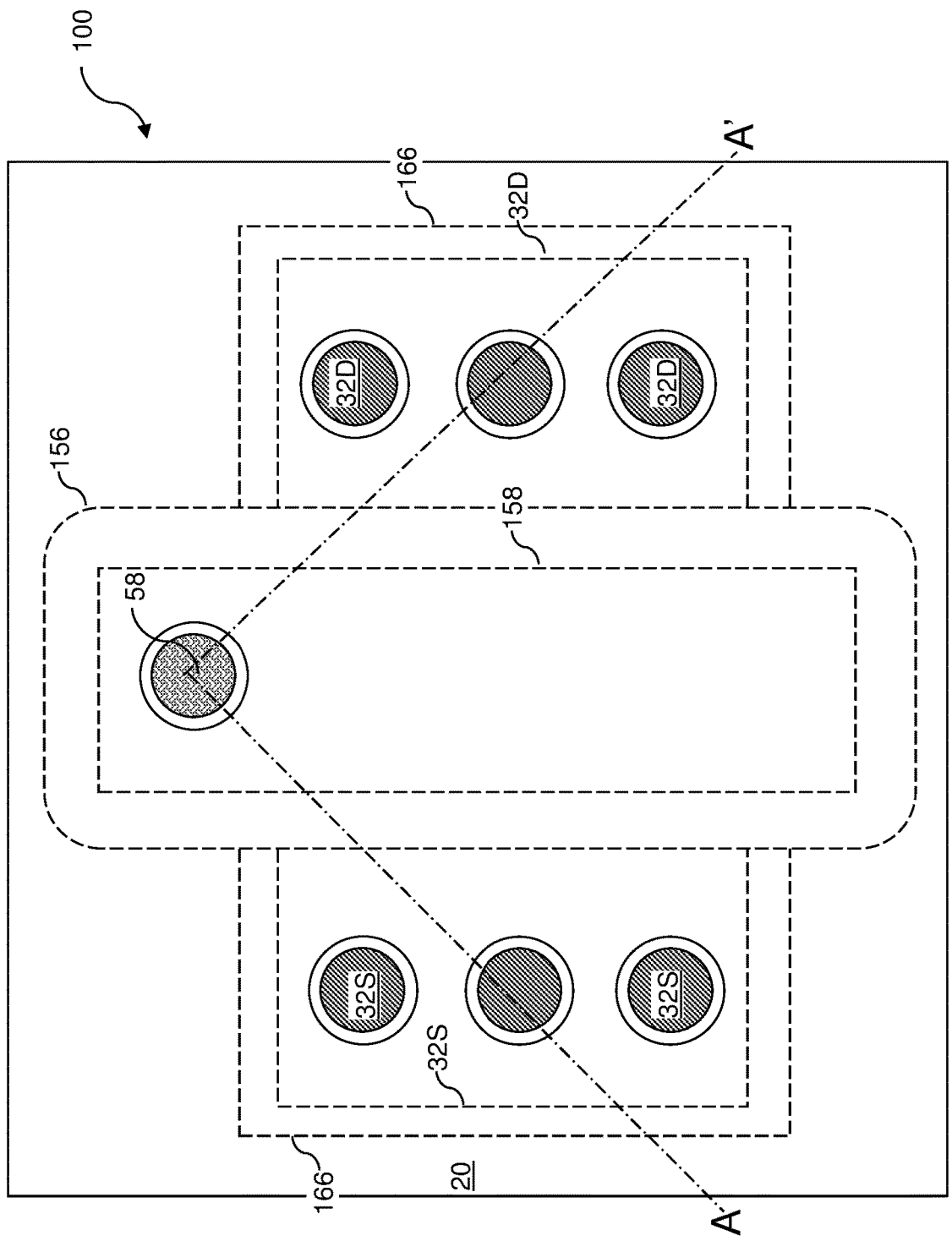
FIG. 25B is a partial see-through top-down view of the first device region of the fourth exemplary structure of FIG. 25A.

Referring to FIGS. 25A and 25B, via cavities (89S, 89D, 89G) can be formed through the planarization dielectric layer 70 and the dielectric liner 62 on each of the source extension regions 32S, the drain extension regions 32D, and the gate cap dielectric 58 located on the gate electrodes (52, 54). For example, a photoresist layer (not shown) can be applied over the planarization dielectric layer 70, and can be lithographically patterned to form discrete openings in areas that overlie the source extension regions 32S, the drain extension regions 32D, and the gate cap dielectric 58. Alternatively, the gate contact via cavity 89G can be extended through the gate cap dielectric 58 to the gate electrode (52, 54). An anisotropic etch process can be performed to transfer the pattern of the openings in the photoresist layer through the planarization dielectric layer 70 and the dielectric liner 62.

If both p-type and n-type transistors are formed, then the via cavities (89S, 89D) may extend through the dielectric liner 62 in one conductivity type of transistors (e.g., in n-type transistors), while the via cavities (89S, 89D) may stop on the dielectric liner 62 in the other conductivity type of transistors (e.g., in p-type transistors), such that subsequent epitaxial growth described below with respect to FIG. 26 occurs in the via cavities of only the first conductivity type transistors. The via cavities (89S, 89D) in the other conductivity type of transistors may be extended through the dielectric liner 62 after the epitaxial growth in the first conductivity type transistors, followed by separate epitaxial growth in the via cavities (89S, 89D) of the second conductivity type transistors.

Surfaces of the source extension regions 32S, the drain extension regions 32D, and the gate cap dielectric 58 are physically exposed underneath the via cavities (89S, 89D, 89G). The photoresist layer can be subsequently removed, for example, by ashing. Each of the via cavities (89S, 89D, 89G) may include a respective straight sidewall that vertically extends from the top surface of the planarization dielectric layer 70 at least to a top surface of respective one of the source extension regions 32S, the drain extension regions 32D, and the gate cap dielectric 58. In one embodiment, the via cavities (89S, 89D, 89G) may extend below the horizontal plane including the topmost surface of a respective one of the source extension regions 32S, the drain extension regions 32D, and the gate cap dielectric 58.

The via cavities (89S, 89D, 89G) can include at least one source contact via cavity 89S, at least one drain contact via cavity 89D, and at least one partially completed gate contact via cavity 89G. A surface of a source region 34S is physically exposed at the bottom of each source contact via cavity 89S. A surface of a drain region 34D is physically exposed at the bottom of each drain contact via cavity 89D. A surface of the gate cap dielectric 58 is physically exposed at the bottom of each gate contact via cavity 89G.

In one alternative embodiment, the gate contact via cavity 89G may extend through the gate cap dielectric 58 to expose the top surface of the gate electrode. For example, the gate electrode (52, 54) can include a vertical stack of a semiconductor gate electrode 52 and a metallic gate electrode 54 including a metallic material. In this case, a top surface of the metallic gate electrode 54 can be physically exposed at the bottom of each gate contact via cavity 89G. In another alternative embodiment, the at least one gate contact via cavity 89G can be formed in a subsequent processing step.

Figure 26:
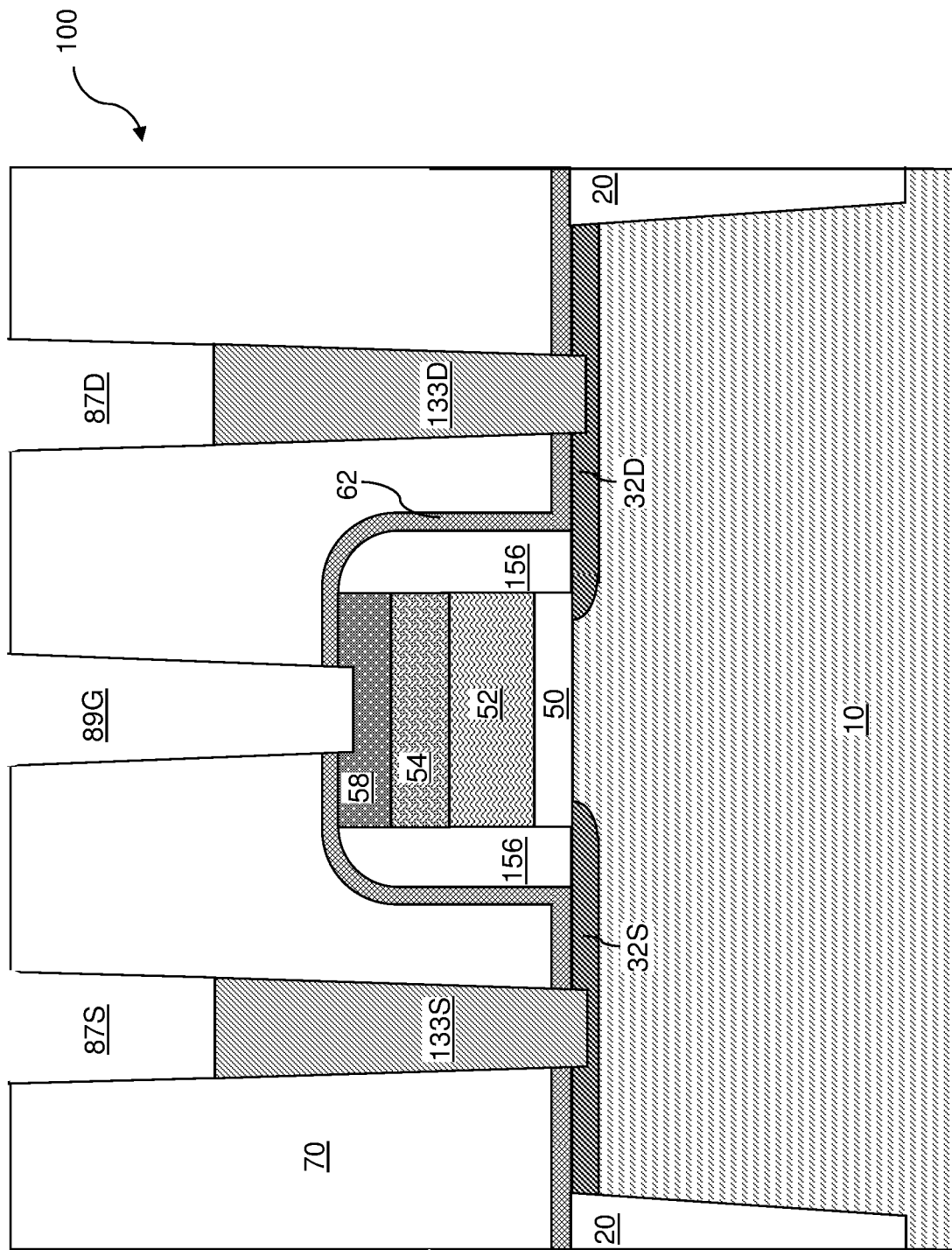
FIG. 26 is a vertical cross-sectional view of the first device region of the fourth exemplary structure after formation of semiconductor pillar structures according to an embodiment of the present disclosure.

Referring to FIG. 26, a selective semiconductor deposition process can be performed to grow a single crystalline or polycrystalline semiconductor material from each physically exposed semiconductor surface. Particularly, a single crystalline or polycrystalline semiconductor material (e.g., silicon) can be grown from the physically exposed semiconductor surfaces of the source extension region 32S and a drain extension region 32D. The semiconductor material does not grow from the exposed gate cap dielectric 58.

In one embodiment, the selective semiconductor deposition process may comprise a selective epitaxy process that grows single crystalline semiconductor materials from physically exposed semiconductor surfaces such as the physically exposed surfaces of the source extension region 32S and a drain extension region 32D in the first device region 100. In this case, the fourth exemplary structure can be placed within a vacuum enclosure of a selective epitaxy process chamber, and a precursor gas for depositing a semiconductor material and an etchant gas can be simultaneously or alternately flowed into the vacuum enclosure to effect the selective semiconductor deposition process. The precursor gas may include, for example, silane, disilane, dichlorosilane, trichlorosilane, germane, digermane, and/or other semiconductor precursor gases known in the art. The etchant gas may include, for example, gas phase hydrogen chloride. Epitaxial semiconductor material portions can grow from the physically exposed portions of the source extension region 32S and a drain extension region 32D in the first device region 100.

In one embodiment, epitaxial semiconductor material portions can be formed by growing a single crystalline semiconductor material from the physically exposed surfaces of the source extension region 32S and a drain extension region 32D in the first device region 100. In one embodiment, the epitaxial semiconductor material portions can have a doping of a same conductivity type as the source extension region 32S and the drain extension region 32D, i.e., a doping of the second conductivity type. In this case, the single crystalline semiconductor material can be grown with in-situ doping with dopants of the second conductivity type.

The epitaxial semiconductor material portions are pillar-shaped, are narrower than the source extension region 32S and a drain extension region 32D, and can function as vertically-extending extensions of the source extension region 32S and the drain extension region 32D. Thus, each epitaxial semiconductor material portion formed in the source contact via cavity 89S is herein referred to as a source extension pillar structure 133S, and each epitaxial semiconductor material portion formed in the drain contact via cavity 89D is herein referred to as a drain extension pillar structure 133D. The source extension pillar structure(s) 133S and the drain extension pillar structure(s) 133D are collectively referred to as extension pillar structures (133S, 133D).

The growth of the semiconductor material occurs only from semiconductor surfaces during the selective epitaxy process. Thus, no semiconductor material is deposited in the gate contact via cavity/cavities 89G from the exposed gate cap dielectric 58. The duration of the selective epitaxy process can be selected such that the height of the extension pillar structures (133S, 133D) is in a range from 50 nm to 1,000 nm, such as from 100 nm to 500 nm, although lesser and greater heights may also be employed. The top surfaces of the extension pillar structures (133S, 133D) may be formed above, at, or below the horizontal plane including the topmost surface of the gate stack structure (50, 52, 54, 58). The top surfaces of the extension pillar structures (133S, 133D) may be located above, at, or below the horizontal plane including the top surface of the gate stack structure (50, 52, 54, 58).

The extension pillar structures (133S, 133D) may include dopants of the second conductivity type at an atomic concentration that may be the same as, or may be different from, the atomic concentration of dopants of the second conductivity type within the source extension region 32S and the drain extension region 32D. For example, the extension pillar structures (133S, 133D) may include dopants of the second conductivity type at an atomic concentration in a range from $1.0 \times 10^{18}/cm^3$ to $1.0 \times 10^{20}/cm^3$, such as from $5.0 \times 10^{18}/cm^3$ to $5.0 \times 10^{19}/cm^3$, although lesser and greater atomic concentrations can also be employed.

The semiconductor material of the extension pillar structures (133S, 133D) (i.e., the material composition excluding dopants) may be the same as, or may be different, from the semiconductor material of the source extension region 32S and the drain extension region 32D. For example, if the source extension region 32S and the drain extension region 32D include a respective a single crystalline silicon portion having a doping of the second conductivity type, the extension pillar structures (133S, 133D) may include a respective single crystalline silicon portion having a doping of the second conductivity type or a respective single crystalline silicon-germanium portion having a doping of the second conductivity type. The single crystalline semiconductor material of the extension pillar structures (133S, 133D) can be epitaxially aligned to the single crystalline semiconductor material of the source extension region 32S and the drain extension region 32D. A source-side cavity 87S is present over each source extension pillar structure 133S, and a drain-side cavity 87D is present over each drain extension pillar structure 133D.

Figure 27A:
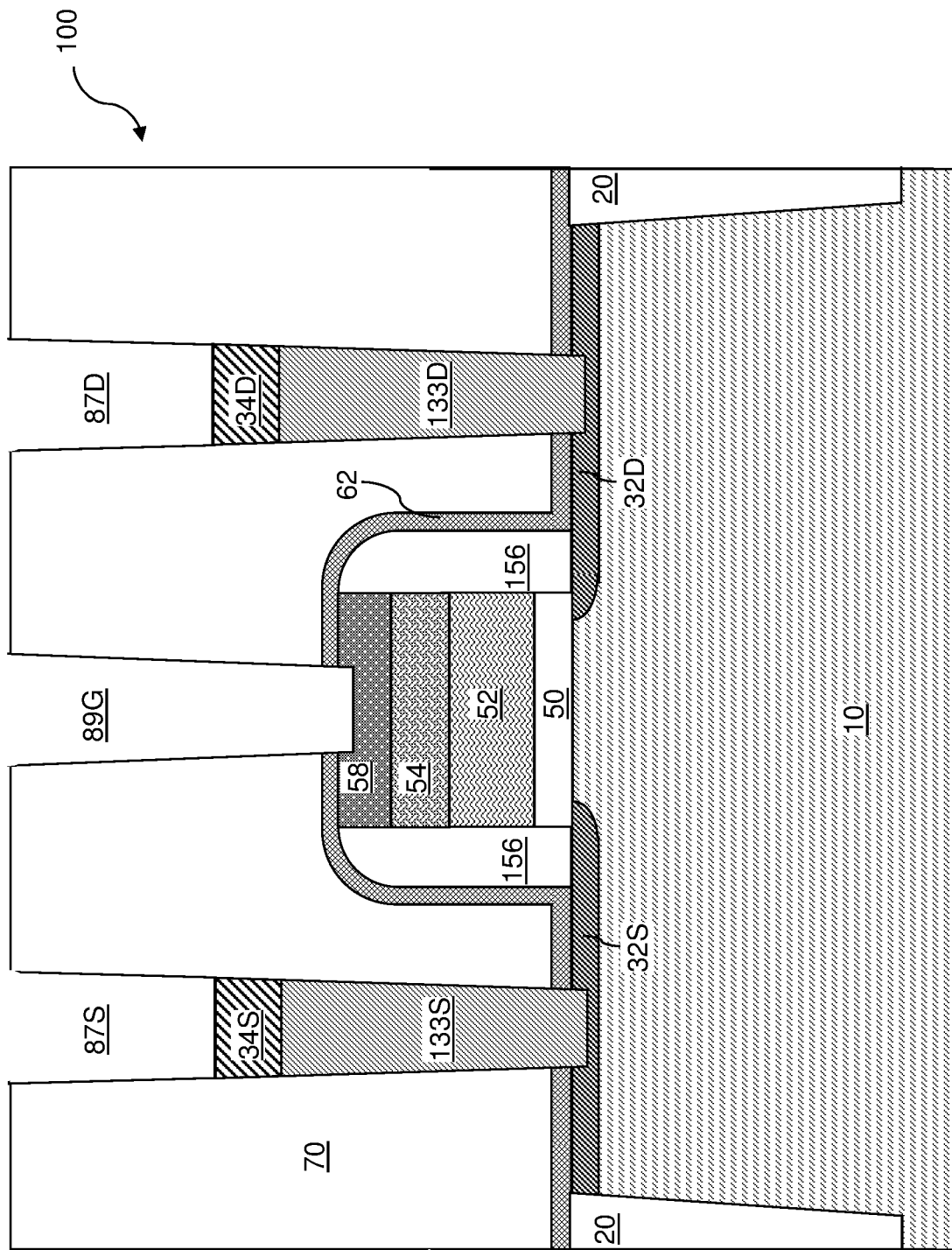
FIG. 27A is a vertical cross-sectional view of the first device region of the fourth exemplary structure after formation of a source region and a drain region according to an embodiment of the present disclosure.
Figure 27B:
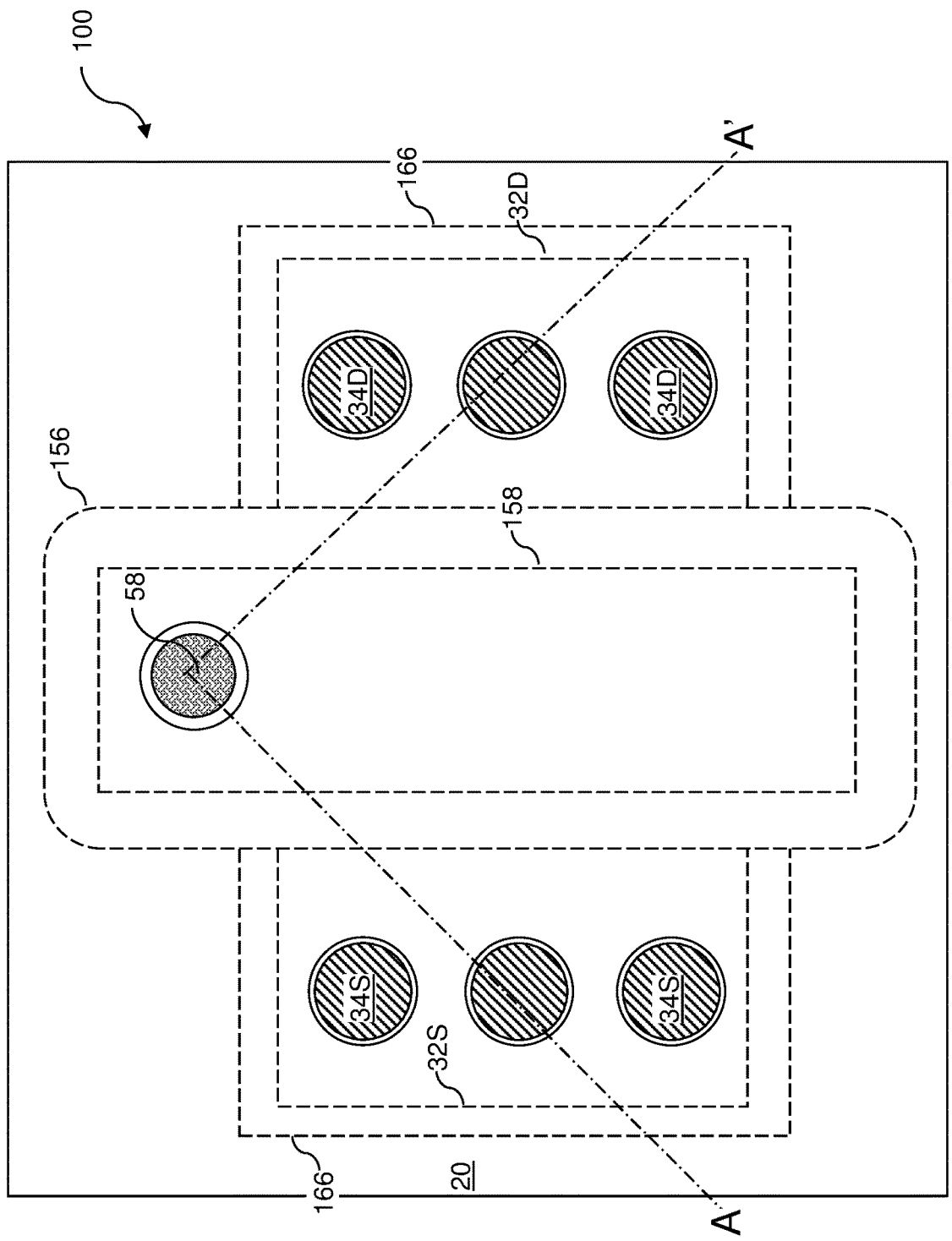
FIG. 27B is a partial see-through top-down view of the first device region of the fourth exemplary structure of FIG. 27A.

Referring to FIGS. 27A and 27B, dopants of the second conductivity type can be implanted into upper portions of the extension pillar structures (133S, 133D) or by epitaxially growing additional single crystal semiconductor material doped with a higher concentration of dopants of the second conductivity type on the upper portions of the extension pillar structures (133S, 133D). For example, an ion implantation process may be employed to introduce dopants of the second conductivity type into the upper portions of the extension pillar structures (133S, 133D). In case p-type transistors and n-type transistors are formed on the semiconductor substrate 10, masked ion implantation processes may be employed to implant dopants of different conductivity type into different field effect transistors.

Generally, each source region 34S and each drain region 34D can include dopants of a respective second conductivity type at an atomic concentration that is greater than the atomic concentration of dopants in the extension pillar structures (133S, 133D). For example, each source region 34S and each drain region 34D can include dopants of a respective second conductivity type at an atomic concentration in a range from $5.0 \times 10^{18}/cm^3$ to $2.0 \times 10^{21}/cm^3$, m, such as from $1.0 \times 10^{20}/cm^3$ to $1.0 \times 10^{21}/cm^3$, although lesser and greater atomic concentrations can also be employed. The thickness of the source region 34S and the drain region 34D in each first device region 100 may be in a range from 50 nm to 300 nm, although lesser and greater thicknesses may also be employed. Unimplanted portions of the extension pillar structures (133S, 133D) remain as the extension pillar structures (133S, 133D).

Generally, a pair of doped semiconductor material portions (such as the extension pillar structures (133S, 133D) as formed at the processing steps of FIG. 26) can be deposited on physically exposed surfaces of the source extension region 32S and the drain extension region 32D in a pair of via cavities that includes a source contact via cavity 87S and a drain contact via cavity 87D. Dopants of the second conductivity type can be implanted into upper portions of the pair of doped semiconductor material portions. Implanted regions of the pair of doped semiconductor material portions comprise a source region 34S and a drain region 34D. Unimplanted regions of the pair of doped semiconductor material portions comprise a source extension pillar structure 133S and the drain extension pillar structure 133D. In case multiple source contact via cavities 89S are formed on the source extension region 32S or multiple drain contact via cavities 89D are formed on the drain extension region 32D in the first device region 100, multiple pairs of a source extension pillar structure 133S and a source region 34S and/or multiple pairs of a drain extension pillar structure 133D and a drain region 34D can be formed in the first device region 100.

In one embodiment, the source extension region 32S and the drain extension region 32D in the first device region 100 can be single crystalline, and doped semiconductor material portions (such as the extension pillar structures (133S, 133D) as formed at the processing steps of FIGS. 26A and 26B) can be formed by a selective epitaxy process that grows the doped semiconductor material portions as single crystalline semiconductor material portions in epitaxial alignment with the source extension region 32S and the drain extension region 32D. Generally, each source extension pillar structure 133S, each drain extension pillar structure 133D, each source region 34S, and each drain region 34D can be formed in at least one source contact via cavity 89S and at least one drain contact via cavity 89D by selective deposition and doping of a semiconductor material without deposition of any semiconductor material in the gate contact via cavity 89G.

Figure 28A:
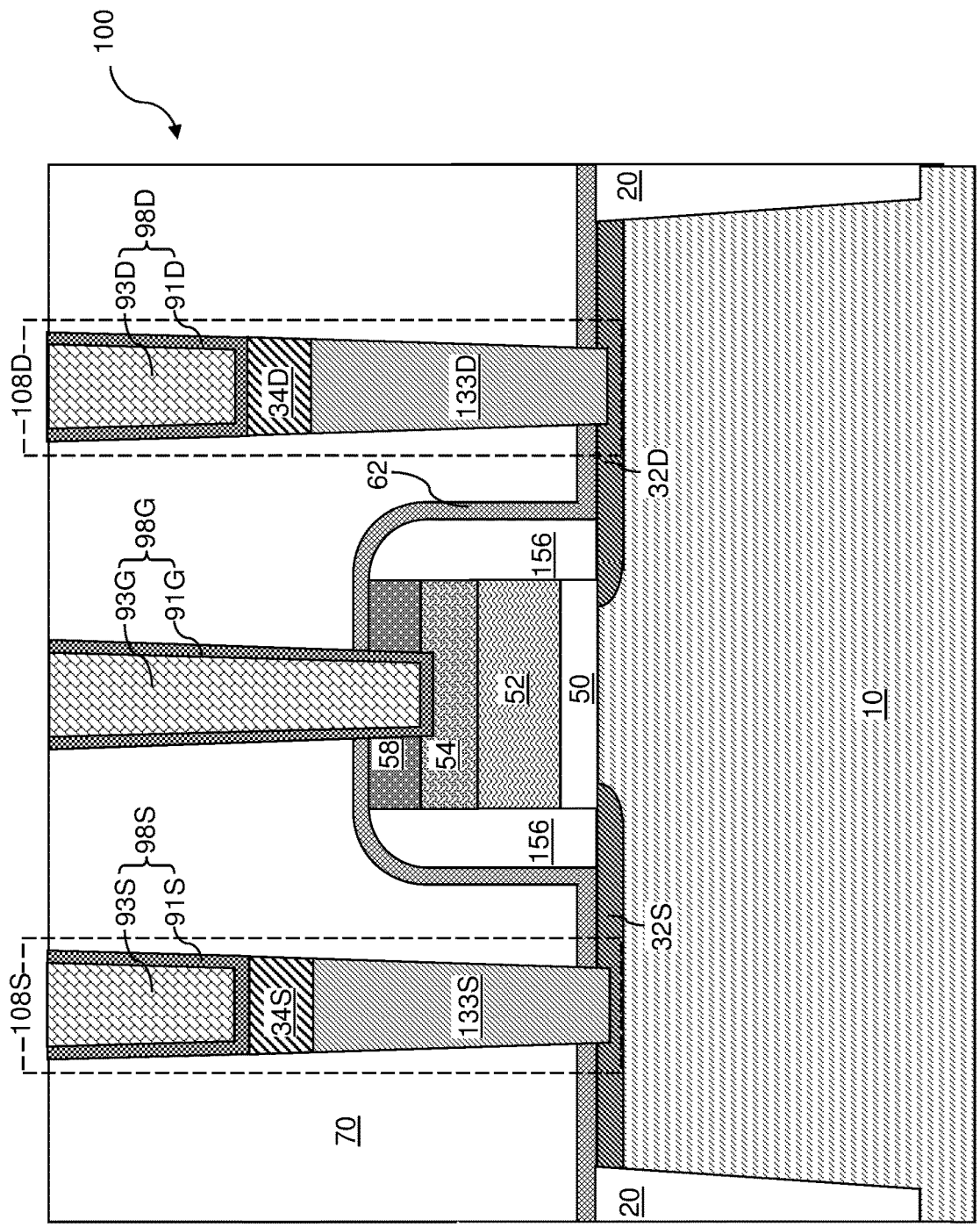
FIG. 28A is a vertical cross-sectional view of the first device region of the fourth exemplary structure after formation of metallic contact via structures according to an embodiment of the present disclosure.
Figure 28B:
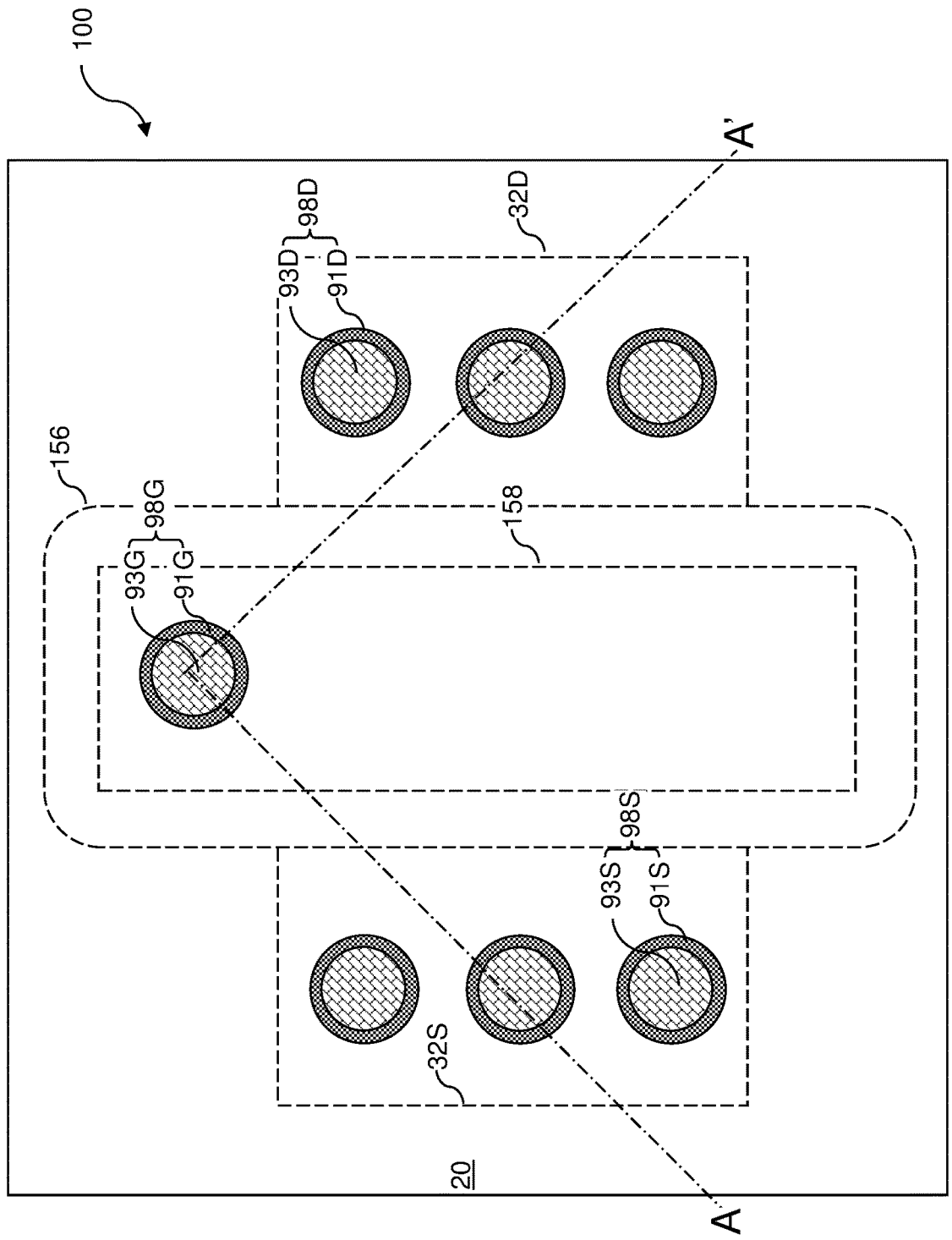
FIG. 28B is a partial see-through top-down view of the first device region of the fourth exemplary structure of FIG. 28A.

Referring to FIGS. 28A and 28B, if the gate contact via cavity 89G extends only to the gate cap dielectric 58, then the gate contact via cavity 89G is further etched (e.g., by RIE) to extend the gate contact via cavity 89G through the gate cap dielectric 58 to the top surface of the gate electrode (52, 54). At least one conductive material can be deposited in the unfilled volumes of the via cavities to form various metallic via structures (98S, 98D, 98G). For example, a metallic liner (such as a conductive metal nitride liner including TiN, TaN, or WN) and a metallic fill material (such as W, Ti, Co, Cu, Ru, or Al) may be sequentially deposited in the via cavities, and excess portions of the metallic liner and the metallic fill material can be removed from above the planarization dielectric layer 70 by a planarization process such as chemical mechanical planarization or a recess etch. Each contiguous set of remaining metallic material portions constitutes a metallic via structure (98S, 98D, or 98G). For example, the metallic via structures (98S, 98D, 98G) can include a source contact via structure 98S (i.e., source electrode) that includes a source metallic liner 91S and a source metallic fill material portion 93S, a drain contact via structure 98D (i.e., drain electrode) that includes a drain metallic liner 91D and a drain metallic fill material portion 93D, and a gate contact via structure 98G (i.e., gate contact) that includes a gate metallic liner 91G and a gate metallic fill material portion 93G. The source contact via structure 98S contacts a top surface of a source region 34S, the drain contact via structure 98D contacts a top surface of a drain region 34D, and a gate contact via structure 98G contacts a top surface of a gate electrode (52, 54).

A first conductive pillar structure 108S can be formed within each source contact via cavity 87S, and a second conductive pillar structure 108D can be formed within each drain contact via cavity 87D. Each first conducive via structure 108S may include a vertical stack including, from bottom to top, a source extension pillar structure 133S, a source region 34S, and a source contact via structure 98S. Each second conducive via structure 108D may include a vertical stack including, from bottom to top, a drain extension pillar structure 133D, a drain region 34D, and a drain contact via structure 98D.

In one embodiment, a plurality of first conductive pillar structure 108S may be formed on a source extension region 32S, and a plurality of second conductive pillar structures 108D may be formed on a drain extension region 32D.

FIGS. 28A and 28B illustrate an embodiment in which a first device region 100 includes three first conductive pillar structure 108S and three second conductive pillar structures 108D.

Figure 29:
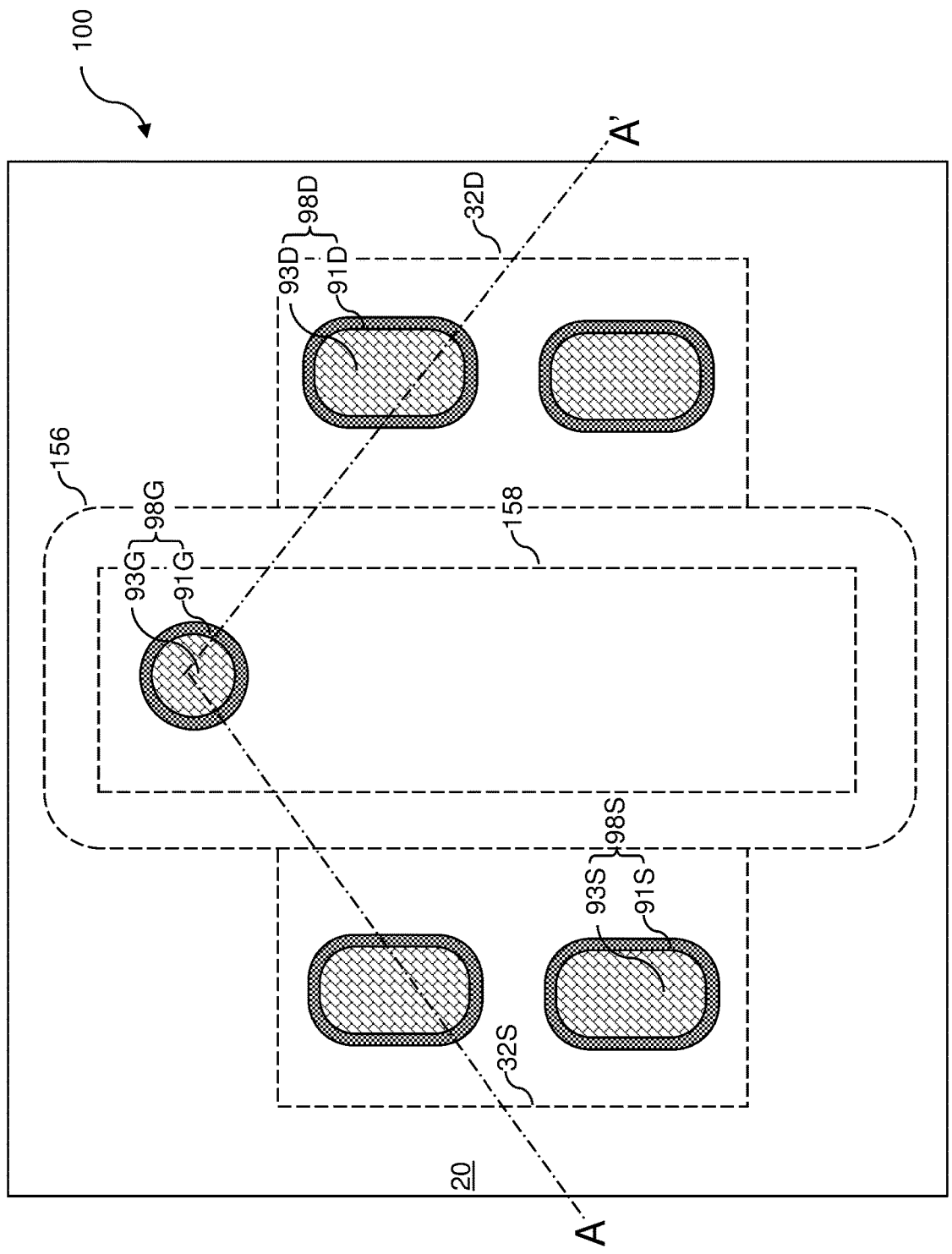
FIG. 29 is a partial see-through top-down view of a first alternative configuration of the fourth exemplary structure.

Referring to FIG. 29, a partial see-through top-down view of a first alternative configuration of the fourth exemplary structure is illustrated. A first device region 100 includes two elongated first conductive pillar structure 108S and two second conductive pillar structures 108D. A vertical cross-sectional view along the hinged plane A-A' can be the same as the view illustrated in FIG. 28A.

Figure 30A:
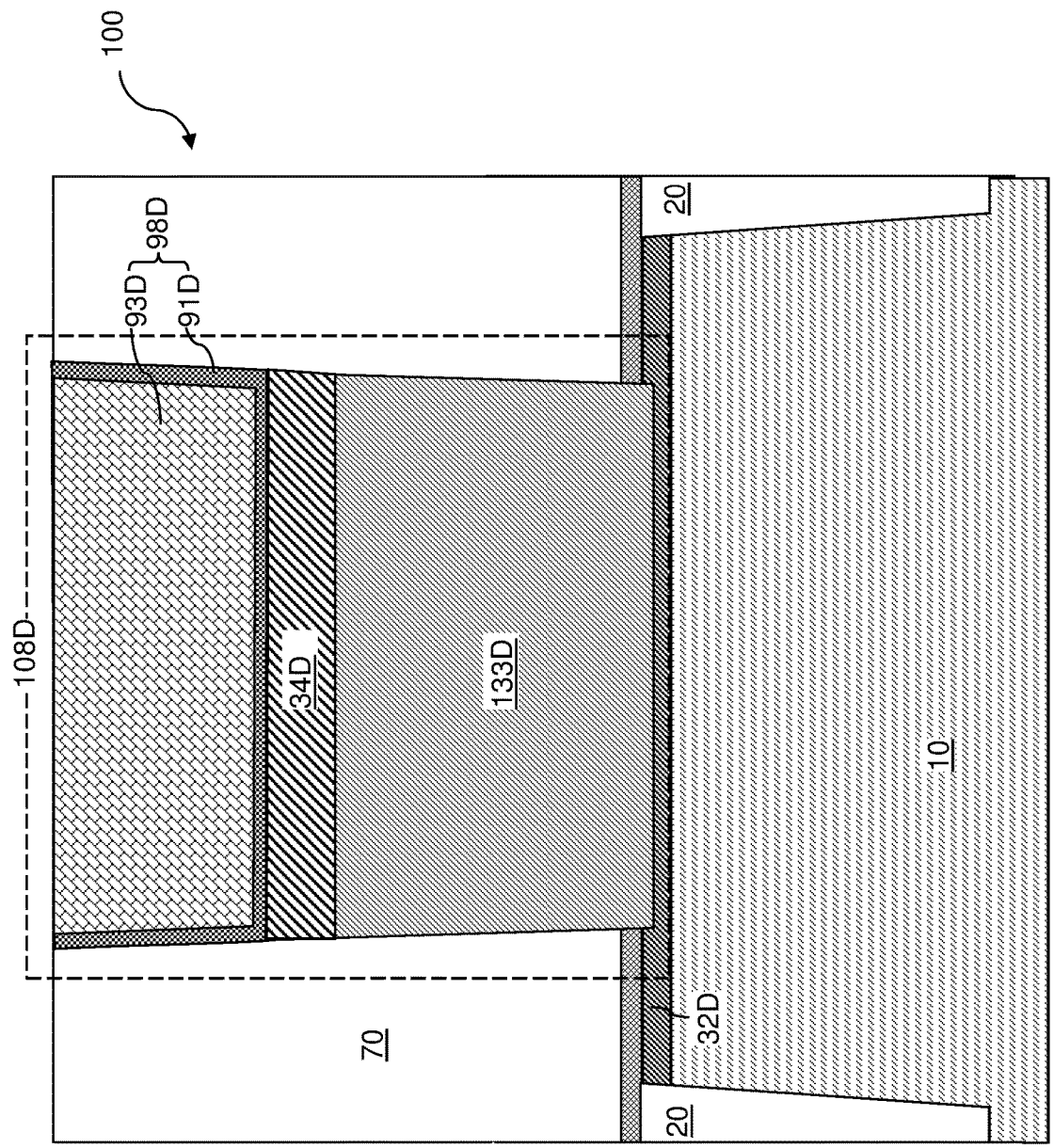
FIG. 30A is a vertical cross-sectional view of a second alternative configuration of the fourth exemplary structure along plane A-A' in FIG. 30B.
Figure 30B:
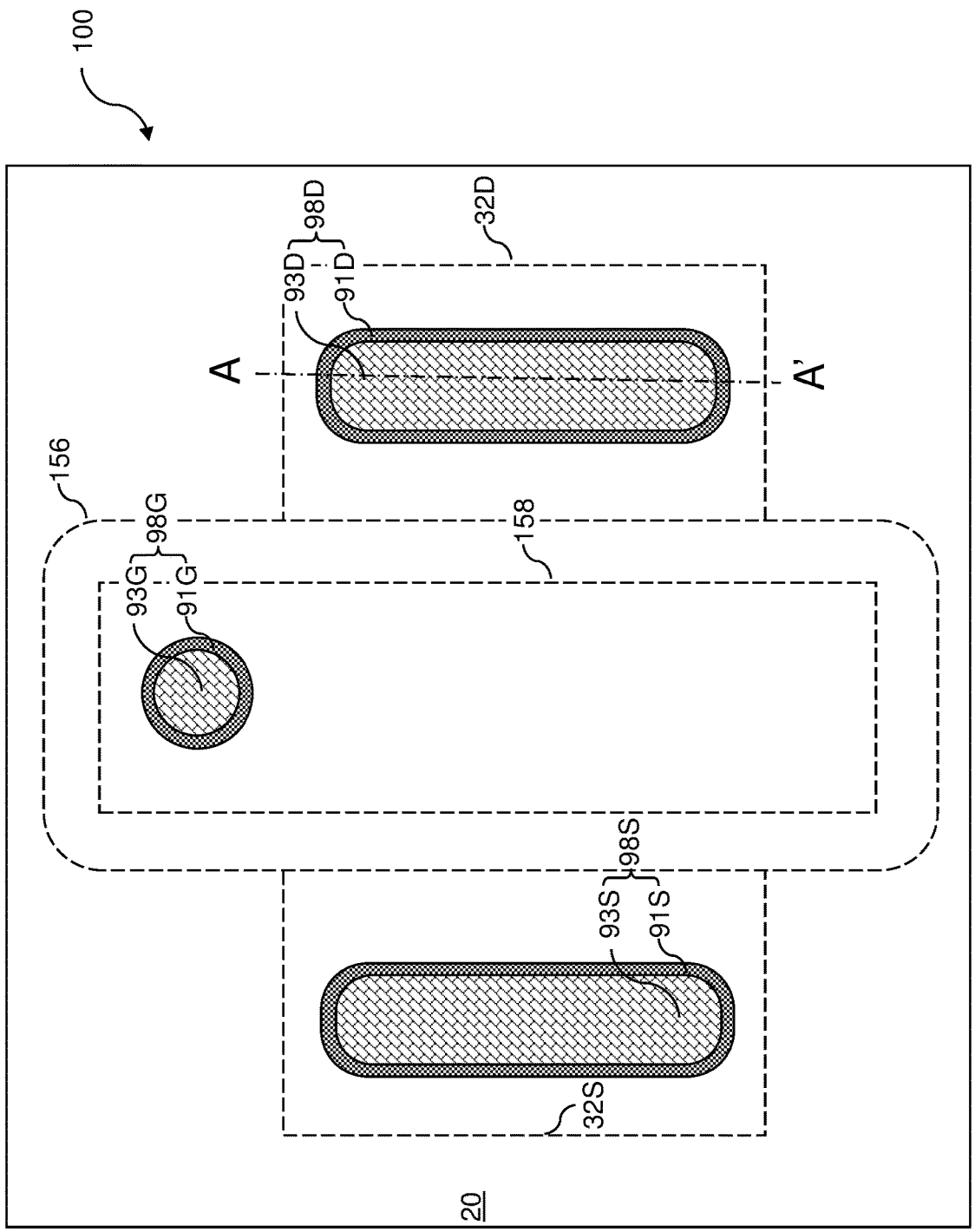
FIG. 30B is a partial see-through top-down view of a second alternative configuration of the fourth exemplary structure.

Referring to FIGS. 30A and 30B, a respective vertical cross-sectional and partial see-through top-down view of a second alternative configuration of the fourth exemplary structure are illustrated. A first device region 100 includes one elongated first conductive pillar structure 108S and one second conductive pillar structures 108D.

Figure 31A:
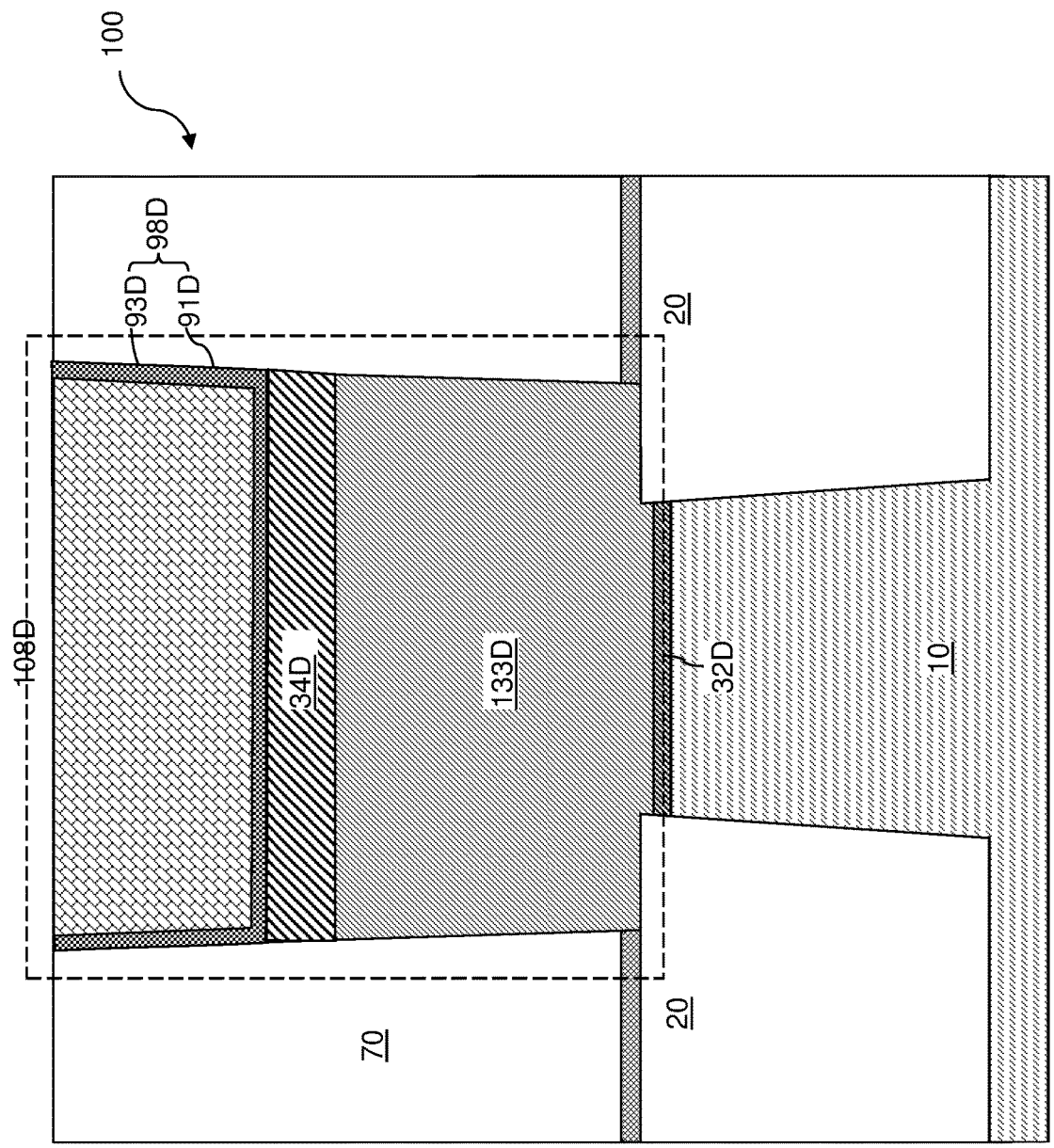
FIG. 31A is a vertical cross-sectional view of a third alternative configuration of the fourth exemplary structure along plane A-A' in FIG. 31B.
Figure 31B:
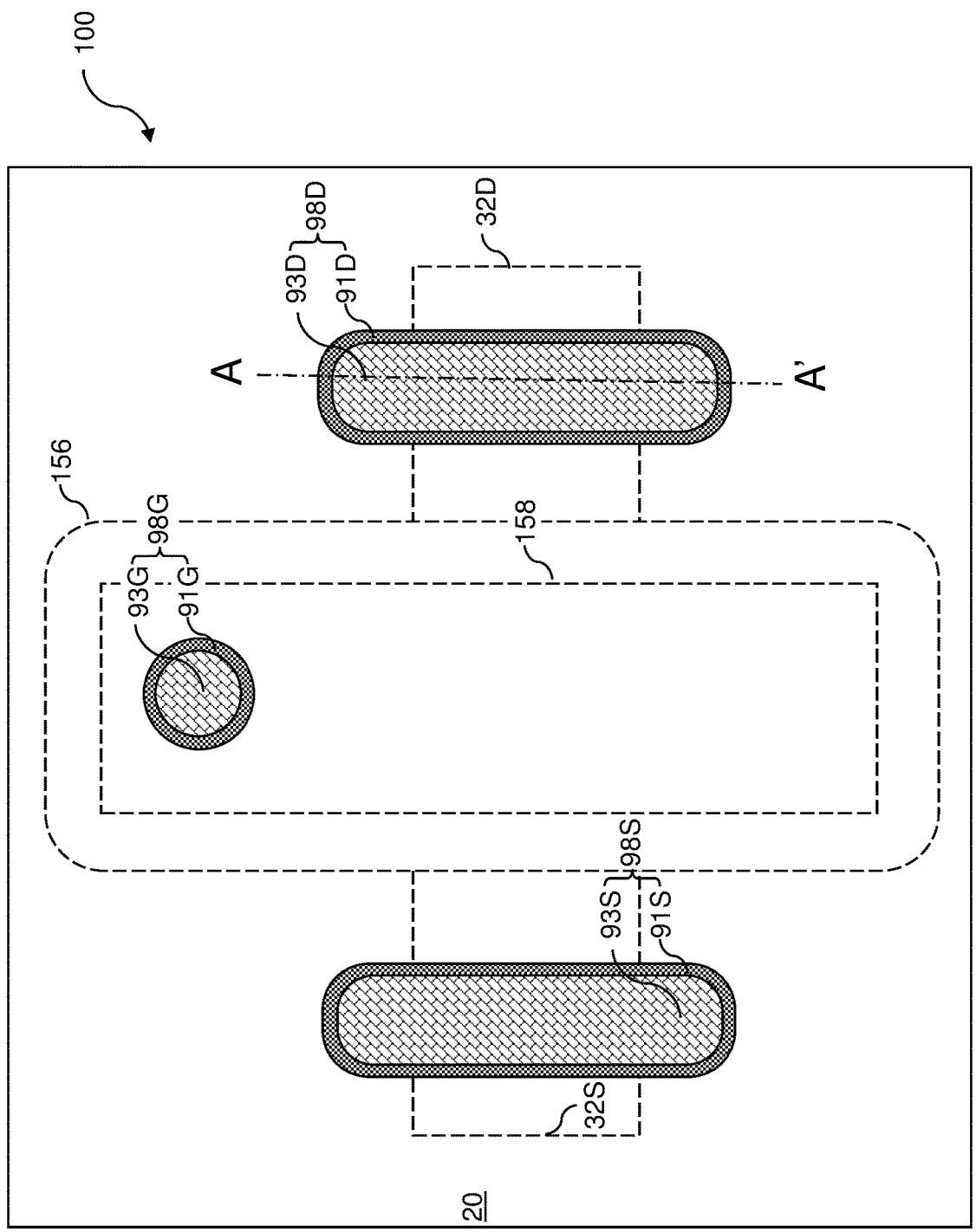
FIG. 31B is a partial see-through top-down view of the third alternative configuration of the fourth exemplary structure.

Referring to FIGS. 31A and 31B, a respective vertical cross-sectional and partial see-through top-down view of a third alternative configuration of the fourth exemplary structure are illustrated. The third alternative configuration differs from the second alternative configuration in that the elongated first and second conductive pillar structures (108S, 108D) have a length along the elongation direction that is greater than the length of the respective source and drain extension regions (32S, 32D) along the same direction. The elongation direction may be perpendicular to the direction between the respective source and drain extension regions (32S, 32D). In this configuration the extension pillar structures (133S, 133D) are epitaxially grown from the respective source and drain extension regions (32S, 32D) and extend laterally over the shallow trench isolation structures 20 in the elongation direction.

FIGS. 32A to 32G illustrate vertical cross-sectional views of the first device region 100 during steps of forming of a fourth alternative configuration of the fourth exemplary structure. In this fourth alternative configuration, polycrystalline semiconductor material is deposited into the via cavities instead of epitaxially growing single crystalline semiconductor material in the via cavities.

Figure 32A:
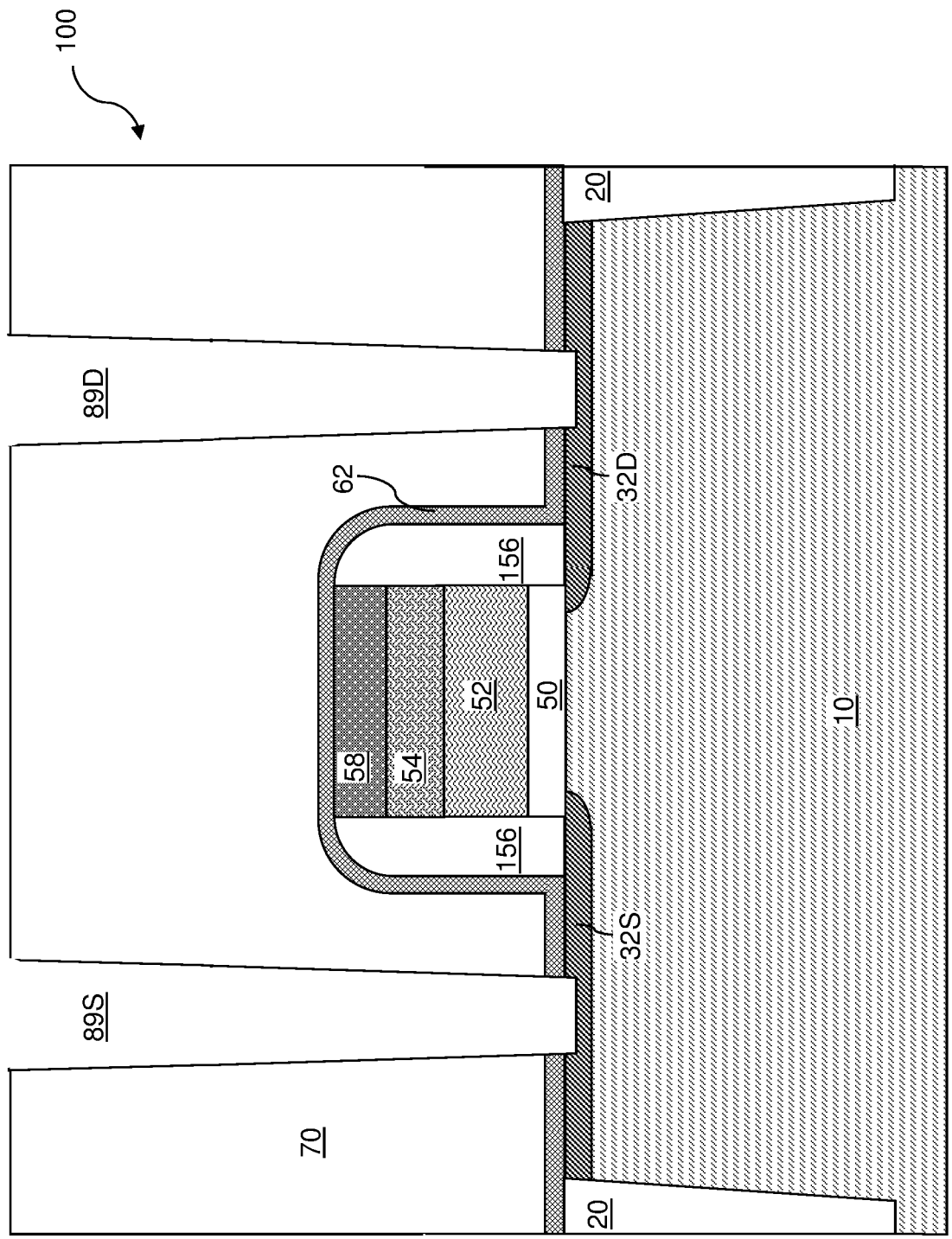
FIGS. 32A to 32G illustrate vertical cross-sectional views of the first device region during steps of forming of a fourth alternative configuration of the fourth exemplary structure.

FIG. 32A shows the first device region 100 which can be derived from the structure shown in FIG. 25A, except that the gate contact via cavity 89G is not formed in the structure of FIG. 32A.

Figure 32B:
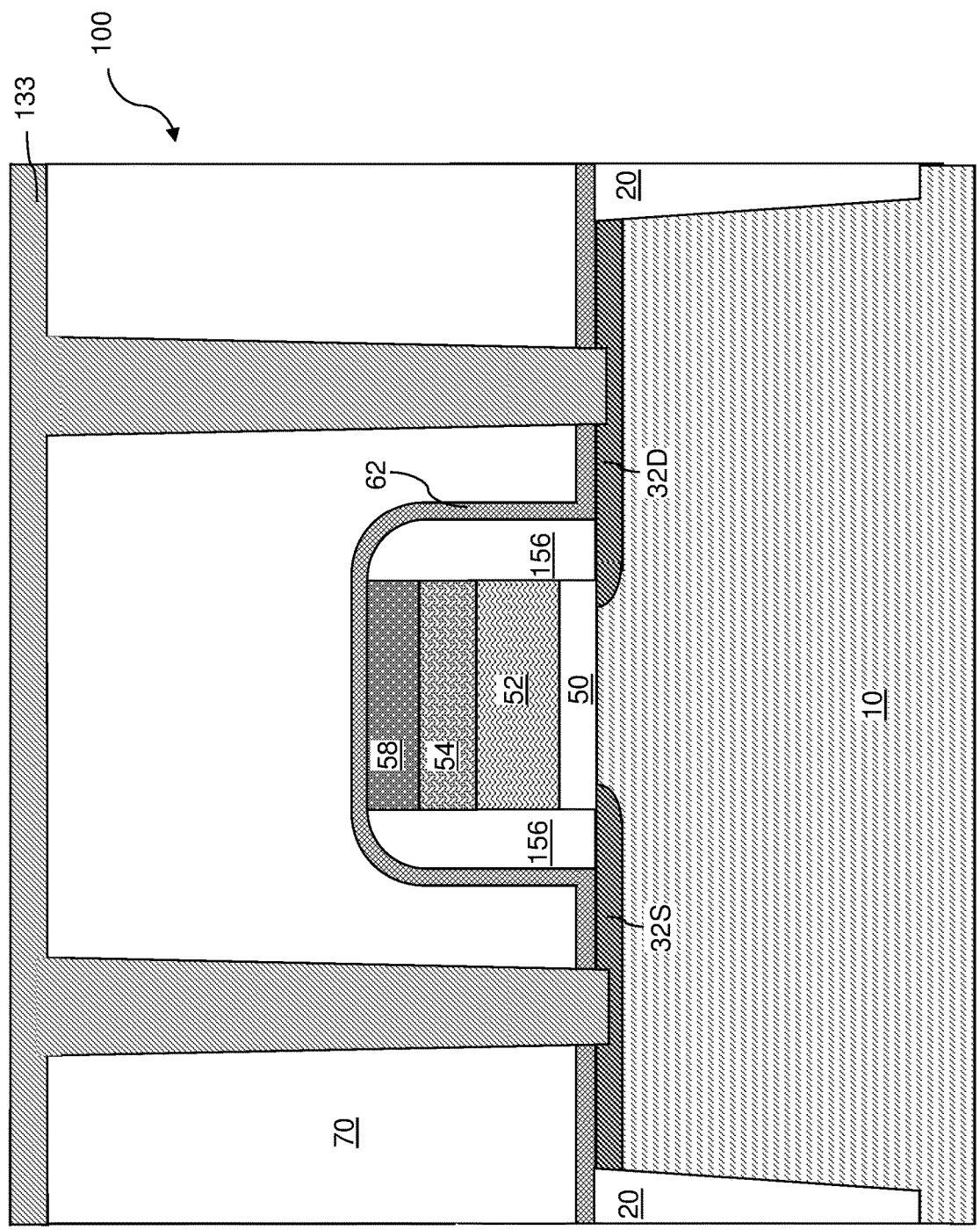

Referring to FIG. 32B, a lightly doped polycrystalline semiconductor material layer 133 is deposited into the source and drain via cavities (89S, 89D) and over the planarization dielectric layer 70. The lightly doped polycrystalline semiconductor layer 133 may comprise a lightly doped polysilicon layer of the second conductivity type.

Figure 32C:
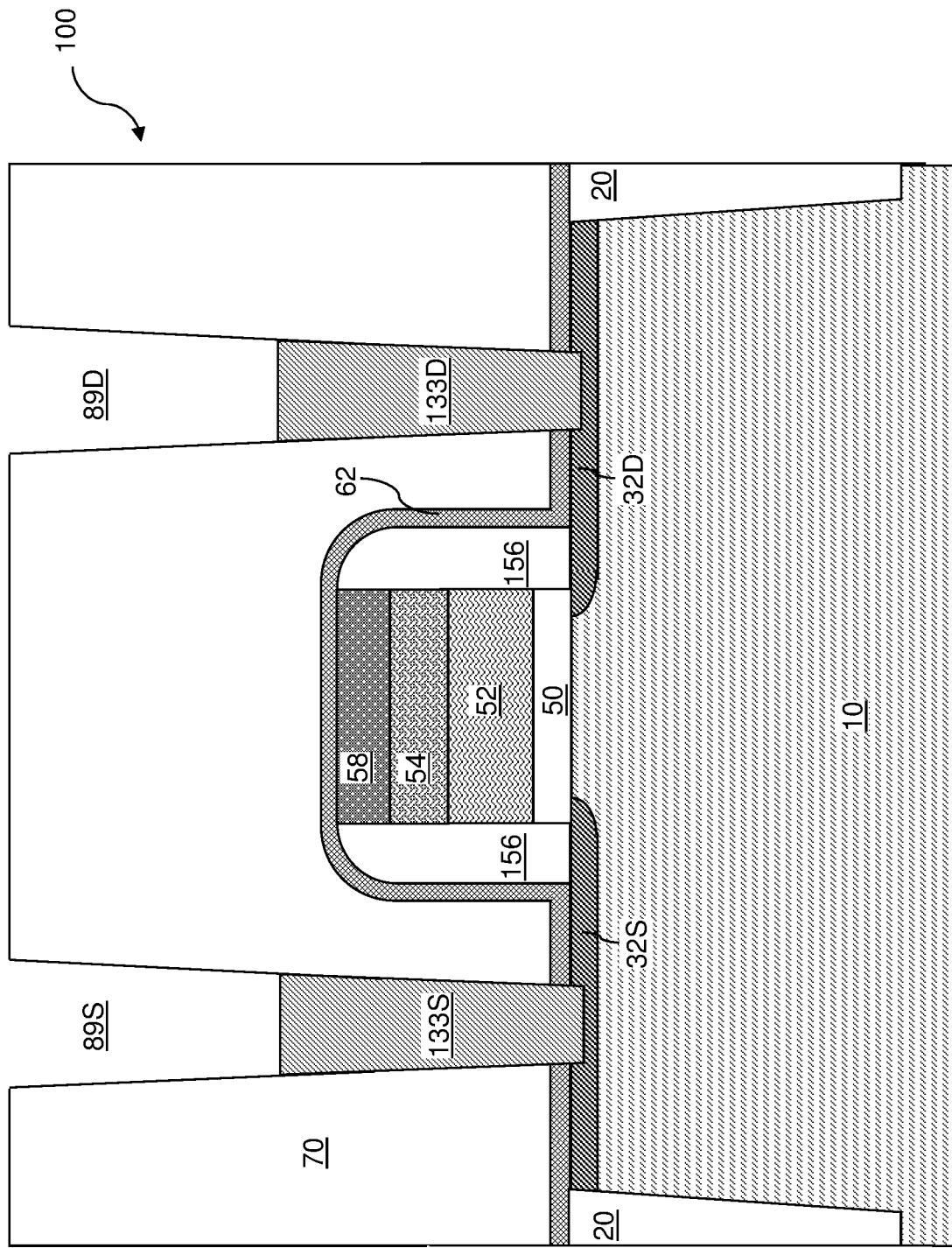

Referring to FIG. 32C, the lightly doped polycrystalline semiconductor material layer 133 is etched back using selective etching to remove layer 133 from above the planarization dielectric layer 70 and to partially remove layer 133 from the source and drain via cavities (89S, 89D). The remaining portions of layer 133 in the source and drain via cavities (89S, 89D) constitute the respective source and drain extension pillar structures (133S, 133D), respectively, similar to the structure shown in FIG. 26 and described above.

Figure 32D:
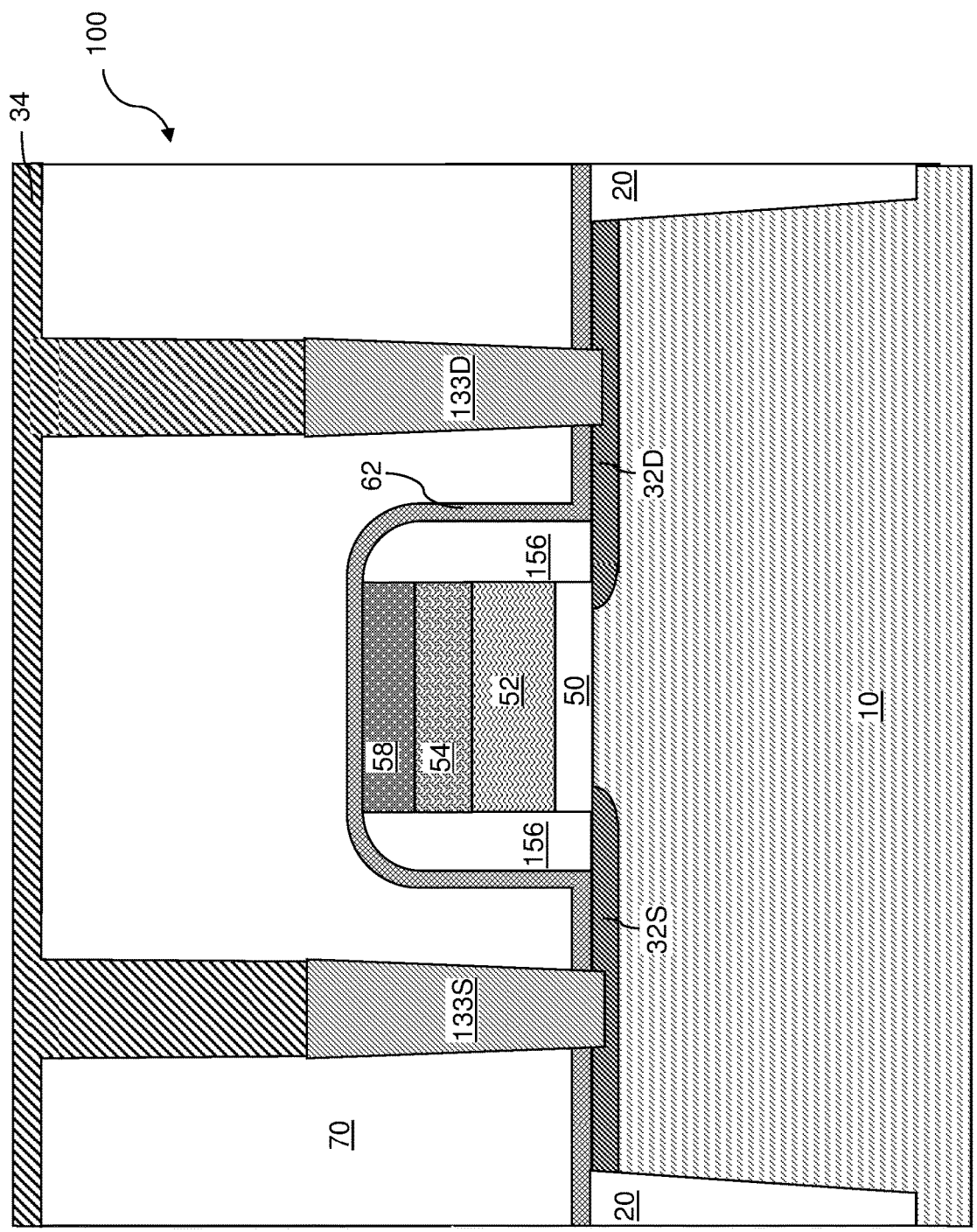

Referring to FIG. 32D, a heavily doped polycrystalline semiconductor material layer 34 is deposited into the remaining portions of the source and drain via cavities (89S, 89D) and over the planarization dielectric layer 70. The heavily doped polycrystalline semiconductor layer 34 may comprise a heavily doped polysilicon layer of the second conductivity type having a higher doping concentration of the second conductivity type than layer 133.

Figure 32E:
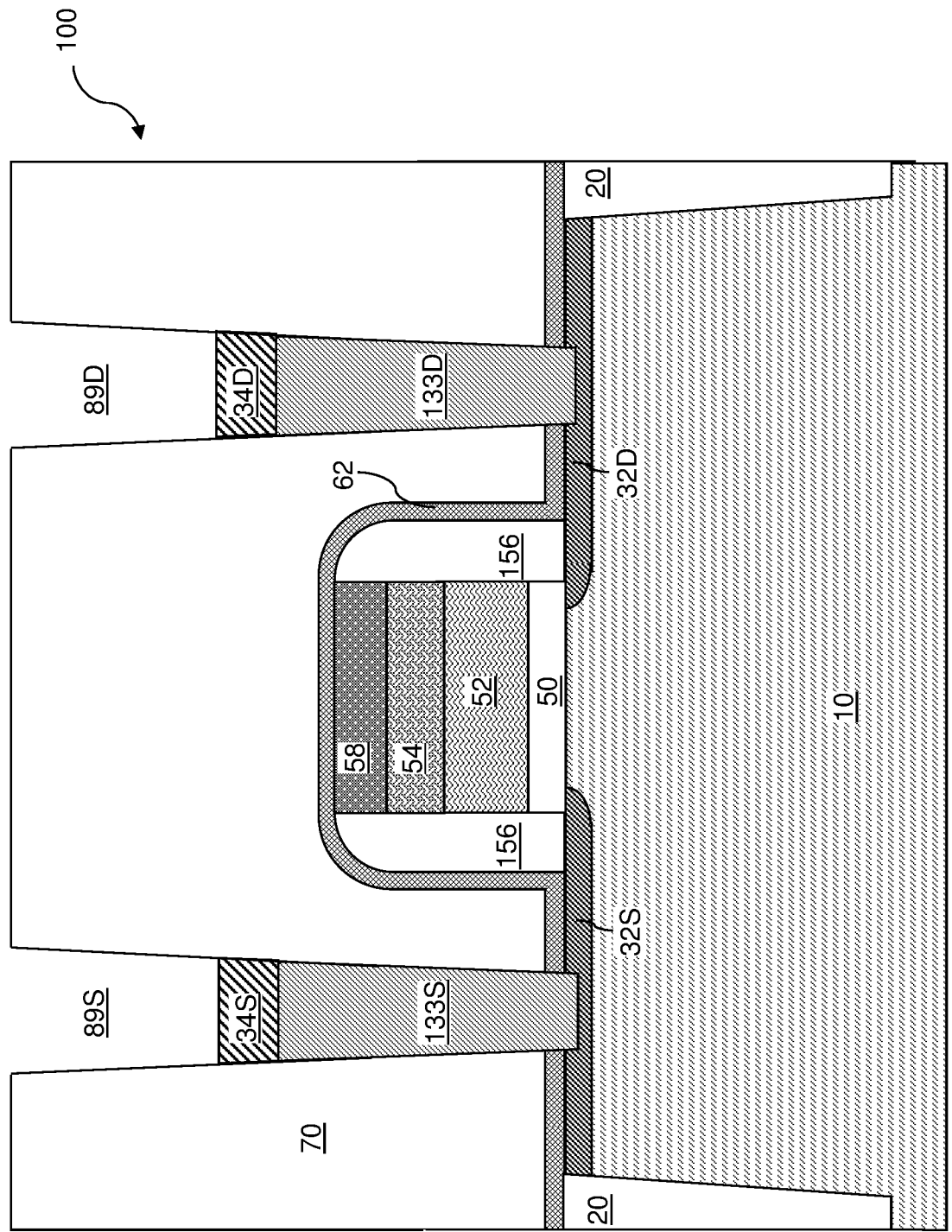

Referring to FIG. 32E, the heavily doped polycrystalline semiconductor material layer 34 is etched back using selective etching to remove layer 34 from above the planarization dielectric layer 70 and to partially remove layer 34 from the source and drain via cavities (89S, 89D). The remaining portions of layer 34 in the source and drain via cavities (89S, 89D) constitute the respective source and drain regions (34S, 34D), respectively, similar to the structure shown in FIG. 27A and described above.

Figure 32F:
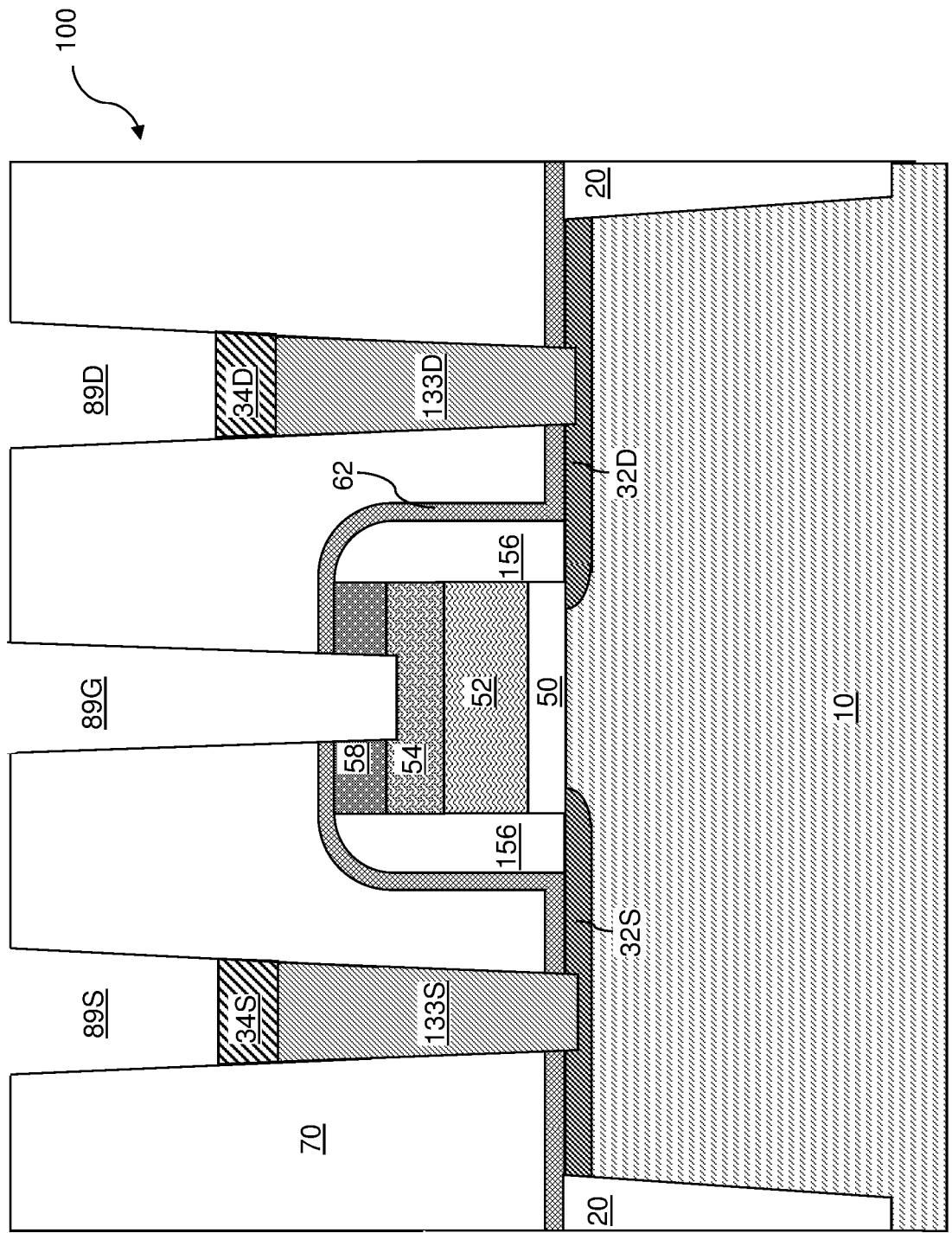

Referring to FIG. 32F, the gate contact via cavity 89G is formed by photolithography and etching through the planarization dielectric layer 70 to expose the gate electrode (52, 54).

Figure 32G:
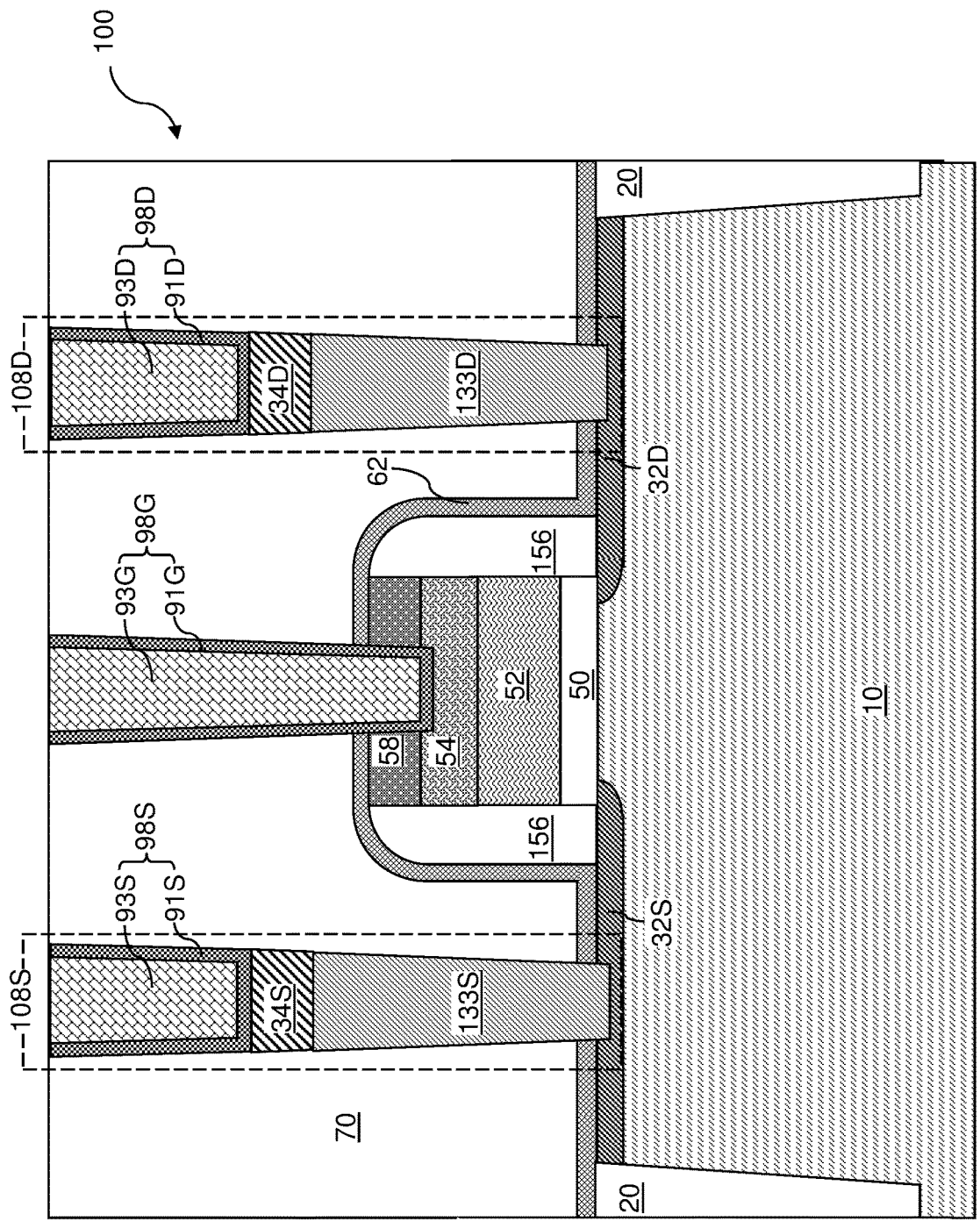

Referring to FIG. 32G, the steps shown in FIG. 28A and described above are performed to form the contact via structures (98S, 98D, 98G) in the respective contact via cavities (89S, 89D, 89G).

Referring to FIGS. 21-32G and additional drawings related to the fourth exemplary structure and according to various embodiments of the present disclosure, a semiconductor structure is provided, which comprises: a gate stack structure (50, 52, 54, 58) overlying a semiconductor material layer (e.g., a well in or an epitaxial layer in the semiconductor substrate 10) having a doping of a first conductivity type and comprising a gate dielectric 50 and a gate electrode (52, 54); a source extension region 32S and a drain extension region 32D embedded in an upper portion of the semiconductor material layer and located on opposite sides of the gate stack structure (50, 52, 54, 58); a planarization dielectric layer 70 overlying the gate stack structure (50, 52, 54, 58), the source extension region 32S, and the drain extension region 32D; a first conductive via structure 108S vertically extending through the planarization dielectric layer 70 in contact with the source extension region, having a narrower width than the source extension region, and comprising a source extension pillar structure 133S and a source region 34S; and a second conductive via structure 108D vertically extending through the planarization dielectric layer 70 in contact with the drain extension region, having a narrower width than the drain extension region, and comprising a drain extension pillar structure 133D and a drain region 34D, wherein: the source extension region 32S, the drain extension region 32D, the source extension pillar structure 133S, the drain extension pillar structure 133D, the source region 34S, and the drain region 34D have a doping of a second conductivity type that is opposite of the first conductivity type; and the source region 34S and the drain region 34D include dopants of the second conductivity type at a higher atomic concentration than the source extension pillar structure 133S and the drain extension pillar structure 133D.

In one embodiment, the source extension pillar structure 133S contacts a surface of the source extension region 32S; and the drain extension pillar structure 133D contacts a surface of the drain extension region 32D. In one embodiment, the source extension region 32S and the drain extension region 32D are single crystalline and epitaxially aligned to the semiconductor material layer; the source extension pillar structure 133S comprises a first single crystalline semiconductor material portion that is epitaxially aligned to the source extension region 32S; and the drain extension pillar structure 133D comprises a second single crystalline semiconductor material portion that is epitaxially aligned to the drain extension region 32D. In one embodiment, the source region 34S is single crystalline and is epitaxially aligned to the source extension pillar structure 133S; and the drain region 34D is single crystalline and is epitaxially aligned to the drain extension pillar structure 133D.

In one embodiment, the first conductive via structure 108S comprises a source-side metallic via structure 98S contacting a top surface of the source region 34S and having a top surface within a horizontal plane including a top surface of the planarization dielectric layer 70; and the second conductive via structure 108D comprises a drain-side metallic via structure 98D contacting a top surface of the drain region 34D and having a top surface within the horizontal plane including the top surface of the planarization dielectric layer 70.

In one embodiment, a top periphery of the source region 34S coincides with a bottom periphery of the source-side metallic via structure 98S; a top periphery of the drain region 34D coincides with a bottom periphery of the drain-side metallic via structure 98D; a bottom periphery of the source region 34S coincides with a top periphery of the source extension via structure 133S; and a bottom periphery of the drain region 34D coincides with a top periphery of the drain extension via structure 133D.

In one embodiment, the semiconductor structure comprises a gate contact via structure 98G vertically extending through the planarization dielectric layer 70 from the gate electrode 52, 54) to a top surface of the planarization dielectric layer 70 and consisting of a same set of at least one metallic material as each of the source-side metallic via structure 98S contacting and the drain-side metallic via structure 98D.

In one embodiment, a straight sidewall of the first conductive via structure 108S extends from a top surface of the planarization dielectric layer 70 to the source extension region 32S; and a straight sidewall of the second conductive via structure 108D extends from the top surface of the planarization dielectric layer 70 to the drain extension region 32D.

In one embodiment, the semiconductor structure comprises a dielectric gate spacer 56 laterally surrounding the gate stack structure (50, 52, 54, 58), wherein the first contact via structure 108S and the second contact via structure 108D are laterally spaced from the dielectric gate spacer 56. In one embodiment, the semiconductor structure comprises a dielectric liner 62 continuously extending over, and contacting, a top surface of the source extension region 32S, a top surface of the drain extension region 32D, an outer sidewall of the dielectric gate spacer 56, and a top surface of the gate stack structure (50, 52, 54, 58), wherein each of the first conductive via structure 108S and the second conductive via structure 108D extends through a respective horizontal portion of the dielectric liner 62.

In one embodiment, the source extension region 32S contacts a first peripheral portion of a bottom surface of the gate dielectric 50; and the drain extension region 32D contacts a second peripheral portion of the bottom surface of the gate dielectric 50.

In one embodiment, the semiconductor structure comprises a dielectric gate spacer 56 contacting the source extension region 32S and the drain extension region 32D at horizontal interfaces located within a horizontal plane including a bottom surface of the gate dielectric 50.

In one embodiment, the source extension pillar structure 133S and the drain extension pillar structure 133D include dopants of the second conductivity type at a higher atomic concentration than the source extension region 32S and the drain extension region 32D.

The field effect transistor of one or more embodiments of the present disclosure can be used in any semiconductor device. In one embodiment, the high voltage field effect transistor in the first device region 100 can be used as a peripheral (e.g., driver) high voltage transistor of a memory device. The low voltage field effect transistor in the second device region 200 can be used as a peripheral (e.g., driver) low voltage transistor of the same memory device. Memory devices include NAND and resistive RAM (ReRAM) memory devices. For example, the field effect transistor can be used as a word line select transistor for a three dimensional NAND device having vertically oriented channels (i.e., extending perpendicular to the top surface of the substrate) and charge storage regions located adjacent to the channels (e.g., vertical NAND). Non-limiting examples of vertical NAND devices are described in U.S. published patent application numbers 2016/0351709 A1 (published Dec. 1, 2016), and 2016/0365351 A1 (published Dec. 15, 2016), and in U.S. Pat. No. 9,449,987 B1 issued Sep. 20, 2016, and U.S. Pat. No. 9,305,934 B1 issued Apr. 5, 2016, each of which is incorporated herein by reference in its entirety.

A field effect transistor of the embodiments of the present disclosure can have a greater breakdown voltage due to the vertical current path along the inner sidewalls of the dielectric gate spacer 56 and/or along the outer sidewalls of the dielectric gate spacer 56 than a conventional field effect transistor having similar dimensions as the field effect transistor of the present disclosure but not including vertical current paths. Additionally, the high voltage field effect transistor of one or more of the embodiments of the present disclosure can be scaled down with a smaller width than prior art high voltage field effect transistors, while providing the same or higher breakdown voltage due to the presence of the vertical current paths. In the first two exemplary structures, a taller sidewall spacer than gate electrode eight creates space between the channel under the gate electrode and the source and drain contacts, which increases the channel length but does not waste the chip area.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
a shallow trench isolation structure comprising a dielectric material embedded within a semiconductor material layer and laterally surrounding an upper portion of the semiconductor material layer, wherein the upper portion of the semiconductor material layer comprises a base semiconductor portion comprising a pair of top horizontal surfaces and a pedestal semiconductor portion located between the pair of top horizontal surfaces and vertically protruding above a horizontal plane including the pair of top horizontal surfaces;
a gate stack structure comprising a gate dielectric and a gate electrode and including a pair of sidewalls that are vertically coincident with a pair of sidewalls of the pedestal semiconductor portion;

a dielectric gate spacer contacting the pair of sidewalls of the gate stack structure and the pair of sidewalls of the pedestal semiconductor portion;

a source region and a drain region located within the base semiconductor portion and having a respective top surface located within the horizontal plane including the pair of top horizontal surfaces of the base semiconductor portion; and a doped extension region in contact with a respective sidewall of the pair of sidewalls of the pedestal semiconductor portion, adjoined to a respective one of the source region and the drain region, having a same type of doping as the source region and the drain region, and including dopants at a lower atomic concentration than the source region and the drain region, wherein:

a top surface of the source region contacts a bottom portion of a first segment of the dielectric gate spacer within the horizontal plane including the pair of top horizontal surfaces of the base semiconductor portion;

a top surface of the drain region contacts a bottom surface of a second segment of the dielectric gate spacer within the horizontal plane including the pair of top horizontal surfaces of the base semiconductor portion;

a first portion of the base semiconductor portion and a first portion of the pedestal semiconductor portion has a doping of a first conductivity type;

the source region, the drain region, and the doped extension region have a doping of a second conductivity type that is opposite to the first conductivity type; and a p-n junction between a combination of the first portion of the base semiconductor portion and the first portion of the pedestal semiconductor portion, and a combination of the doped extension region and the respective one of the source region and the drain region comprises a horizontally-extending surface of the first portion of the base semiconductor portion that contacts the respective one of the source region and the drain region and further comprises a vertically-extending surface of the first portion of the pedestal semiconductor portion that contacts the doped extension region.

2. The semiconductor structure of claim 1, wherein the p-n junction further comprises a first contoured surface of the first portion of the base semiconductor portion that contacts a contoured surface of the respective one of the source region and the drain region and located entirely below the horizontal plane including the pair of top horizontal surfaces.

3. The semiconductor structure of claim 2, wherein the p-n junction further comprises a second contoured surface of the first portion of the pedestal semiconductor portion that contacts a contoured surface of the doped extension region, located entirely below the horizontal plane including the pair of top horizontal surfaces, and adjoined to the first contoured surface of the p-n junction.

4. The semiconductor structure of claim 3, wherein an interface between the respective one of the source region and the drain region and the doped extension region is located entirely below the horizontal plane including the pair of top horizontal surfaces.

5. The semiconductor structure of claim 3, wherein an interface between the respective one of the source region and the drain region and the doped extension region is located underneath the dielectric gate spacer, and is located entirely within an area of the dielectric gate spacer in a plan view along a vertical direction.

6. The semiconductor structure of claim 1, wherein a vertical distance between a horizontal interface between the gate dielectric and the pedestal semiconductor portion and the horizontal plane including the pair of top horizontal surfaces of the base semiconductor portion is in a range from 100 nm to 2 microns.

7. The semiconductor structure of claim 1, further comprising a shallow trench isolation spacer that comprises a same insulating material as the dielectric gate spacer, adjoined to the dielectric gate spacer, and contacts sidewalls of the shallow trench isolation structure that are located above the horizontal plane including the pair of top horizontal surfaces of the base semiconductor portion.

8. The semiconductor structure of claim 1, wherein a top periphery of the pedestal semiconductor portion comprises:

a pair of first edges that coincide with a pair of edges of the gate dielectric; and a pair of second edges that are adjoined to the shallow trench isolation structure.

9. A semiconductor structure comprising:

a shallow trench isolation structure comprising a dielectric material embedded within a semiconductor material layer and laterally surrounding an upper portion of the semiconductor material layer, wherein the upper portion of the semiconductor material layer comprises a base semiconductor portion comprising a pair of top horizontal surfaces and a pedestal semiconductor portion located between the pair of top horizontal surfaces and vertically protruding above a horizontal plane including the pair of top horizontal surfaces;

a gate stack structure comprising a gate dielectric and a gate electrode and including a pair of sidewalls that are vertically coincident with a pair of sidewalls of the pedestal semiconductor portion;

a dielectric gate spacer contacting the pair of sidewalls of the gate stack structure and the pair of sidewalls of the pedestal semiconductor portion;

a source region and a drain region located within the base semiconductor portion and having a respective top surface located within the horizontal plane including the pair of top horizontal surfaces of the base semiconductor portion;

a dielectric liner continuously extending over and contacting a top surface of the source region, a top surface of the drain region, an outer sidewall of the dielectric gate spacer, and a top surface of the gate stack structure;

a planarization dielectric layer overlying the dielectric liner and having a planar top surface;

contact via structures vertically extending through the planarization dielectric layer and the dielectric liner and contacting a respective one of the source region, the drain region, and the gate electrode; and a doped extension region in contact with a respective sidewall of the pair of sidewalls of the pedestal semiconductor portion, adjoined to a respective one of the source region and the drain region, having a same type of doping as the source region and the drain region, and including dopants at a lower atomic concentration than the source region and the drain region, wherein:

a first portion of the base semiconductor portion and a first portion of the pedestal semiconductor portion has a doping of a first conductivity type;

the source region, the drain region, and the doped extension region have a doping of a second conductivity type that is opposite to the first conductivity type; and a p-n junction between a combination of the first portion of the base semiconductor portion and the first portion of the pedestal semiconductor portion, and a combination of the doped extension region and the respective one of the source region and the drain region comprises a horizontally-extending surface of the first portion of the base semiconductor portion that contacts the respective one of the source region and the drain region and further comprises a vertically-extending surface of the first portion of the pedestal semiconductor portion that contacts the doped extension region.

10. The semiconductor structure of claim 9, wherein the p-n junction further comprises a first contoured surface of the first portion of the base semiconductor portion that contacts a contoured surface of the respective one of the source region and the drain region and located entirely below the horizontal plane including the pair of top horizontal surfaces.

11. The semiconductor structure of claim 10, wherein the p-n junction further comprises a second contoured surface of the first portion of the pedestal semiconductor portion that contacts a contoured surface of the doped extension region, located entirely below the horizontal plane including the pair of top horizontal surfaces, and adjoined to the first contoured surface of the p-n junction.

12. The semiconductor structure of claim 11, wherein an interface between the respective one of the source region and the drain region and the doped extension region is located entirely below the horizontal plane including the pair of top horizontal surfaces.

13. The semiconductor structure of claim 11, wherein an interface between the respective one of the source region and the drain region and the doped extension region is located underneath the dielectric gate spacer, and is located entirely within an area of the dielectric gate spacer in a plan view along a vertical direction.

14. A semiconductor structure comprising:
a shallow trench isolation structure comprising a dielectric material embedded within a semiconductor material layer and laterally surrounding an upper portion of the semiconductor material layer, wherein the upper portion of the semiconductor material layer comprises a base semiconductor portion comprising a pair of top horizontal surfaces and a pedestal semiconductor portion located between the pair of top horizontal surfaces and vertically protruding above a horizontal plane including the pair of top horizontal surfaces;
a gate stack structure comprising a gate dielectric and a gate electrode and including a pair of sidewalls that are vertically coincident with a pair of sidewalls of the pedestal semiconductor portion;
a dielectric gate spacer contacting the pair of sidewalls of the gate stack structure and the pair of sidewalls of the pedestal semiconductor portion; and
a source region and a drain region located within the base semiconductor portion and having a respective top surface located within the horizontal plane including the pair of top horizontal surfaces of the base semiconductor portion;

wherein:
the base semiconductor portion comprises a first single crystalline semiconductor material portion having a doping of the first conductivity type;
the source region and the drain region have a doping of a second conductivity type that is an opposite of the first conductivity type;
the pedestal semiconductor portion comprises of a second single crystalline semiconductor material potion having a doping of the first conductivity type and a doped extension region having a doping of the second conductivity type and adjoined to a respective one of the source region and the drain region and including dopants at a lower atomic concentration than the source region and the drain region; and
a p-n junction between a combination of the first portion of the first single crystalline semiconductor material portion and the second single crystalline semiconductor material potion, and a combination of the doped extension region and the respective one of the source region and the drain region comprises a horizontally-extending surface of the first single crystalline semiconductor material portion that contacts the respective one of the source region and the drain region and further comprises a vertically-extending surface of the second single crystalline semiconductor material potion that contacts the doped extension region.

15. The semiconductor structure of claim 14, wherein the doped extension region has a uniform lateral width and contacts a surface segment of the dielectric gate spacer.

16. The semiconductor structure of claim 14, wherein an interface between the at doped extension region and the second single crystalline semiconductor material potion comprises a p-n junction that is parallel to one of the pair of sidewalls of the pedestal semiconductor portion and is adjoined to a bottom surface of the gate dielectric.

17. The semiconductor structure of claim 14, wherein the p-n junction further comprises a first contoured surface of the first portion of the base semiconductor portion that contacts a contoured surface of the respective one of the source region and the drain region and located entirely below the horizontal plane including the pair of top horizontal surfaces.

18. The semiconductor structure of claim 17, wherein the p-n junction further comprises a second contoured surface of the first portion of the pedestal semiconductor portion that contacts a contoured surface of the doped extension region, located entirely below the horizontal plane including the pair of top horizontal surfaces, and adjoined to the first contoured surface of the p-n junction.

19. The semiconductor structure of claim 18, wherein an interface between the respective one of the source region and the drain region and the doped extension region is located entirely below the horizontal plane including the pair of top horizontal surfaces.

20. The semiconductor structure of claim 18, wherein an interface between the respective one of the source region and the drain region and the doped extension region is located underneath the dielectric gate spacer, and is located entirely within an area of the dielectric gate spacer in a plan view along a vertical direction.

* * * * *